United States Patent
Lu et al.

(10) Patent No.: US 12,418,358 B2
(45) Date of Patent: *Sep. 16, 2025

(54) METHOD, APPARATUS, AND SYSTEM FOR IMPROVING RELIABILITY OF DATA TRANSMISSION INVOLVING AN ETHERNET DEVICE

(71) Applicant: HUAWEI TECHNOLOGIES CO., LTD., Shenzhen (CN)

(72) Inventors: Yuchun Lu, Beijing (CN); Yan Zhuang, Nanjing (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/427,263

(22) Filed: Jan. 30, 2024

(65) Prior Publication Data

US 2024/0259133 A1    Aug. 1, 2024

Related U.S. Application Data

(63) Continuation of application No. 17/466,903, filed on Sep. 3, 2021, now Pat. No. 11,936,475, which is a (Continued)

(30) Foreign Application Priority Data

Mar. 6, 2019  (CN) .......................... 201910169228.6

(51) Int. Cl.
*H04L 1/00* (2006.01)
*H03M 13/00* (2006.01)

(52) U.S. Cl.
CPC .......... *H04L 1/0042* (2013.01); *H04L 1/0003* (2013.01)

(58) Field of Classification Search
CPC ... H04L 1/0003; H04L 1/0042; H04L 1/0057; H04L 1/0041; H04L 1/1841;
(Continued)

(56) References Cited

U.S. PATENT DOCUMENTS 7,725,029 B1    5/2010   Bernier et al.
7,729,384 B1    6/2010   Mantri et al.
(Continued)

FOREIGN PATENT DOCUMENTS

CN    101902303 A    12/2010
CN    103354983 A    10/2013
(Continued)

OTHER PUBLICATIONS

Spreadtrum Communications, "Performance analysis of channel coding schemes for NR," 3GPP TSG RAN WG1 meeting #86bis, Lisbon, Portugal, R1-1608922, total 8 pages, 3rd Generation Partnership Project, Valbonne, France (Oct. 10-14, 2016).
(Continued)

*Primary Examiner* — Justin R Knapp
(74) *Attorney, Agent, or Firm* — Leydig, Voit & Mayer, Ltd.

(57) ABSTRACT

A data transmission method, apparatus, and system are applied to the field of communication technologies. The method includes: performing demultiplexing processing on obtained y first data streams to obtain x second data streams, where the y first data streams are obtained through bit multiplexing processing; mapping the x second data streams at a granularity of n bits to obtain z third data streams; and outputting the z third data streams over an output lane, where y, x, n, and z are all positive integers, and n≥2. The method may be applied to an Ethernet high-speed interface.

48 Claims, 38 Drawing Sheets

Related U.S. Application Data continuation of application No. PCT/CN2020/076806, filed on Feb. 26, 2020.

(58) Field of Classification Search
CPC ... H04L 1/0006; H04L 1/0033; H04L 1/0036; H04L 1/0045; H03M 13/27; H03M 13/2792

See application file for complete search history.

(56) References Cited

U.S. PATENT DOCUMENTS

| | | | |
|---|---|---|---|
| 9,281,970 B2* | 3/2016 | Ran | H03M 13/09 |
| 9,954,644 B2* | 4/2018 | Su | H04L 1/0045 |
| 11,418,313 B1 | 8/2022 | Sluyski et al. | |
| 11,431,432 B2 | 8/2022 | Soto et al. | |
| 2003/0217319 A1 | 11/2003 | Tripathi et al. | |
| 2016/0191277 A1 | 6/2016 | Li et al. | |
| 2020/0072889 A1 | 3/2020 | Pandey | |

FOREIGN PATENT DOCUMENTS

| | | | |
|---|---|---|---|
| CN | 104468441 A | 3/2015 | |
| EP | 2469887 A1 | 6/2012 | |
| WO | 03087984 A3 | 10/2003 | |
| WO | 2015089741 A1 | 6/2015 | |

OTHER PUBLICATIONS

"IEEE Standard for Ethernet," IEEE Std 802.3-2018, LAN/MAN Standards Committee of the, IEEE Computer Society, total 5600 pages (Approved Jun. 14, 2018).

"IEEE Standard for Ethernet, Amendment 3: Media Access Control Parameters for 50 GB/s and Physical Layers and Management Parameters for 50 GB/s, 100 GB/s, and 200 GB/s Operation," IEEE Std 802.3cd-2018, IEEE Computer Society, total 401 pages (2018).

"IEEE Standard for Ethernet, Amendment 10: Media Access Control Parameters, Physical Layers, and Management Parameters for 200 GB/s and 400 GB/s Operation," IEEE Std 802.3bs-2017, IEEE Computer Society, total 372 pages (2017).

"Part 3:Carrier Sense Multiple Access with Collision Detection (CSMA/CD) Access Method and Physical Layer Specifications—Amendment 4: Media Access Control Parameters, Physical Layers and Management Parameters for 40 GB/s and 100 GB/s Operation," IEEE Std 802.3ba-2010, IEEE Computer Society, total 457 pages (Jun. 22, 2010).

"Draft Standard for Ethernet Amendment: Media Access Control Parameters, Physical Layers and Management Parameters for 400 GB/s Operation," IEEE P802.3bs™/D1.2, Total 277 pages, XP068103421, Institute of Electrical and Electronics Engineers, New York, New York (Feb. 4, 2016).

"IEEE Standard for Ethernet—Section Six," IEEE Std 802.3-2015, pp. 1-699, XP068106446, Institute of Electrical and Electronics Engineers, New York, New York (Mar. 2016).

Anslow et al., "RS(544,514) FEC performance with 4:1 interleaving (updated 2)," IEEE P802.3ck Task Force, pp. 1-42, XP068149216, Institute of Electrical and Electronics Engineers, New York, New York (Aug. 2018).

U.S. Appl. No. 17/466,903, filed Sep. 3, 2021.

* cited by examiner

METHOD, APPARATUS, AND SYSTEM FOR IMPROVING RELIABILITY OF DATA TRANSMISSION INVOLVING AN ETHERNET DEVICE

CROSS-REFERENCE TO RELATED APPLICATIONS

This application is a continuation of U.S. patent application Ser. No. 17/466,903, filed on Sep. 3, 2021, which is a continuation of International Application No. PCT/CN2020/076806, filed on Feb. 26, 2020, which claims priority to Chinese Patent Application No. 201910169228.6, filed on Mar. 6, 2019. All of the aforementioned patent applications are hereby incorporated by reference in their entireties.

TECHNICAL FIELD

This application pertains to the field of communication technologies, and in particular, to a data transmission method, apparatus, and system.

BACKGROUND

An architecture of an existing Ethernet high-speed interface includes a forward error correction (FEC) layer and a physical medium attachment (PMA) layer. The FEC layer is configured to perform forward error correction encoding on received data, and transmit the data to the PMA layer. The PMA layer is configured to perform transmission rate conversion on the received data.

When performing forward error correction, the FEC layer may perform a plurality of types of forward error correction processing, for example, RS(544, 514) forward error correction (FEC) processing. RS(544, 514) refers to encoding processing performed by using 10 bits as an encoding unit. In RS(544, 514), every 10 bits of data is referred to as an FEC symbol.

The PMA layer uses a bit multiplexing (Bit Mux, also referred to as bit interleaving) architecture, and bit MUX processing is performed in the bit MUX architecture. The processing includes: mapping, by bits, m data streams received by the PMA layer to obtain z data streams, mapping, by bits, the obtained z data streams to obtain n different data streams, and outputting the n different data streams over different PMA lanes that one-to-one correspond to the n different data streams.

However, currently, in a data transmission process between a transmit end device and a receive end device, if data carries burst error data (burst error, also referred to as burst error code), the burst error data is greatly spread due to execution of bit MUX processing. As a result, data transmission reliability is relatively low.

SUMMARY

This application provides a data transmission method, apparatus, and system, to resolve a problem of relatively low data transmission reliability.

According to a first aspect, a data transmission method is provided. The method is applied to a transmit end device and includes:

The transmit end device performs demultiplexing processing on obtained y first data streams to obtain x second data streams, where the y first data streams are obtained through bit multiplexing processing.

The transmit end device maps the x second data streams at a granularity of n bits to obtain z third data streams. In this application, mapping at the granularity of n bits means that data is mapped in a form of n consecutive bits.

The transmit end device outputs the z third data streams over an output lane, where y, x, n, and z are all positive integers, and n≥2.

In this way, the transmit end device may use n bits as a unit symbol for transmission. Compared with a conventional implementation in which data transmission is performed by using one bit as a unit symbol, if transmitted data carries burst error data, there are fewer error symbols, and a quantity of error symbols in a transmission process is reduced. This reduces spread of the burst error data, and improves reliability of data transmission.

Further, the transmit end device maps the x second data streams at the granularity of n (n≥2) bits to obtain the z third data streams, and then outputs the z third data streams, and the mapping granularity of the x second data streams is greater than a mapping granularity in a bit MUX architecture. Therefore, when the third data streams carry burst error data in a transmission process, if a receive end device performs FEC symbol error correction, the burst error data is converted into a relatively small quantity of FEC symbol errors, thereby reducing a quantity of FEC symbol errors in which an error occurs. This increases a success rate of FEC codeword error correction processing, improves error correction performance, and ensures a correctness percentage of subsequent data transmission.

Optionally, data in each second data stream carries an alignment marker, and a process in which the transmit end device maps the x second data streams at a granularity of n bits to obtain z third data streams may include:

The transmit end device removes alignment markers from the x second data streams.

The transmit end device maps, at the granularity of n bits, the x second data streams from which the alignment markers are removed, to obtain z third data streams.

The transmit end device adds an alignment marker to each of the z third data streams based on a mapping relationship between the x second data streams and the z third data streams.

Optionally, because a data format received by the receive end device and a quantity of input lanes may be different from a data format output by the transmit end device and a quantity of output lanes, to match the data format and the input lanes of the receive end device, the transmit end device may further process the z third data streams, and the outputting the z third data streams over an output lane includes:

The transmit end device maps the z third data streams at the granularity of n bits to obtain x fifth data streams, maps the x fifth data streams at a granularity of q bits to obtain s fourth data streams, and outputs the s fourth data streams over the output lane.

Alternatively, the transmit end device maps the z third data streams at the granularity of n bits to obtain s fourth data streams, and outputs the s fourth data streams over the output lane, where s is a positive integer, and q≥2.

Alternatively, the outputting the z third data streams over an output lane includes:

The transmit end device maps the z third data streams at the granularity of n bits to obtain x fifth data streams.

The transmit end device performs multiplexing processing on the x fifth data streams at a granularity of bits to obtain s fourth data streams.

The transmit end device outputs the s fourth data streams over the output lane, where s is a positive integer.

In this way, the transmit end device may further match the data format and the quantity of lanes that are supported by the receive end device, to implement compatibility with the receive end device.

Because the transmit end device may be located in different application scenarios, a to-be-transmitted data stream of the transmit end device may pass through a complex transmission environment, resulting in burst error data in the to-be-transmitted data stream. Therefore, the transmit end device may perform error correction processing on the to-be-transmitted data stream in a transmission process of the to-be-transmitted data stream, to reduce the burst error data. For example, the error correction processing may be FEC codeword error correction processing, which is also referred to as RS error correction (Reed-Solomon error correction) or FEC recovery.

When the x second data streams include data of at least one forward error correction FEC codeword, before the mapping the x second data streams at a granularity of n bits to obtain z third data streams, the method further includes:

The transmit end device performs FEC codeword error correction processing on the x second data streams to obtain x error-corrected second data streams.

When the x second data streams include data of a plurality of FEC codewords, before the performing FEC codeword error correction processing on the x second data streams to obtain x error-corrected second data streams, the method further includes:

The transmit end device performs demapping processing on the x second data streams at a granularity of FEC symbols to obtain data expressed in FEC codewords.

The performing FEC codeword error correction processing on the x second data streams to obtain x error-corrected second data streams includes: The transmit end device performs FEC codeword error correction processing on the data expressed in FEC codewords, to obtain error-corrected data, and performs mapping processing on the error-corrected data at the granularity of FEC symbols to obtain the x error-corrected second data streams.

In this way, the transmit end device performs FEC codeword error correction processing on the x second data streams, thereby ensuring data accuracy in subsequent processing.

Optionally, there may be a plurality of implementations for a mapping process in which the transmit end device maps the x second data streams at a granularity of n bits to obtain z third data streams. In this application, the following several implementations are used as examples for description.

In a first implementation, $z=1$, and the mapping the x second data streams at a granularity of n bits to obtain z third data streams includes:

The transmit end device performs round robin on all of the x second data streams.

The transmit end device sequentially maps data of n consecutive bits obtained from each of the second data streams through round robin, to obtain one third data stream.

In a second implementation, $z \geq 2$, $x \geq 2$, and the mapping the x second data streams at a granularity of n bits to obtain z third data streams includes:

The transmit end device sequentially performs round robin on all of the x second data streams, and maps data obtained through round robin to a third data stream until all data of the x second data streams is mapped to obtain the z third data streams, where data of n consecutive bits in each of the second data streams is obtained through each time of round robin.

For each second data stream, data obtained through any two adjacent times of round robin is mapped to different third data streams.

When round robin is performed on the x second data streams, a round robin order may meet any one of the following:

Round robin is first performed on a second data stream with an even sequence number, and then performed on a second data stream with an odd sequence number.

Round robin is first performed on a second data stream with an odd sequence number, and then performed on a second data stream with an even sequence number.

Alternatively, round robin is performed on the second data streams in ascending or descending order of sequence numbers.

For example, when $z=2$ and $x=8$, the mapping the x second data streams at a granularity of n bits to obtain z third data streams includes:

The transmit end device sequentially performs round robin on all of the eight second data streams, and maps data obtained through round robin to a third data stream until all data of the eight second data streams is mapped to obtain the two third data streams, where data of n consecutive bits in each of the second data streams is obtained through each time of round robin.

For each second data stream, data obtained through any two adjacent times of round robin is mapped to different third data streams.

In an optional implementation, round robin may be performed on the eight second data streams in ascending order of sequence numbers of the second data streams. For example, when the eight second data streams sequentially have sequence numbers 0 to 7, and when round robin is performed on the x second data streams, sequence numbers of the second data streams on which round robin is performed are sequentially 0, 1, 2, 3, 4, 5, 6, and 7. In addition, to ensure that for each second data stream, data obtained through any two adjacent times of round robin is mapped to different third data streams, in two adjacent round robin cycles, an order of third data streams to which a same second data stream is mapped is reversed. One round robin cycle is a process of performing round robin once on the x second data streams. To be specific, x pieces of n-bit data can be obtained in one round robin cycle. For example, a second data stream is mapped to a third data stream in a round robin cycle, and is mapped to another third data stream in another adjacent round robin cycle.

In another optional implementation, when the eight second data streams sequentially have sequence numbers 0 to 7, and when round robin is performed on the x second data streams, sequence numbers of the second data streams on which round robin is performed are sequentially 0, 1, 3, 2, 4, 5, 7, and 6. Similarly, in two adjacent round robin cycles, an order of third data streams to which the second data streams are mapped is reversed.

For example, each of the x second data streams includes two FEC codewords, $z=2$, $X=8$, and the eight second data streams are equally grouped into two data stream groups.

The mapping the x second data streams at a granularity of n bits to z third data streams includes:

A first round robin process and a second round robin process are alternately performed until all of the eight second data streams are mapped to two third data streams.

Each round robin process in the first round robin process and the second round robin process includes:

Round robin is performed on each of the eight second data streams, and data of n consecutive bits obtained through round robin from each of the second data streams that belong to a same data stream group is mapped to a same third data stream.

In the first round robin process and the second round robin process, data belonging to a same data stream group is mapped to different third data streams.

When z=4 and x=16, the mapping the x second data streams at a granularity of n bits to obtain z third data streams includes:

The transmit end device sequentially performs round robin on all of the 16 second data streams, and maps data obtained through round robin to a third data stream until all data of the 16 second data streams is mapped to obtain the four third data streams, where data of n consecutive bits in each of the second data streams is obtained through each time of round robin.

For each second data stream, data obtained through any two adjacent times of round robin is mapped to different third data streams.

In an optional implementation, when round robin is performed on the 16 second data streams, round robin may be first performed on second data streams with two consecutive even sequence numbers, and then performed on second data streams with two consecutive odd sequence numbers. For example, when the 16 second data streams sequentially have sequence numbers 0 to 15, and when round robin is performed on the 16 second data streams, sequence numbers of the second data streams on which round robin is performed are sequentially 0, 2, 1, 3, 4, 6, 5, 7, 8, 10, 9, 11, 12, 14, 13, and 15. In addition, to ensure that for each second data stream, data obtained through any two adjacent times of round robin is mapped to different third data streams, in two adjacent round robin cycles, an order of third data streams to which the second data streams are mapped is an ascending order of sequence numbers of the third data streams or a reverse order of sequence numbers 2, 3, 0, and 1 of the third data streams. One round robin cycle is a process of performing round robin once on the x second data streams. To be specific, x pieces of n-bit data can be obtained in one round robin cycle. For example, a second data stream is mapped to a third data stream in a round robin cycle, and is mapped to another third data stream in another adjacent round robin cycle.

In another optional implementation, when the 16 second data streams sequentially have sequence numbers 0 to 15, and when round robin is performed on the 16 second data streams, sequence numbers of the second data streams on which round robin is performed are sequentially 0, 1, 2, 3, 5, 4, 7, 6, 8, 9, 10, 11, 13, 12, 15, and 14. Similarly, in two adjacent round robin cycles, an order of third data streams to which the second data streams are mapped is an ascending order of sequence numbers of the third data streams or a reverse order of sequence numbers 1, 0, 3, and 2 of the third data streams.

For example, each of the x second data streams includes two FEC codewords, z=4, x=16, the 16 second data streams are equally grouped into four first data stream groups, the 16 second data streams are equally divided into four second data stream groups, and each of the second data stream groups includes second data streams of two first data stream groups.

The mapping the x second data streams at a granularity of n bits to z third data streams includes:

For each second data stream group, a first round robin process and a second round robin process are alternately performed until all second data streams in the second data stream group are mapped to one third data stream. Each round robin process in the first round robin process and the second round robin process includes:

Round robin is performed on each of the second data streams in the second data stream group, and data of n consecutive bits obtained through round robin from each second data stream that belongs to a same first data stream group is mapped to a same third data stream.

In the first round robin process and the second round robin process, data belonging to a same first data stream group is mapped to different third data streams.

Optionally, n is a quantity of bits included in one FEC symbol.

Optionally, in actual application, an output lane of the transmit end device may be damaged, and once the damaged output lane is used to send data, transmitted data may be lost. Therefore, to ensure effective data transmission, the transmit end device may determine a quantity of output data streams, so that the quantity of output data streams is less than or equal to a quantity of available output lanes, or the quantity of output data streams is equal to a preset quantity of output lanes. In this way, coding difficulty in actual implementation of a data transmission method can be reduced, a data processing process can be simplified, and processing overheads can be reduced.

Further, in a data transmission process, the transmit end device may choose, based on an actual requirement, whether to perform re-encoding processing on the data of the x second data streams, to meet more requirements. Therefore, before the mapping the x second data streams at a granularity of n bits to obtain z third data streams, the method further includes:

The transmit end device performs inner FEC encoding on the x second data streams to obtain x encoded second data streams.

Alternatively, when each of the second data streams carries a check bit, the transmit end device removes the check bit of each piece of data in the x second data streams, and performs second FEC encoding on the x second data streams from which the check bits are removed, to obtain x encoded second data streams. A coding scheme of the second FEC encoding is different from a coding scheme of first FEC encoding used before the check bits are removed.

An FEC scheme of the inner FEC encoding and an FEC scheme of the second FEC encoding may be one of the following FEC schemes: a Reed-Solomon (RS) code, a Bose-Chaudhuri-Hocquenghem (BCH) code, a Hamming code, a low-density parity-check (LDPC) code, a polar code, or a convolutional code.

In this way, different types of FEC encoding are performed on the x second data streams, so that a data transmission method can be adapted to more application scenarios, thereby improving universality of the data transmission method. In addition, data protection types are further increased, and data security is further ensured.

It should be noted that, in the foregoing processing process, a data stream may have a data arrangement problem, for example, a case in which data storage misalignment, data stream disorder, and data stream skew exist. Therefore, the transmit end device may perform at least one of alignment processing, deskew processing, and lane reordering processing on the data stream, to ensure data validity in a subsequent processing process.

For example, after obtaining the x second data streams, the transmit end device may perform at least one of alignment processing, deskew processing, and lane reordering processing on the x second data streams.

According to a second aspect, this application provides a data transmission method. The method is applied to a receive end device and includes:

The receive end device obtains z third data streams over an input lane.

The receive end device maps the z third data streams at a granularity of n bits to obtain x second data streams, where the z third data streams are obtained through mapping at the granularity of n bits.

The receive end device performs multiplexing processing on the x second data streams at a granularity of bits to obtain y first data streams, where z, n, x, and y are all positive integers, and n≥2.

Optionally, data in each of the third data streams carries an alignment marker, and the process of mapping the z third data streams at a granularity of n bits to obtain x second data streams may include:

The receive end device removes alignment markers from the z third data streams.

The receive end device maps, at the granularity of n bits, the z third data streams from which the alignment markers are removed, to obtain x second data streams.

The receive end device adds an alignment marker to each of the x second data streams based on a mapping relationship between the z third data streams and the x second data streams.

Optionally, in the foregoing first aspect, because the transmit end device further processes the z third data streams, correspondingly, the obtaining z third data streams over an input lane includes:

The receive end device receives s fourth data streams over the input lane, maps the s fourth data streams at a granularity of q bits to obtain x fifth data streams, and maps the x fifth data streams at the granularity of n bits to obtain the z third data streams.

Alternatively, the receive end device receives s fourth data streams over the input lane, and maps the s fourth data streams at the granularity of n bits to obtain the z third data streams, where s is a positive integer, and q≥2.

Alternatively, the obtaining z third data streams over an input lane includes:

The receive end device receives s fourth data streams over the input lane.

The receive end device performs demultiplexing processing on the s fourth data streams at the granularity of bits to obtain x fifth data streams.

The receive end device maps the x fifth data streams at the granularity of n bits to obtain the z third data streams, where s is a positive integer.

A data stream received by the receive end device may pass through a complex transmission environment, resulting in burst error data in the data stream. Therefore, the receive end device may perform error correction processing on the received data stream, to reduce the burst error data. For example, the error correction processing may be FEC codeword error correction processing, which is also referred to as RS error correction or FEC recovery.

When the x second data streams include data of at least one forward error correction FEC codeword, before the performing multiplexing processing on the x second data streams at a granularity of bits to obtain y first data streams, the method further includes:

The receive end device performs FEC codeword error correction processing on the x second data streams to obtain x error-corrected second data streams.

When the z third data streams include data of a plurality of FEC codewords, before the performing FEC codeword error correction processing on the x second data streams to obtain x error-corrected second data streams, the method further includes:

The receive end device performs demapping processing on the x second data streams at a granularity of FEC symbols to obtain data expressed in FEC codewords.

That the receive end device performs FEC codeword error correction processing on the x second data streams to obtain x error-corrected second data streams includes:

The receive end device performs FEC codeword error correction processing on the data expressed in FEC codewords, to obtain error-corrected data, and performs mapping processing on the error-corrected data at the granularity of FEC symbols to obtain the x error-corrected second data streams.

In this way, the receive end device performs FEC codeword error correction processing on the x second data streams, thereby ensuring data accuracy in subsequent processing.

Optionally, there is a plurality of implementations in which the receive end device maps the z third data streams at a granularity of n bits to obtain x second data streams. In this application, the following several implementations are used as examples for description.

In a first implementation, z=1.

The mapping the z third data streams at a granularity of n bits to obtain x second data streams includes:

The receive end device sequentially maps data of n consecutive bits in one third data stream to obtain the x second data streams.

In a second implementation, z≥2, and x≥2.

The mapping the z third data streams at a granularity of n bits to obtain x second data streams includes:

The receive end device sequentially performs round robin on all of the z third data streams, and maps data obtained through round robin to a second data stream until all data of the z third data streams is mapped to obtain the x second data streams, where data of n consecutive bits in each of the third data streams is obtained through each time of round robin.

For each second data stream, data obtained through any two adjacent times of mapping is from different third data streams.

For each third data stream, when data obtained through any x adjacent times of round robin is mapped to x different second data streams, a mapping order meets any one of the following:

Mapping to a second data stream with an even sequence number is first performed, and then mapping to a second data stream with an odd sequence number is performed.

Mapping to a second data stream with an odd sequence number is first performed, and then mapping to a second data stream with an even sequence number is performed.

Alternatively, mapping is performed in ascending order of sequence numbers of the second data streams.

In the second implementation, the transmit end device has a plurality of round robin orders and a plurality of mapping orders. Therefore, correspondingly, the receive end device may have a plurality of mapping processes. This application is described by using the following plurality of mapping processes as examples.

For example, when z=2 and x=8, the mapping the z third data streams at a granularity of n bits to obtain x second data streams includes:

The receive end device sequentially performs round robin on both of the two third data streams, and maps data obtained through round robin to a second data stream until all data of the two third data streams is mapped to obtain the eight second data streams, where data of n consecutive bits in each of the third data streams is obtained through each time of round robin.

For each second data stream, data obtained through any two adjacent times of mapping is from different third data streams. For this mapping process, refer to the process of mapping the x second data streams at a granularity of n bits to obtain z third data streams when z=2 and x=8 in the foregoing first aspect.

For example, each of the z third data streams includes two FEC codewords, z=2, and x=8.

The mapping the z third data streams at a granularity of n bits to x second data streams includes:

A first round robin process and a second round robin process are alternately performed until both of the two third data streams are mapped to the x second data streams. The first round robin process includes:

Round robin is performed on both of the two third data streams, and four pieces of data of n consecutive bits obtained through round robin from each of the third data streams are sequentially mapped to four second data streams respectively.

The second round robin process includes:

Round robin is performed on both of the two third data streams, and four pieces of data of n consecutive bits obtained through round robin from each of the third data streams are sequentially mapped to the other four second data streams respectively.

For example, when z=4 and x=16, the receive end device sequentially performs round robin on all of the four third data streams, and maps data obtained through round robin to a second data stream until all the four third data streams are mapped to obtain the 16 second data streams, where data of n consecutive bits in each of the third data streams is obtained through each time of round robin. For each second data stream, data obtained through any two adjacent times of mapping is from different third data streams. For this mapping process, refer to the process of mapping the x second data streams at a granularity of n bits to obtain z third data streams when z=4 and x=16 in the foregoing first aspect.

For example, each of the z third data streams includes two FEC codewords, z=4, and x=16.

The mapping the z third data streams at a granularity of n bits to x second data streams includes:

For every four third data streams, a first round robin process and a second round robin process are alternately performed until all of the four third data streams are mapped to 16 second data streams. The first round robin process includes:

Round robin is performed on all of the four third data streams, and eight pieces of data of n consecutive bits obtained through round robin from each of the third data streams are sequentially mapped to eight second data streams respectively.

The second round robin process includes:

Round robin is performed on all of the four third data streams, and eight pieces of data of n consecutive bits obtained through round robin from each third data stream are sequentially mapped to the other eight second data streams respectively.

Optionally, n is a quantity of bits included in one FEC symbol.

Because the transmit end device performs re-encoding processing on the data of the x second data streams, correspondingly, the receive end device performs decoding for the re-encoding on the x second data streams. Before the performing multiplexing processing on the x second data streams at a granularity of bits to obtain y first data streams, the method further includes:

The receive end device performs inner FEC decoding on the x second data streams to obtain x decoded second data streams, and removes check bits included in the x decoded second data streams, to obtain x second data streams from which the check bits are removed. The check bits are added when the transmit end device performs inner FEC encoding on the x second data streams.

Alternatively, the receive end device performs second FEC decoding on the x second data streams to obtain x decoded second data streams, and performs first FEC encoding on the x decoded second data streams to obtain x encoded second data streams. A coding scheme corresponding to the second FEC decoding is different from a coding scheme of the first FEC encoding.

An FEC scheme of the inner FEC encoding and an FEC scheme of the second FEC encoding may be one of the following FEC schemes: a Reed-Solomon (RS) code, a Bose-Chaudhuri-Hocquenghem (BCH) code, a Hamming code, a low-density parity-check (LDPC) code, a polar code, or a convolutional code.

It should be noted that, in the foregoing processing process, a data stream may have a data arrangement problem, for example, a case in which data storage misalignment, data stream disorder, and data stream skew exist. Therefore, the receive end device may perform at least one of alignment processing, deskew processing, and lane reordering processing on the data stream, to ensure data validity in a subsequent processing process.

For example, before the mapping the z third data streams at a granularity of n bits to obtain x second data streams, the method further includes: The receive end device performs at least one of alignment processing, deskew processing, and lane reordering processing on the z third data streams.

According to a third aspect, a data transmission method is provided. The method is applied to a transmit end device and includes:

The transmit end device maps z third data streams at a granularity of n bits to obtain x fifth data streams, where the z third data streams are obtained through mapping at the granularity of n bits.

The transmit end device maps the x fifth data streams at a granularity of q bits to obtain s fourth data streams.

The transmit end device separately outputs the s fourth data streams over an output lane, where z, n, x, q, and s are all positive integers, n≥2, and q≥2.

Optionally, n and/or q are/is a quantity/quantities of bits included in one FEC symbol.

Optionally, a quantity of output lanes is less than or equal to a quantity of available output lanes, or a quantity of output lanes is equal to a preset quantity of output lanes.

According to a fourth aspect, a data transmission method is provided. The method is applied to a transmit end device and includes:

The transmit end device maps z third data streams at a granularity of n bits to obtain x fifth data streams, where the z third data streams are obtained through mapping at the granularity of n bits.

The transmit end device performs multiplexing processing on the x fifth data streams at a granularity of bits to obtain s fourth data streams.

The transmit end device separately outputs the s fourth data streams over an output lane, where z, n, x, and s are all positive integers, and n≥2.

Optionally, n is a quantity of bits included in one FEC symbol.

Optionally, a quantity of output lanes is less than or equal to a quantity of available output lanes, or a quantity of output lanes is equal to a preset quantity of output lanes.

According to a fifth aspect, a data transmission method is provided. The method is applied to a receive end device and includes:

The receive end device receives s fourth data streams over an input lane.

The receive end device maps the s fourth data streams at a granularity of q bits to obtain x second data streams.

The receive end device maps the x second data streams at a granularity of n bits to obtain z third data streams, where s, q, x, n, and z are all positive integers, q≥2, and n≥2.

According to a sixth aspect, a data transmission apparatus is provided. The apparatus is used for a transmit end device and may include at least one module. The at least one module may be configured to implement any data transmission method in the foregoing first aspect.

According to a seventh aspect, a data transmission apparatus is provided. The apparatus is used for a receive end device and may include at least one module. The at least one module may be configured to implement any data transmission method in the foregoing second aspect.

According to an eighth aspect, a data transmission apparatus is provided. The apparatus is used for a transmit end device and may include at least one module. The at least one module may be configured to implement any data transmission method in the foregoing third aspect.

According to a ninth aspect, a data transmission apparatus is provided. The apparatus is used for a transmit end device and may include at least one module. The at least one module may be configured to implement any data transmission method in the foregoing fourth aspect.

According to a tenth aspect, a data transmission apparatus is provided. The apparatus is used for a receive end device and may include at least one module. The at least one module may be configured to implement any data transmission method in the foregoing fifth aspect.

According to an eleventh aspect, a data transmission apparatus is provided, including:

a processor and a memory, where the memory is configured to store computer execution instructions; and when the processor runs, the processor executes the computer execution instructions in the memory, to implement any one of the foregoing data transmission methods.

According to a twelfth aspect, a data transmission system is provided, including: a transmit end device and a receive end device, where the transmit end device includes any data transmission apparatus in the first aspect, and the receive end device includes any data transmission apparatus in the second aspect.

The transmit end device and the receive end device each include a PHY chip.

Alternatively, the transmit end device and the receive end device each include a PHY chip, a clock and data recovery (CDR) chip, and an optical module.

Alternatively, the transmit end device and the receive end device each include a PHY chip and an optical module.

Alternatively, the transmit end device includes a PHY chip, a CDR chip, and an optical module, and the receive end device includes a PHY chip and an optical module.

Alternatively, the transmit end device includes a PHY chip and an optical module, and the receive end device includes a PHY chip, a CDR chip, and an optical module.

According to a thirteenth aspect, a computer-readable storage medium is provided. The computer-readable storage medium stores instructions; and when the instructions are run on a computer, the computer is enabled to perform any one of the foregoing data transmission methods.

According to a fourteenth aspect, a computer program product is provided. The computer program product stores instructions; and when the instructions are run on a computer, the computer is enabled to perform any one of the foregoing data transmission methods.

According to a fifteenth aspect, a chip is provided. The chip may include a programmable logic circuit and/or program instructions; and when the chip runs, the chip is configured to implement any one of the foregoing data transmission methods.

For example, the chip includes a processor and a memory, where the memory is configured to store the foregoing program instructions; and when the processor runs, the processor executes the program instructions in the memory, to implement any one of the foregoing data transmission methods.

Further, the chip may be a PHY chip or a CDR chip.

Beneficial effects brought by technical solutions provided in this application may include at least:

In this application, in a process of performing data transmission, the transmit end device and the receive end device may use n bits as a unit symbol for transmission. Compared with a conventional implementation in which data transmission is performed by using one bit as a unit symbol, if transmitted data carries burst error data, there are fewer error symbols, and a quantity of error symbols in a transmission process is reduced. This reduces spread of the burst error data, and improves reliability of data transmission.

Further, in data transmission methods provided in this application, the transmit end device maps the x second data streams (for example, the second data streams are output over an FEC lane) at the granularity of n (n≥2) bits to obtain the z third data streams, and then outputs the z third data streams (for example, the third data streams are output over an entity lane), and the mapping granularity of the x second data streams is greater than a mapping granularity in a bit MUX architecture. Therefore, when the third data streams carry burst error data in a transmission process, if the receive end device performs FEC symbol error correction, the burst error data is converted into a relatively small quantity of FEC symbol errors, thereby reducing a quantity of FEC symbol errors in which an error occurs. This increases a success rate of FEC codeword error correction processing, improves error correction performance, and ensures a correctness percentage of subsequent data transmission.

DESCRIPTION OF EMBODIMENTS

Currently, the IEEE 802.3ck protocol defines Ethernet interface standards such as 100GE, 200GE, and 400GE based on 100 gigabyte (G) electrical lanes, for example, a chip-to-module (C2M) interface standard based on 100 switching bandwidth (Gbps) electrical lanes, to be specific, 100 gigabyte attachment unit interface (AUI)-1, 200GAUI-2, and 400GAUI-4 interface standards.

Figure 1:
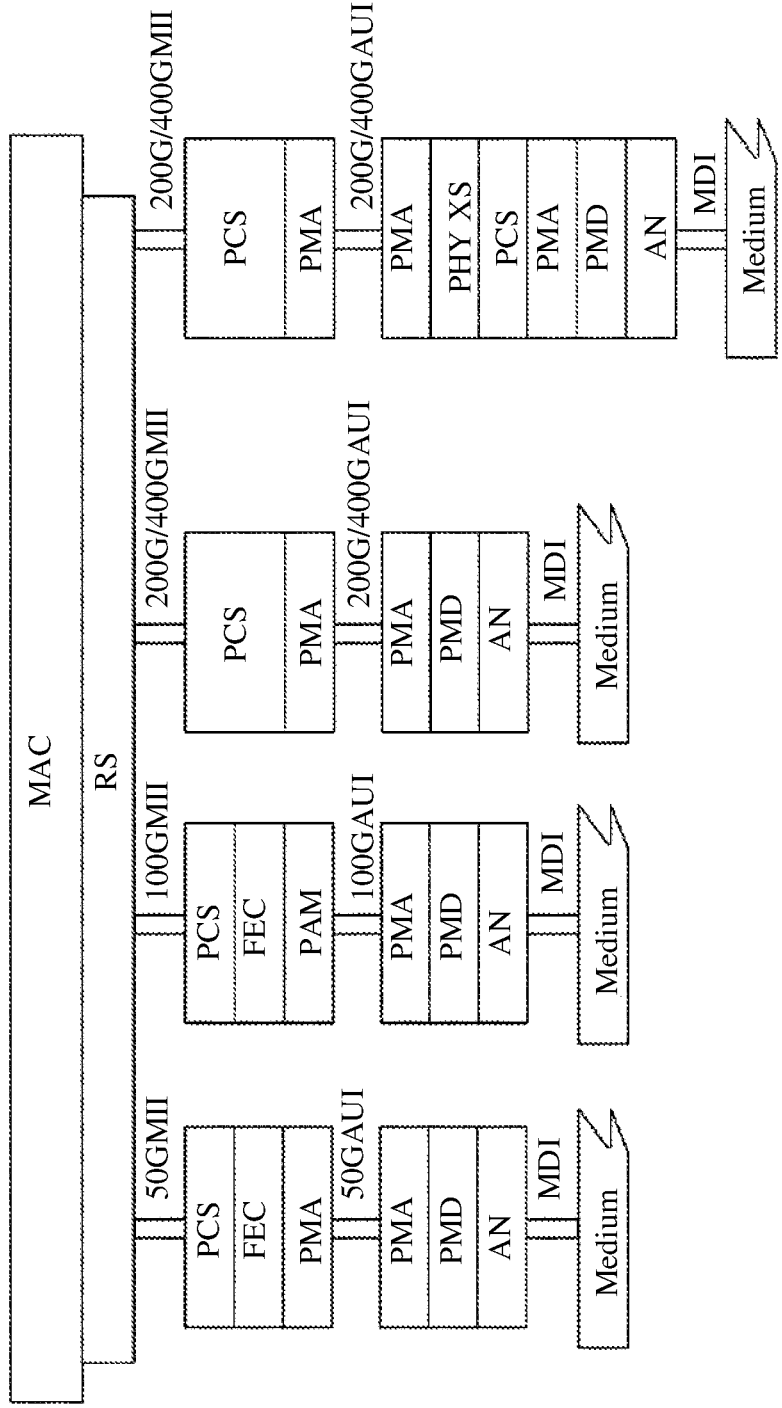
FIG. 1 is a schematic diagram of a hierarchical structure of an Ethernet interface according to an embodiment of this application.

Referring to FIG. 1, FIG. 1 is a schematic diagram of a hierarchical structure of some Ethernet interfaces defined by IEEE 802.3bs and IEEE 802.3cd under IEEE 802.3ck. The IEEE 802.3bs protocol defines 200GE and 400GE Ethernet interface standards. The IEEE 802.3cd protocol defines 50GE, 100GE, and 200GE Ethernet interface standards. As shown in FIG. 1, the hierarchical structure of the Ethernet interfaces includes a media access control (MAC) layer, a reconciliation sublayer (RS), a physical coding sublayer (PCS), an FEC layer, a PMA layer, a physical medium dependent (PMD) layer, an auto-negotiation (AN) layer, and a medium (for example, a coaxial cable, an optical fiber, or a twisted pair cable) that are sequentially arranged. A medium independent interface (MII) is disposed between the RS and the PCS. An attachment unit interface (AUI) is disposed between PMA layers that are deployed on different modules (an example in which two PMA layers are deployed on different modules is used for illustration in FIG. 1). A medium dependent interface (MDI) is disposed between the AN layer and the medium. The RS, the PCS, the FEC layer, the PMA layer, the PMD layer, and the AN layer belong to a physical layer of the Ethernet interfaces. In normal cases (for example, in a 50GE/100GE scenario), data to be sent passes through the MAC layer, the RS, the PCS, the FEC layer, the PMA layer, the PMD layer, the AN layer, and the medium sequentially; and data to be received passes through the medium, the AN layer, the PMD layer, the PMA layer, the FEC layer, the PCS, the RS, and the MAC layer sequentially.

Optionally, in a 200GE/400GE scenario, the following layers may be further included between the PMA layer and the PMD layer: a port physical layer extender sublayer (PHY XS), a PCS layer, and a PMA layer. Alternatively, in a 200GE/400GE scenario, a function of the FEC layer may be integrated to the PCS layer.

The RS is configured to provide mapping processing for data transmitted between the MAC layer and the PCS. The PCS is configured to perform encoding processing or decoding processing on transmitted data based on a specific coding scheme. The FEC layer is configured to implement FEC processing. The PMA layer is configured to support the PCS layer in using a plurality of types of physical media. The PMD layer is configured to implement mutual conversion between a data signal of the PMA layer and a transmitted signal on a specific medium. The AN layer is configured to connect to an auto-negotiation device. The auto-negotiation device may determine, by detecting a mode supported by a physical medium end, a mode jointly supported by a physical layer and the physical medium end, and configure the mode for the physical layer. The PHY XS layer is configured to extend a port connection of the physical layer. The MII may be configured to transmit data at different rates, which may include a plurality of types of data such as 50GMII, 100GMII, and 200GMII/400GMII.

It should be noted that, the hierarchical structure of the Ethernet interfaces is divided based on a function of a device used to perform data transmission. During actual implementation, the hierarchical structure may be adjusted based on a situation. For example, the layers may be increased, decreased, or combined. This is not limited in embodiments of this application.

Figure 2:
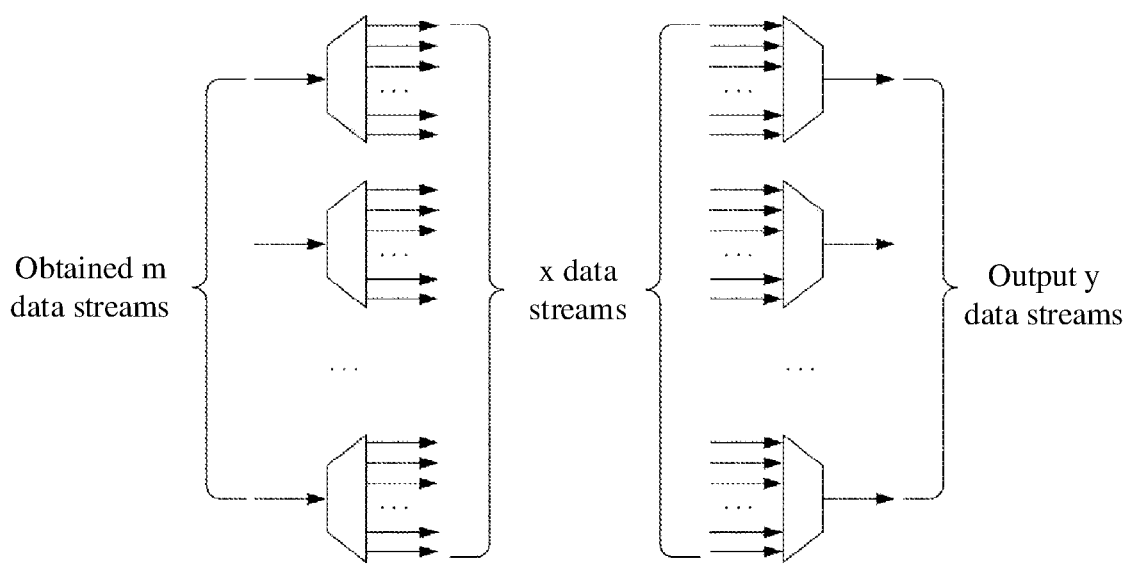
FIG. 2 is a schematic flowchart of bit MUX processing according to an embodiment of this application.
Figure 3:
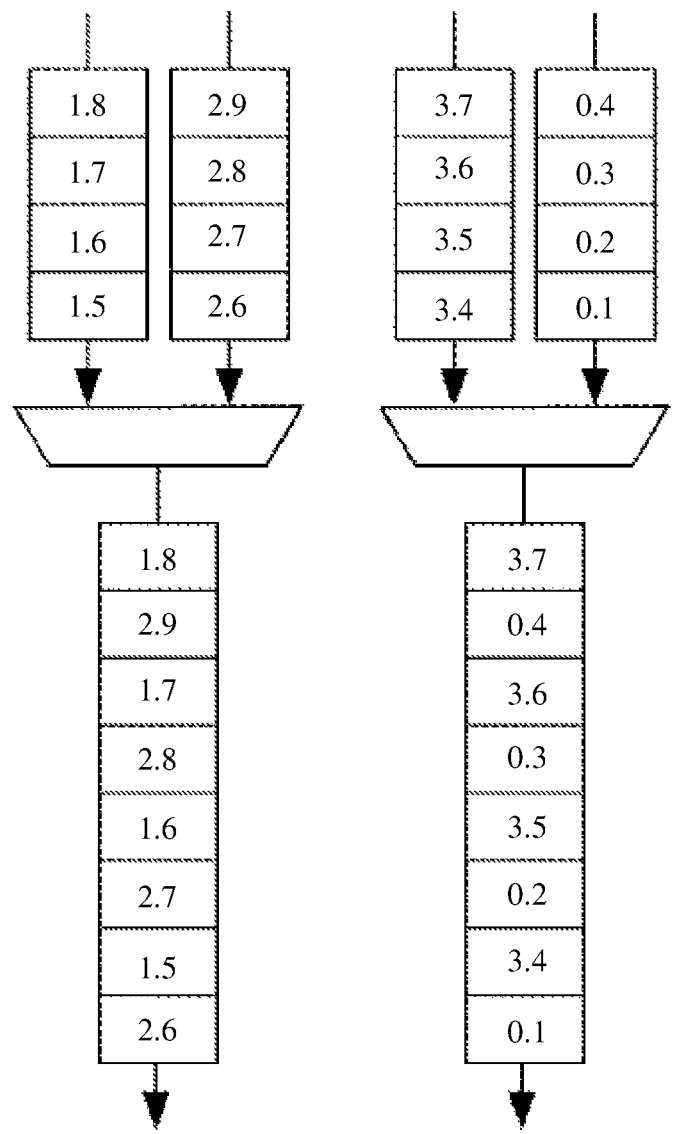
FIG. 3 is a schematic diagram of a bit MUX architecture according to an embodiment of this application.
Figure 4:
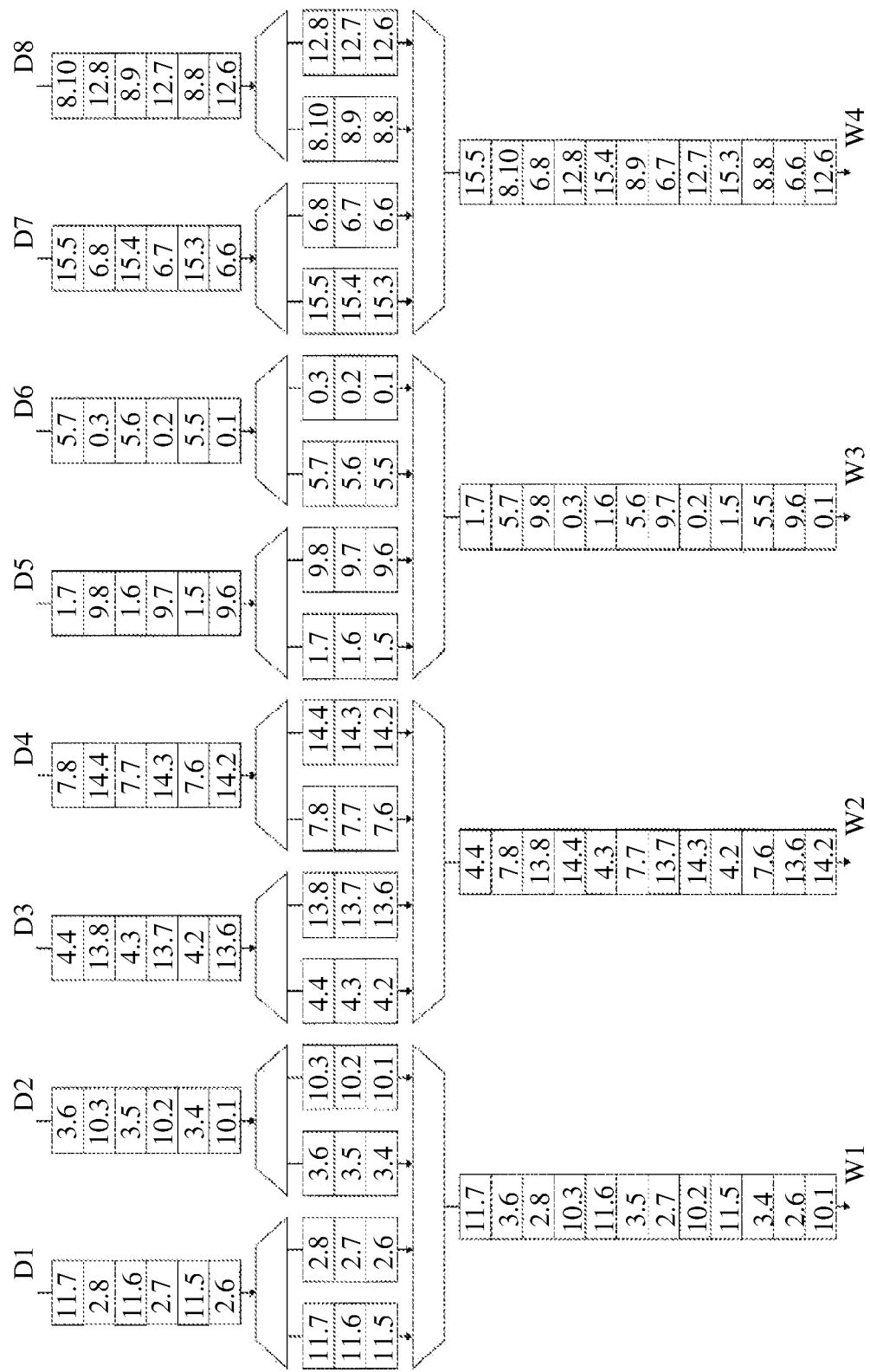
FIG. 4 is a schematic diagram of a bit MUX architecture according to an embodiment of this application.

The PMA layer uses a bit MUX architecture, and bit MUX processing is performed in the bit MUX architecture. Referring to FIG. 2, the processing includes: mapping m data streams obtained by the PMA layer to obtain x data streams (this processing is also referred to as demultiplexing processing), mapping the obtained x data streams to obtain y data streams (this processing is also referred to as multiplexing processing), and outputting the y data streams over different PMA lanes that one-to-one correspond to the y data streams, where x is a common multiple of m and y; and m, x and y are all positive integers. For ease of understanding by a reader, FIG. 3 is a schematic diagram of a bit MUX architecture in which m=4, x=4, and y=2. This architecture may be referred to as a 4:2 architecture. FIG. 4 is a schematic diagram of a bit MUX architecture in which m=8, x=16, and y=4. This architecture may be referred to as an 8:4 architecture. It should be noted that data carried in each data stream in FIG. 3 and FIG. 4 is merely an example for description, and data content in the data stream is not limited in embodiments of this application.

For ease of understanding by a reader, in an embodiment of this application, the bit MUX architecture in FIG. 4 is used as an example for description. For a principle of the bit MUX architecture in FIG. 3, refer to the bit MUX architecture shown in FIG. 4. It is assumed that the m data streams obtained by the PMA layer are data streams D1 to D8, where data in the data stream D1 includes 11.7, 2.8, 11.6, 2.7, 11.5, and 2.6; data in the data stream D2 includes 3.6, 10.3, 3.5, 10.2, 3.4, and 10.1; data in the data stream D3 includes 4.4, 13.8, 4.3, 13.7, 4.2, and 13.6; data in the data stream D4 includes 7.8, 14.4, 7.7, 14.3, 7.6, and 14.2; data in the data stream D5 includes 1.7, 9.8, 1.6, 9.7, 1.5, and 9.6; data in the data stream D6 includes 5.7, 0.3, 5.6, 0.2, 5.5, and 0.1; data in the data stream D7 includes 15.5, 6.8, 15.4, 6.5, 15.3, and 6.6; and data in the data stream D8 includes 8.10, 12.8, 8.9, 12.7, 8.8, and 12.6. In this case, a process of performing bit MUX processing on the m data streams D1 to D8 is as follows:

Demultiplexing processing is performed on the data streams D1 to D8 at a granularity (also referred to as a unit) of bits (that is, one bit), to obtain x demultiplexed data streams. Through demultiplexing processing, two data streams in the x data streams are obtained from each of the m data streams. In this case, the x data streams are 16 data streams, data in each of the data streams includes 3-bit data, and the 16 data streams respectively include data 11.7, 11.6, and 11.5; 2.8, 2.7, and 2.6; 3.6, 3.5, and 3.4; 10.3, 10.2, and 10.1; 4.4, 4.3, and 4.2; 13.8, 13.7, and 13.6; 7.8, 7.7, and 7.6; 14.4, 14.3, and 14.2; 1.7, 1.6, and 1.5; 9.8, 9.7, and 9.6; 5.7, 5.6, and 5.5; 0.3, 0.2, and 0.1; 15.5, 15.4, and 15.3; 6.8, 6.7, and 6.5; 8.10, 8.9, and 8.8; and 12.8, 12.7, and 12.6. Then, multiplexing processing is performed on the 16 data streams at the granularity of bits, to obtain four data streams (that is, y=4), which are data streams W1 to W4. Data of the data stream W1 includes 11.7, 3.6, 2.8, 10.3, 11.6, 3.5, 2.7, 10.2, 11.5, 3.4, 2.6, and 10.1. Data of the data stream W2 includes 4.4, 7.8, 13.8, 14.4, 4.3, 7.7, 13.7, 14.3, 4.2, 7.6, 13.6, and 14.2. Data of the data stream W3 includes 1.7, 5.7, 9.8, 0.3, 1.6, 5.6, 9.7, 0.2, 1.5, 5.5, 9.6, and 0.1. Data of the data stream W4 includes 15.5, 8.10, 6.8, 12.8, 15.4, 8.9, 6.7, 12.7, 15.3, 8.8, 6.6, and 12.6.

It should be noted that, in the Ethernet interface standard, a single-lane data transmission rate at a transmit end is usually different from a single-lane data transmission rate at a receive end, and data transmission rate conversion may be implemented by using the bit MUX architecture at the PMA layer, so that data transmission rates of the transmit end and the receive end are matched.

In the bit MUX architecture of the PMA layer, the PMA layer performs data demultiplexing processing and multiplexing processing at the granularity of bits, and the mapping granularity is relatively small. Under the influence of the bit MUX architecture, currently, in a data transmission process between a transmit end device and a receive end device, data between an output lane of a PMA layer of the transmit end device and an input lane of a PMA layer of the receive end device is transmitted by bits. In other words, a unit symbol used for transmission at the transmit end and the receive end is one bit. When data transmitted in the output lane of the PMA layer of the transmit end device and transmitted at the PMA layer of the receive end device carries burst error data, the burst error data is carried in a plurality of transmission unit symbols, which causes large spread of the burst error data, leading to relatively low data transmission reliability.

Figure 5:
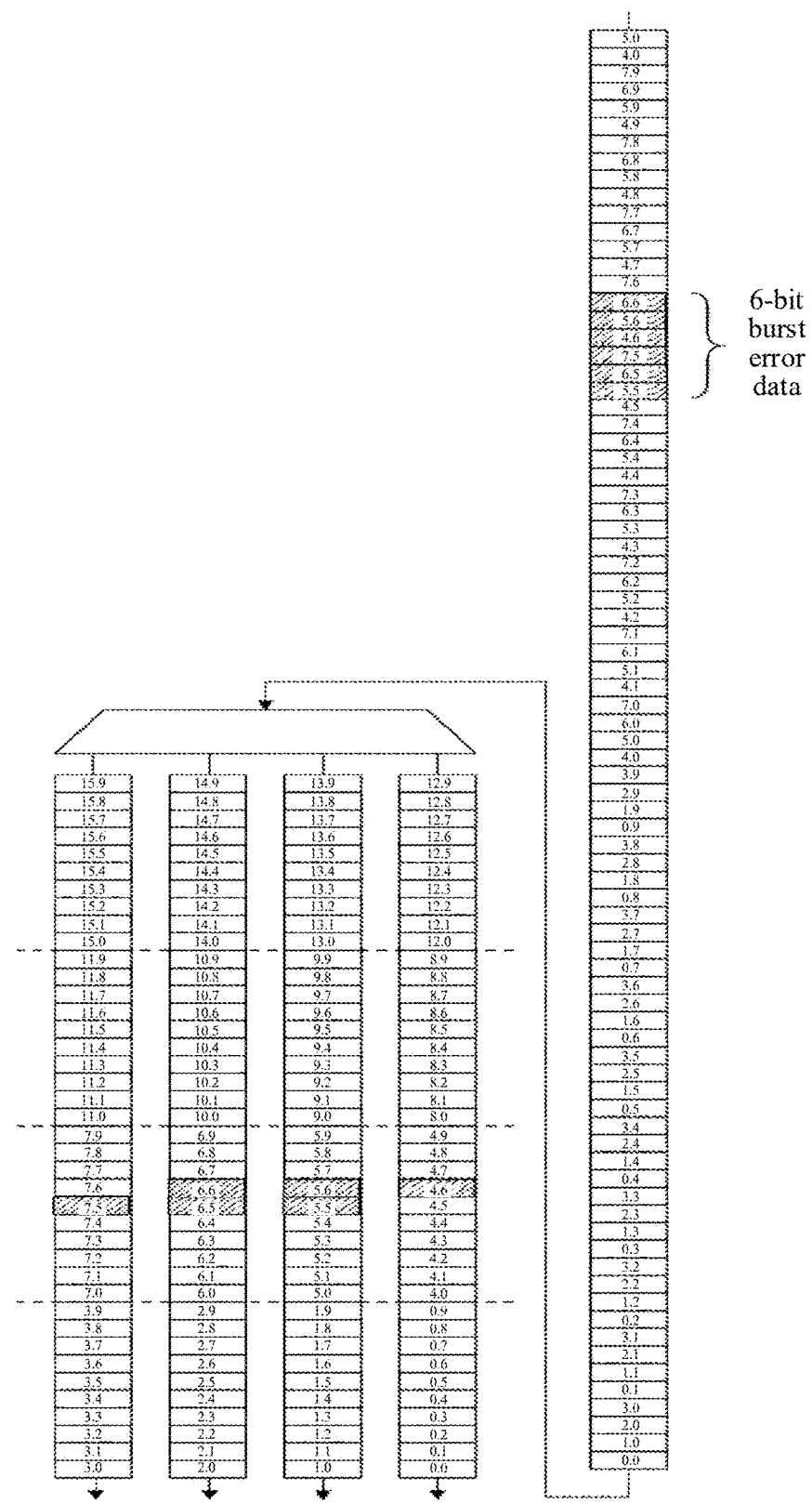
FIG. 5 is a schematic diagram of a bit MUX architecture according to an embodiment of this application.

As shown in FIG. 5, it is assumed that m=1 and y=4. In other words, the bit MUX architecture is a 1:4 architecture. If a data stream received by the PMA layer of the receive end device carries burst error data (data in a shaded part in FIG. 5) whose length is six consecutive bits, that is, there is an error of six unit symbols in the data transmitted in the output lane of the PMA layer of the transmit end device and transmitted at the PMA layer of the receive end device, after the PMA layer of the receive end device performs demultiplexing (Bit De-Mux) processing at the granularity of bits, FEC codeword error correction processing needs to be performed, and the FEC codeword error correction processing is performed by FEC codewords. For example, in an application scenario of IEEE 802.3, for ease of understanding, it is assumed that data in the data stream shown in FIG. 5 is divided by FEC symbols, and a length of the FEC symbol is 10 bits (it should be noted that this is merely an assumption made herein for ease of description, and the data stream is currently transmitted by bits). In this case, the 6-bit burst error data in the data that is shown in FIG. 5 and that is transmitted by using one bit as a unit symbol is mapped to data of four FEC symbols, resulting in four FEC symbol errors (an FEC symbol error is an error in data of the FEC symbol). This causes large spread of the burst error data, and causes many FEC symbol errors. Only a specific quantity of FEC symbol errors can be corrected through FEC codeword error correction (for example, when FEC codeword error correction corresponding to RS(544, 514) is used, a maximum of 15 FEC symbol errors can be corrected). Therefore, once a quantity of FEC symbol errors caused by burst error data exceeds a quantity of correctable FEC symbol errors, the FEC codeword error correction processing fails, error correction performance is reduced, the burst error data cannot be corrected, and a correctness percentage of subsequent data transmission is reduced.

Figure 6:
FIG. 6 is a schematic structural diagram of a data transmission system according to an embodiment of this application.

Referring to FIG. 6, FIG. 6 is a schematic structural diagram of a data transmission system according to an embodiment of this application. The data transmission system includes a transmit end device 10 and a receive end device 20. A communication connection is established between the transmit end device 10 and the receive end device 20. The communication connection is a communication connection established based on the foregoing Ethernet interface standard. The transmit end device 10 is configured to send data, and the receive end device 20 is configured to receive data. Further, the transmit end device 10 may encode data that needs to be sent; and correspondingly, the receive end device 20 may decode received data. For example, the transmit end device 10 and the receive end device 20 each include a PHY chip. Alternatively, the transmit end device 10 and the receive end device 20 each include a PHY chip, a clock and data recovery (clock data recovery, CDR) chip, and an optical module. Alternatively, the transmit end device 10 and the receive end device 20 each include a PHY chip and an optical module. Alternatively, the transmit end device 10 includes a PHY chip, a CDR chip, and an optical module, and the receive end device 20 includes a PHY chip and an optical module. Alternatively, the transmit end device 10 includes a PHY chip and an optical module, and the receive end device 20 includes a PHY chip, a CDR chip, and an optical module. Both the transmit end device and the receive end device may be used for (or integrated to) a device such as a router, a switch, or a server.

For ease of understanding by a reader, some definitions in the following data transmission methods are explained in embodiments of this application.

FEC encoding (FEC encode): A redundant error-correcting code is added to transmitted data (a location of the redundant error-correcting code is referred to as a check bit), so that a decoder side can restore the data through FEC decoding under specific conditions, and automatically correct an error (that is, error data) that occurs in a transmission process. An indicator that measures an error correction capability of FEC encoding is referred to as an "FEC encoding gain". The gain is positively correlated with error correction performance of FEC encoding. To be specific, a larger gain indicates higher error correction performance of FEC encoding.

Mapping processing: r data streams are processed and converted into t data streams based on a specific rule, where r may or may not be equal to t. The mapping processing may include multiplexing processing, demultiplexing processing, interleaving processing, and deinterleaving processing. In the multiplexing processing, a quantity of data streams obtained through conversion is less than a quantity of data streams before conversion, that is, t<r. The demultiplexing processing is an inverse process of the multiplexing processing. To be specific, a quantity of data streams obtained through conversion is greater than a quantity of data streams before conversion, that is, t>r. In the interleaving processing, data of at least one data stream obtained through conversion is from data of at least two data streams before conversion. To be specific, data interleaving of different data streams is implemented through the interleaving processing. The deinterleaving processing is an inverse process of the interleaving processing. In the deinterleaving processing, data of at least two data streams obtained through conversion is from data of at least one data stream. To be specific, interleaved data streams are restored through the deinterleaving processing.

This application provides a data transmission method to resolve a problem of large spread of burst error data without changing a bit MUX structure. In the data transmission method, a transmit end device may first perform demultiplexing processing on obtained y first data streams to obtain x second data streams, where the y first data streams are obtained through bit MUX processing; then map the x second data streams at a granularity of n bits to obtain z third data streams; and then output the z third data streams over an output lane, where y, x, n, and z are all positive integers, and n≥2.

The output lane may be an entity lane (also referred to as a physical lane, a real lane, or an interface), or may be a virtual lane. This is not limited in this embodiment of this application. In this embodiment of this application, in a process of performing data transmission, the transmit end device and a receive end device may use n bits as a unit symbol for transmission. Compared with a conventional manner in which data transmission is performed by using one bit as a unit symbol, if transmitted data carries burst error data, there are fewer error symbols, and a quantity of error symbols in a transmission process is reduced. This reduces spread of the burst error data, and improves reliability of data transmission.

Further, in the data transmission method provided in this embodiment of this application, the transmit end device maps the x second data streams (for example, the second data streams are output over an FEC lane) at the granularity of n (n≥2) bits to obtain the z third data streams, and then outputs the z third data streams (for example, the third data streams are output over an entity lane), and the mapping granularity of the x second data streams is greater than a mapping granularity in a bit MUX architecture. Therefore, when the third data streams carry burst error data in a transmission process, if the receive end device performs FEC symbol error correction, the burst error data is converted into a relatively small quantity of FEC symbol errors, thereby reducing a quantity of FEC symbol errors in which an error occurs. This increases a success rate of FEC codeword error correction processing, improves error correction performance, and ensures a correctness percentage of subsequent data transmission.

Because a quantity of input lanes and a format of received data of a receive end device corresponding to a transmit end device are different, content of a data stream finally output by the transmit end device is different, a manner of obtaining the finally output data stream is different, and a corresponding data transmission method is different. In embodiments of this application, the following several optional implementations are used as examples for description.

Figure 7:
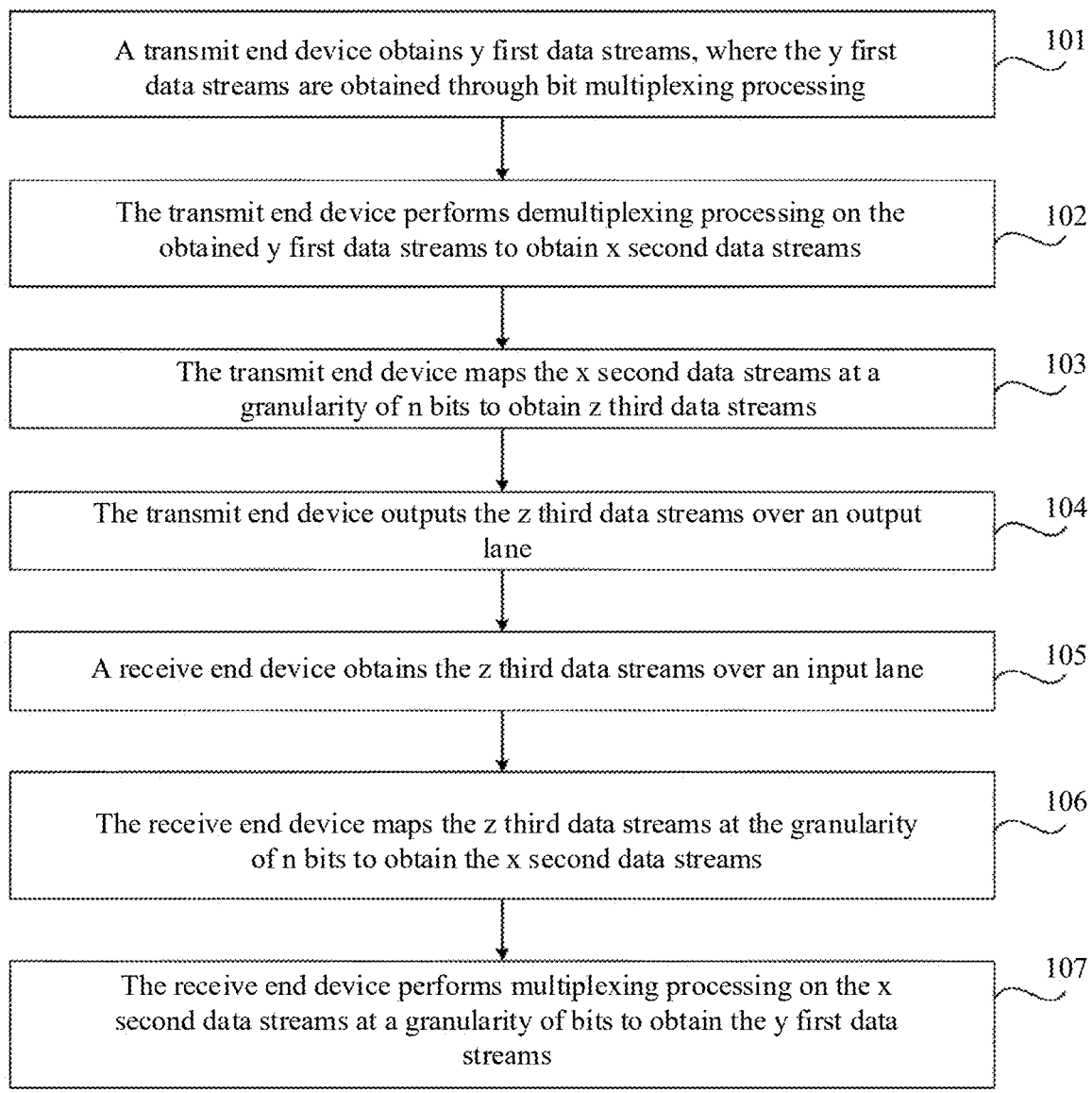
FIG. 7 is a flowchart of a data transmission method according to an embodiment of this application.

In a first optional implementation, referring to FIG. 7, FIG. 7 is a flowchart of a data transmission method according to an embodiment of this application. The data transmission method may be applied to the system shown in FIG. 6. As shown in FIG. 7, the method includes the following steps.

Step 101: A transmit end device obtains y first data streams, where the y first data streams are obtained through bit MUX processing.

When the transmit end device needs to transmit a generated or received to-be-transmitted data stream to a receive end device, at least bit MUX processing is performed on the to-be-transmitted data stream. For example, referring to FIG. 1, when the transmit end device sends to-be-transmitted data, the to-be-transmitted data stream is usually transmitted to a PMA layer after passing through a MAC layer, an RS, a PCS, and an FEC layer, and then bit MUX processing is performed on the to-be-transmitted data stream at the PMA layer, to implement data rate matching between the transmit end device and the receive end device.

In this embodiment of this application, it is assumed that the transmit end device obtains y first data streams, where the y first data streams are obtained through bit MUX processing, and y is a positive integer. The data transmission method provided in this embodiment of this application is performed for the y first data streams.

As described above, if the bit MUX architecture shown in any one of FIG. 3 to FIG. 5 is used, the y first data streams obtained by the transmit end device may be obtained by performing bit MUX processing on at least one data stream. In this case, the at least one data stream may be the foregoing m data streams, and the y first data streams obtained through processing are the foregoing y data streams. The at least one data stream may be obtained by performing specified processing on the to-be-transmitted data stream generated or received by the transmit end device, or may be the same as the to-be-transmitted data stream. This is not limited in this embodiment of this application. The specified processing may be processing of at least one of the MAC layer, the RS, the PCS, and the FEC layer.

It should be noted that the to-be-transmitted data stream usually needs to pass through the FEC layer, and the FEC layer performs first FEC encoding (FEC encode) on the to-be-transmitted data stream, to perform FEC codeword error correction processing on the to-be-transmitted data stream, thereby ensuring accuracy of the to-be-transmitted data stream. For example, the first FEC encoding may be RS(544, 514). Correspondingly, the y first data streams are also obtained through first FEC encoding.

Step 102: The transmit end device performs demultiplexing processing on the obtained y first data streams to obtain x second data streams.

As described in step 101, the obtained y first data streams are obtained through bit MUX processing. As shown in FIG. 2 to FIG. 4, in a process of the bit MUX processing, demultiplexing processing is first performed on m data streams at a granularity of bits to obtain x data streams, and then multiplexing processing is performed on the obtained x data streams at the granularity of bits to obtain y data streams. In the data transmission method provided in this embodiment of this application, further processing may be performed on data that is before multiplexing processing in the bit MUX processing process. To obtain a data stream that is before multiplexing processing, the transmit end device may perform demultiplexing processing on the obtained y first data streams at the granularity of bits to obtain the x second data streams. The x second data streams generally have same content as the x data streams in the bit MUX processing process, or at least have a same quantity of data streams as the x data streams in the bit MUX processing process. In the data transmission method provided in this embodiment of this application, further processing may be further performed on data that is before bit MUX processing. To obtain a data stream that is before bit MUX processing, the transmit end device may perform demultiplexing processing on the obtained y first data streams at the granularity of bits, and then perform multiplexing processing on data obtained through the demultiplexing processing, to obtain the x second data streams. The x second data streams generally have same content as the m data streams that are before bit MUX processing, or at least have a same quantity of data streams as the m data streams that are before bit MUX processing, where x is a positive integer.

In this embodiment of this application, an example in which further processing is performed on data that is before multiplexing processing in the bit MUX processing process is used for description. In this case, the example shown in FIG. 4 is still used as an example. The transmit end device performs demultiplexing processing on the four first data streams W1 to W4 to obtain 16 second data streams.

Step 103: The transmit end device maps the x second data streams at a granularity of n bits to obtain z third data streams.

Data in each of the x second data streams carries an alignment marker (AM), and the alignment marker is used to identify an output lane to which the second data stream belongs. For example, the AM includes an identifier of the output lane to which the second data stream belongs. For example, if the second data stream is output over an FEC lane, the AM includes an identifier of the FEC lane.

z and n are positive integers, and n≥2. For example, in an application scenario of the IEEE 802.3ck protocol, RS(544, 514) FEC processing needs to be performed. Therefore, when the data transmission method is applied to an application scenario of the IEEE 802.3ck protocol, n=10, to be specific, a mapping granularity is a length of one FEC symbol. As described above, when n=10, a unit symbol for data transmission performed by the transmit end device and the receive end device is equivalent to one FEC symbol.

Figure 8:
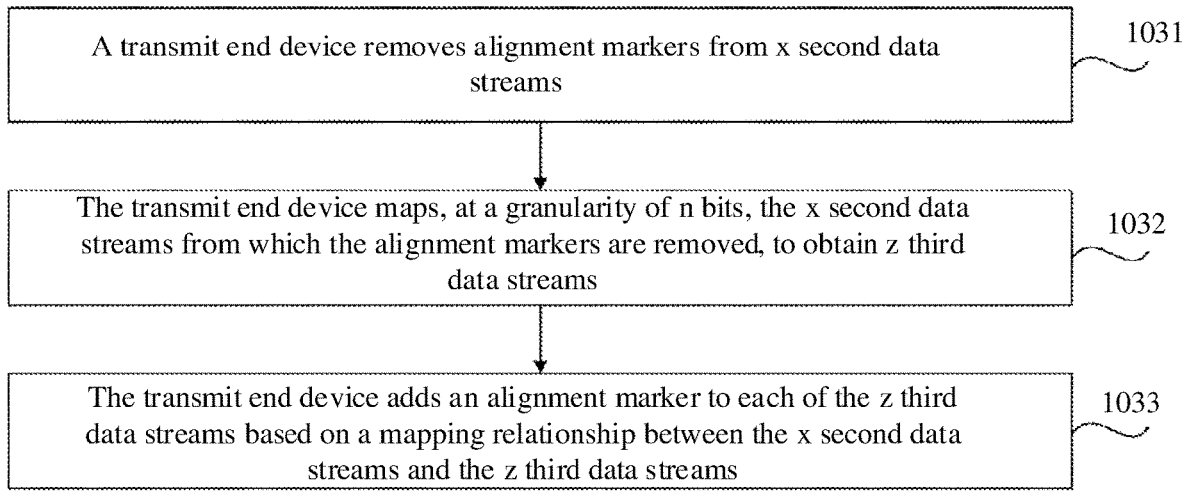
FIG. 8 is a flowchart of a method for mapping x second data streams at a granularity of n bits to obtain z third data streams according to an embodiment of this application.

As shown in FIG. 8, the process of mapping the x second data streams at a granularity of n bits to obtain z third data streams may include the following steps.

Step 1031: The transmit end device removes alignment markers from the x second data streams.

The transmit end device may remove the alignment marker carried in the data in each of the x second data streams. This process is referred to as alignment marker removal.

Step 1032: The transmit end device maps, at the granularity of n bits, the x second data streams from which the alignment markers are removed, to obtain z third data streams.

For example, in an application scenario of the IEEE 802.3ck protocol, the transmit end device may map, at a granularity of 10 bits (an FEC symbol), the x second data streams from which the alignment markers are removed, to obtain the z third data streams.

Step 1033: The transmit end device adds an alignment marker to each of the z third data streams based on a mapping relationship between the x second data streams and the z third data streams.

It should be noted that, the alignment marker processing process (step 1031 and step 1033) may alternatively be replaced by: The transmit end device directly overwrites, based on a mapping relationship between the x second data streams and the z third data streams, the alignment marker carried in the data. The new alignment marker of each of the z third data streams may be directly used to overwrite the original alignment marker.

It should be further noted that during actual implementation, step 1033 may be divided into two steps: alignment marker mapping and alignment marker adding. The alignment marker mapping process is a process in which the transmit end device determines alignment markers of the z third data streams based on the mapping relationship between the x second data streams and the z third data streams. The alignment marker adding process is a process in which the transmit end device adds the corresponding determined alignment marker to each of the z third data streams.

Step 104: The transmit end device outputs the z third data streams over an output lane.

Optionally, step 101 to step 103 may be performed by the PMA layer of the transmit end device, or a sublayer newly added to the transmit end device. For example, the sublayer may be referred to as an AUI extender sublayer (extender sublayer, XS). The AUI XS may be located between PMA layers, or may be located between the PMA layer and a PMD layer. Step 104 may be performed by the PMD layer of the transmit end device or by another interface layer connected to the receive end device, for example, by the PMA layer of the transmit end device.

When step 104 is performed by the PMD layer, the output lane may be a PMD output lane (the PMD output lane is a physical lane), and the transmit end device makes the z third data streams one-to-one correspond to z PMD output lanes, and outputs the third data streams from the PMD layer (that is, from an MDI interface) over corresponding PMD output lanes.

Step 105: The receive end device obtains the z third data streams over an input lane.

In step 104, the transmit end device outputs the z third data streams over the output lane. Correspondingly, the receive end device corresponding to the transmit end device receives the z third data streams over the input lane.

Optionally, step 105 may be performed by a PMD layer of the receive end device or by another interface layer connected to the transmit end device, for example, by a PMA layer of the receive end device.

When step 105 is performed by the PMD layer, the input lane may be z PMD input lanes (where the PMD input lane is a physical lane). In this case, the receive end device receives, over the z PMD input lanes, the z third data streams that one-to-one correspond to the z PMD input lanes.

Data required by the receive end device is to-be-sent data that has not been processed by the transmit end device, that is, the required data is data on which steps 102 to 104 are not performed. Therefore, a data processing process performed by the receive end device is opposite to a data processing process performed by the transmit end device. For implementations of the following steps, refer to implementations of corresponding steps described above in this embodiment.

Step 106: The receive end device maps the z third data streams at the granularity of n bits to obtain the x second data streams.

Figure 9:
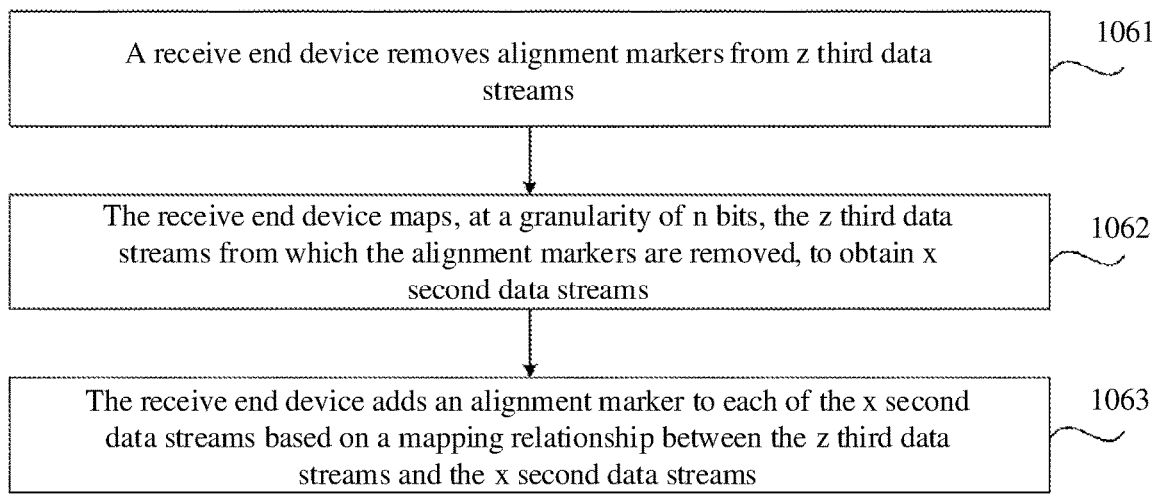
FIG. 9 is a flowchart of a method for mapping z received third data streams at a granularity of n bits to obtain x second data streams according to an embodiment of this application.

Because the transmit end device performs step 103, correspondingly, the receive end device may map the z third data streams at the granularity of n bits to obtain the x second data streams. As shown in FIG. 9, a process in which the receive end device maps the received z third data streams at the granularity of n bits to obtain the x second data streams may include the following steps:

Step 1061: The receive end device removes alignment markers from the z third data streams.

For an implementation process of step 1061, refer to the implementation process of step 1031. Details are not described again in this embodiment of this application.

Step 1062: The receive end device maps, at the granularity of n bits, the z third data streams from which the alignment markers are removed, to obtain the x second data streams.

An implementation process of step 1062 is opposite to the implementation process of step 1032 described above in this embodiment. Therefore, for the implementation process of step 1062, refer to the implementation process of step 1032 described above in this embodiment. Details are not described again in this embodiment of this application.

For example, in an application scenario of the IEEE 802.3ck protocol, the receive end device may map, at a granularity of 10 bits (an FEC symbol), the z third data streams from which the alignment markers are removed, to obtain the x second data streams.

Step 1063: The receive end device adds an alignment marker to each of the x second data streams based on a mapping relationship between the z third data streams and the x second data streams.

For an implementation process of step 1063, refer to the implementation process of step 1033 described above in this embodiment. Details are not described again in this embodiment of this application.

Step 107: The receive end device performs multiplexing processing on the x second data streams at a granularity of bits to obtain the y first data streams.

Because the x second data streams in the transmit end device in step 102 are obtained by performing demultiplexing processing on the obtained y first data streams, a method for obtaining the y first data streams by the receive end device is performing inverse processing of the demultiplexing processing, that is, multiplexing processing, on the x second data streams. For an implementation method of step 107, refer to the implementation of step 102. Details are not described again in this embodiment of this application.

In the data transmission method provided in the first optional implementation, the transmit end device maps the x second data streams at the granularity of n (n≥2) bits to obtain the z third data streams, and then outputs the z third data streams. Therefore, in a process of performing data transmission, the transmit end device and the receive end device use n bits as a unit symbol for transmission.

Figure 10:
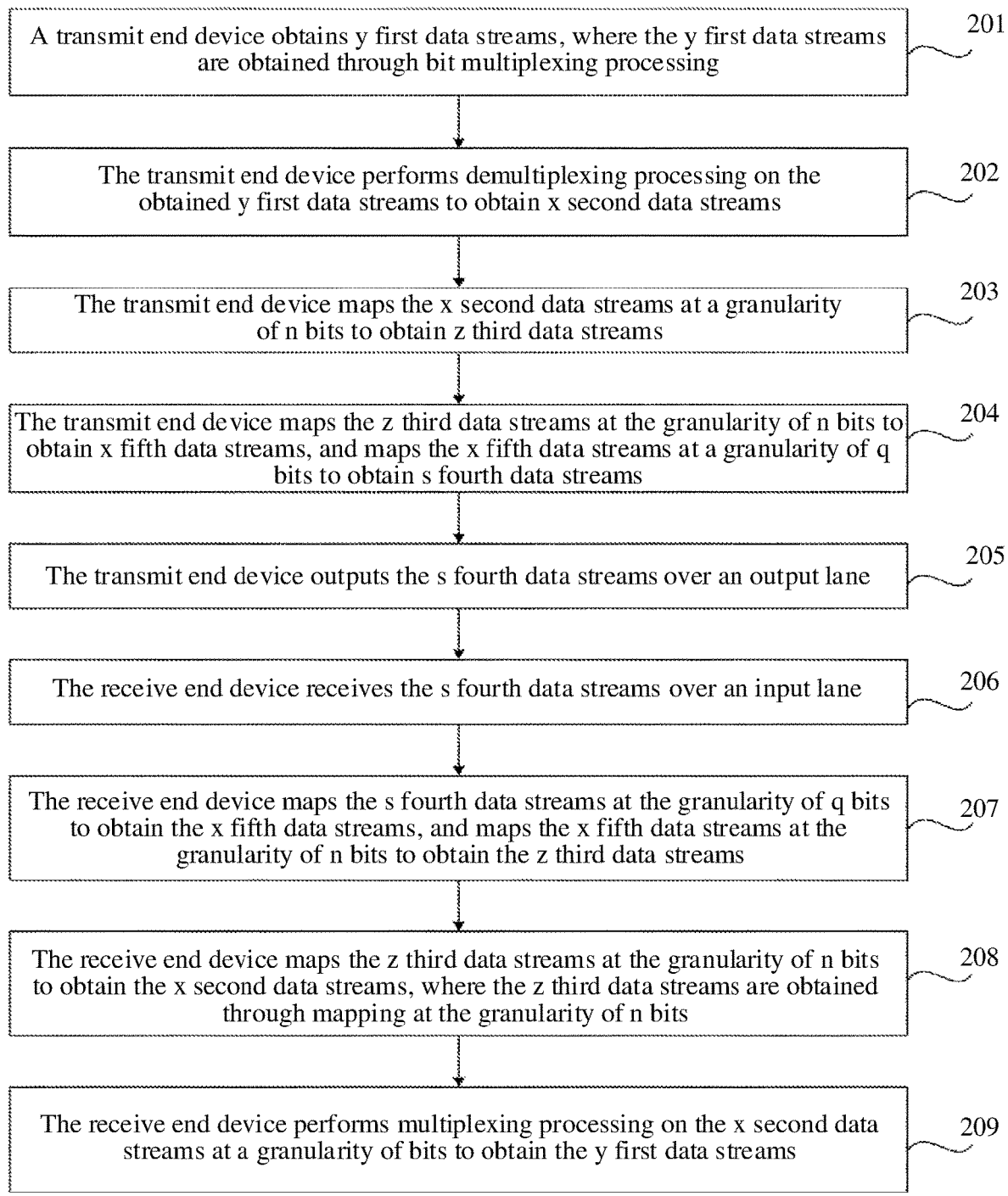
FIG. 10 is a flowchart of a data transmission method according to an embodiment of this application.

In a second optional implementation, referring to FIG. 10, FIG. 10 is a flowchart of another data transmission method according to an embodiment of this application. The data transmission method may be applied to the system shown in FIG. 6. As shown in FIG. 10, the method includes the following steps.

Step 201: A transmit end device obtains y first data streams, where the y first data streams are obtained through bit MUX processing.

Step 202: The transmit end device performs demultiplexing processing on the obtained y first data streams to obtain x second data streams.

Step 203: The transmit end device maps the x second data streams at a granularity of n bits to obtain z third data streams.

Step 204: The transmit end device maps the z third data streams at the granularity of n bits to obtain x fifth data streams, and maps the x fifth data streams at a granularity of q bits to obtain s fourth data streams.

A data format received by the receive end device and a quantity of input lanes may be different from a data format output by the transmit end device and a quantity of output lanes. For example, the receive end device supports receiving of the s fourth data streams processed at the granularity of q bits. In other words, the data format of the receive end device is a format obtained through division at the granularity of q bits. When the quantity of input lanes is s, to match the data format and the input lanes of the receive end device, the transmit end device may map the z third data streams at the granularity of n bits to obtain the x fifth data streams, and then map the x fifth data streams at the granularity of q bits to obtain the s fourth data streams, so that the z third data streams are converted into the s fourth data streams, to match the data format and a quantity of lanes supported by the receive end device, where q≥2. The x fifth data streams at least have a same data attribute as the foregoing x second data streams. For example, both the x fifth data streams and the x second data streams are data transmitted at a PMA layer, and are transmitted over a PMA lane. Further, the x fifth data streams at least have same data content as the foregoing x second data streams. In this case, the x fifth data streams may be the x second data streams in step 202, and a mapping process of mapping the z third data streams at the granularity of n bits to obtain the x fifth data streams is opposite to the mapping process in step 202.

It should be noted that step 203 and step 204 may be performed by a same module of a same device, or may be performed by different modules of a same device. For example, when a chip of the transmit end device includes only a PHY chip, the PHY chip may perform step 203 and step 204 to obtain the s fourth data streams. When the chip of the transmit end device includes a PHY chip and a CDR chip, the PHY chip may perform step 203. Then, the PHY chip sends the z third data streams obtained in step 203 to the CDR chip, and the CDR chip performs step 204 to obtain the s fourth data streams.

Step 205: The transmit end device outputs the s fourth data streams over an output lane.

For an implementation of step 205, refer to the implementation of step 104 in the first optional implementation. Details are not described again in this embodiment of this application.

Step 206: The receive end device receives the s fourth data streams over an input lane.

In step 205, the transmit end device outputs the s fourth data streams over the output lane. Correspondingly, the receive end device corresponding to the transmit end device receives the s fourth data streams over the input lane.

For an implementation of step 206, refer to the implementation of step 105 in the first optional implementation. Details are not described again in this embodiment of this application.

Step 207: The receive end device maps the s fourth data streams at the granularity of q bits to obtain the x fifth data streams, and maps the x fifth data streams at the granularity of n bits to obtain the z third data streams.

Because the transmit end device performs step 204, correspondingly, the receive end device needs to convert the s fourth data streams into the z third data streams, that is, perform an inverse process of step 204. For an implementation of the inverse process, refer to the implementation of step 204. Details are not described again in this embodiment of this application.

Step 208: The receive end device maps the z third data streams at the granularity of n bits to obtain the x second data streams, where the z third data streams are obtained through mapping at the granularity of n bits.

It should be noted that step 207 and step 208 may be performed by a same module of a same device, or may be performed by different modules of a same device. For example, when a chip of the receive end device includes only a PHY chip, the PHY chip may perform step 207 and step 208 to obtain the x second data streams. When the chip of the receive end device includes a PHY chip and a CDR chip, the CDR chip may perform step 207. Then, the CDR chip sends the z third data streams obtained in step 207 to the PHY chip, and the PHY chip performs step 208 to obtain the x second data streams.

Step 209: The receive end device performs multiplexing processing on the x second data streams at a granularity of bits to obtain the y first data streams.

For implementations of step 201, step 202, and step 203, sequentially refer to the implementations of step 101, step 102, and step 103 in the first optional implementation. Details are not described again in this embodiment of this application. For implementations of step 206, step 208, and step 209, sequentially refer to the implementations of step 105, step 106, and step 107 in the first optional implementation. Details are not described again in this embodiment of this application.

In the data transmission method provided in the second optional implementation, the transmit end device maps the z third data streams at the granularity of n bits to obtain the x fifth data streams, maps the x fifth data streams at the granularity of q (q≥2) bits to obtain the s fourth data streams, and then outputs the s fourth data streams. Therefore, in a process of performing data transmission, the transmit end device and the receive end device use q bits as a unit symbol for transmission. Compared with a conventional manner in which data transmission is performed by using one bit as a unit symbol, if transmitted data carries burst error data, there are fewer error symbols, and a quantity of error symbols in a transmission process is reduced. This reduces spread of the burst error data, and improves reliability of data transmission. Further, the data format and the quantity of lanes that are supported by the receive end device may be matched, to implement compatibility with the receive end device.

Figure 11:
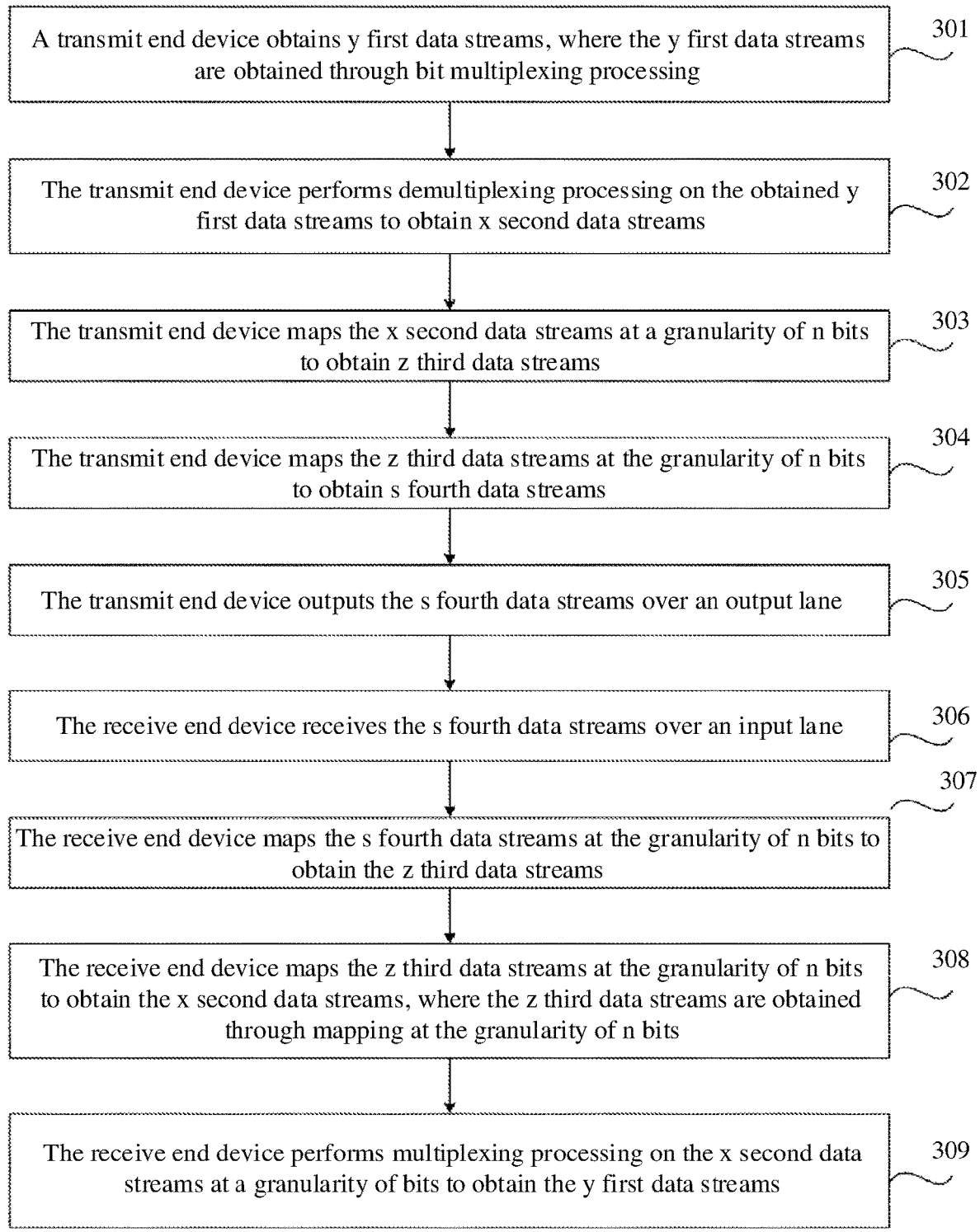
FIG. 11 is a flowchart of a data transmission method according to an embodiment of this application.

In a third optional implementation, referring to FIG. 11, FIG. 11 is a flowchart of a data transmission method according to an embodiment of this application. The data transmission method may be applied to the system shown in FIG. 6. As shown in FIG. 11, the method includes the following steps.

Step 301: A transmit end device obtains y first data streams, where the y first data streams are obtained through bit MUX processing.

Step 302: The transmit end device performs demultiplexing processing on the obtained y first data streams to obtain x second data streams.

Step 303: The transmit end device maps the x second data streams at a granularity of n bits to obtain z third data streams.

Step 304: The transmit end device maps the z third data streams at the granularity of n bits to obtain s fourth data streams.

A data format received by a receive end device and a quantity of input lanes may be different from a data format output by the transmit end device and a quantity of output lanes. For example, the receive end device supports receiving of the s fourth data streams processed at the granularity of n bits. In other words, the data format of the receive end device is a format obtained through division at the granularity of n bits. When the quantity of input lanes is s, to match the data format and the input lanes of the receive end device, the transmit end device may directly map the z third data streams to obtain the s fourth data streams, so that the z third data streams are converted into the s fourth data streams, to match the data format and a quantity of lanes supported by the receive end device, where n≥2. In this way, compared with the implementation of step 204 in the second optional implementation, a process in which the transmit end device converts the z third data streams into the s fourth data streams does not include a step of converting the z third data streams into the x fifth data streams, so that data processing is simplified, and processing overheads are reduced.

It should be noted that step 303 and step 304 may be performed by a same module of a same device, or may be performed by different modules of a same device. For example, when a chip of the transmit end device includes only a PHY chip, the PHY chip may perform step 303 and step 304 to obtain the s fourth data streams. When the chip of the transmit end device includes a PHY chip and a CDR chip, the PHY chip may perform step 303. Then, the PHY chip sends the z third data streams obtained in step 303 to the CDR chip, and the CDR chip performs step 304 to obtain the s fourth data streams.

Step 305: The transmit end device outputs the s fourth data streams over an output lane.

Step 306: The receive end device receives the s fourth data streams over an input lane.

Step 307: The receive end device maps the s fourth data streams at the granularity of n bits to obtain the z third data streams.

Because the transmit end device performs step 304, correspondingly, the receive end device needs to convert the s fourth data streams into the z third data streams, that is, perform an inverse process of step 304. For an implementation of the inverse process, refer to the implementation of step 304. Details are not described again in this embodiment of this application.

Step 308: The receive end device maps the z third data streams at the granularity of n bits to obtain the x second data streams, where the z third data streams are obtained through mapping at the granularity of n bits.

Step 309: The receive end device performs multiplexing processing on the x second data streams at a granularity of bits to obtain the y first data streams.

For implementations of step 301, step 302, step 303, step 305, step 306, step 308, and step 309, sequentially refer to the implementations of step 201, step 202, step 203, step 205, step 206, step 208, and step 209 in the second optional implementation. Details are not described again in this embodiment of this application.

In the data transmission method provided in the third optional implementation, the transmit end device maps the x second data streams at the granularity of n (n≥2) bits to obtain the z third data streams, and maps the z third data streams at the granularity of n bits to obtain the s fourth data streams. Therefore, in a process of performing data transmission, the transmit end device and the receive end device use n bits as a unit symbol for transmission. Compared with a conventional manner in which data transmission is performed by using one bit as a unit symbol, if transmitted data carries burst error data, there are fewer error symbols, and a quantity of error symbols in a transmission process is reduced. This reduces spread of the burst error data, and improves reliability of data transmission. Further, the data format and the quantity of lanes that are supported by the receive end device may be matched, to implement compatibility with the receive end device.

Figure 12:
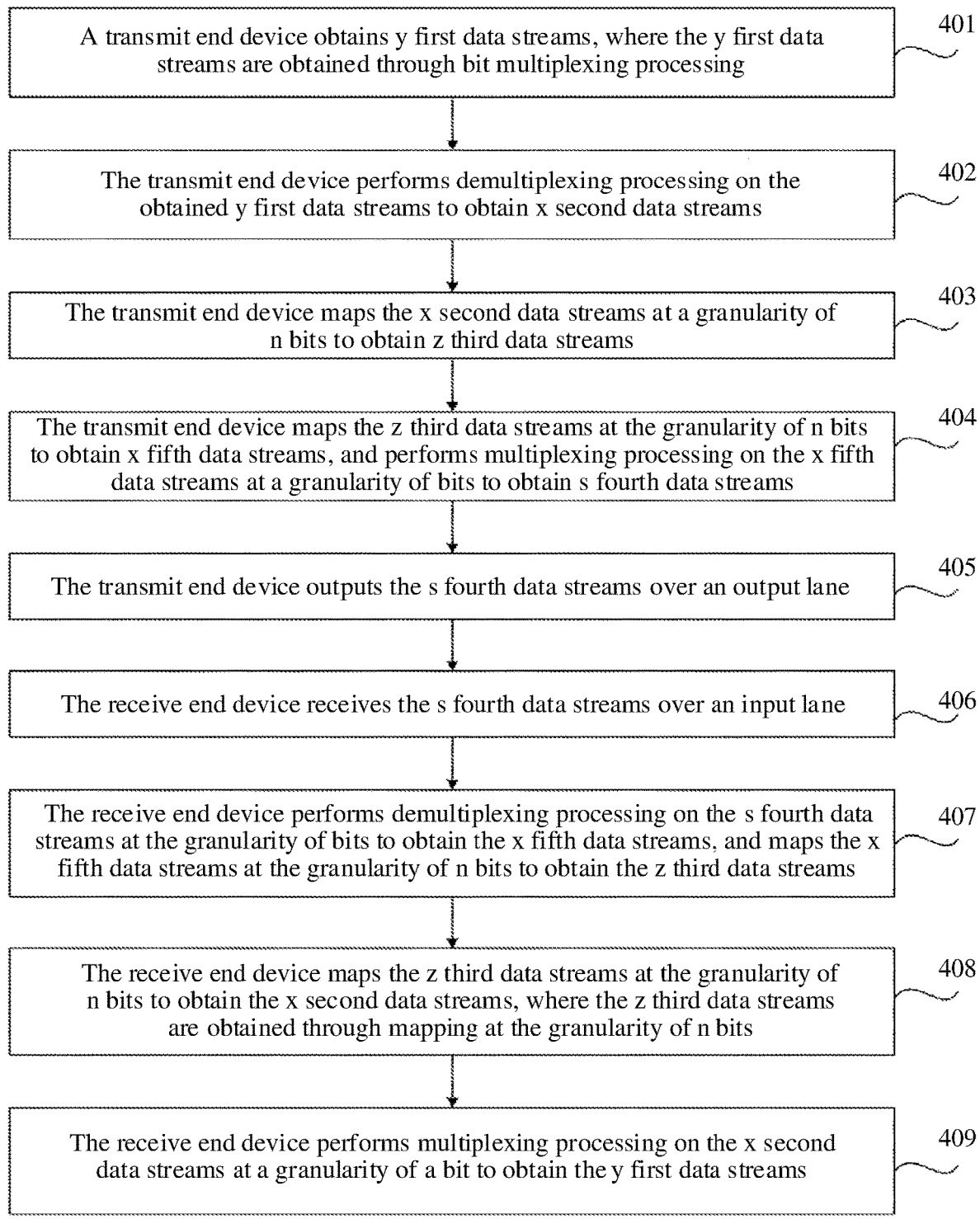
FIG. 12 is a flowchart of a data transmission method according to an embodiment of this application.

In a fourth optional implementation, referring to FIG. 12, FIG. 12 is a flowchart of a data transmission method according to an embodiment of this application. The data transmission method may be applied to the system shown in FIG. 6. As shown in FIG. 12, the method includes the following steps.

Step 401: A transmit end device obtains y first data streams, where the y first data streams are obtained through bit MUX processing.

Step 402: The transmit end device performs demultiplexing processing on the obtained y first data streams to obtain x second data streams.

Step 403: The transmit end device maps the x second data streams at a granularity of n bits to obtain z third data streams.

Step 404: The transmit end device maps the z third data streams at the granularity of n bits to obtain x fifth data streams, and performs multiplexing processing on the x fifth data streams at a granularity of bits to obtain s fourth data streams.

A data format received by a receive end device and a quantity of input lanes may be different from a data format output by the transmit end device and a quantity of output lanes. For example, the receive end device supports receiving of the s fourth data streams processed at the granularity of bits. In other words, the data format of the receive end device is a format obtained through division at the granularity of bits. When the quantity of input lanes is s, to match the data format and the input lanes of the receive end device, the transmit end device may map the z third data streams at the granularity of n bits to obtain the x fifth data streams, and then perform multiplexing processing on the x fifth data streams at the granularity of bits to obtain the s fourth data streams, so that the z third data streams are converted into the s fourth data streams, to match the data format and a quantity of lanes supported by the receive end device. q≥2. The x fifth data streams at least have a same data attribute as the foregoing x second data streams. For example, both the x fifth data streams and the x second data streams are data transmitted at a PMA layer, and are transmitted over a PMA lane. Further, the x fifth data streams at least have same data content as the foregoing x second data streams. In this case, the x fifth data streams may be the x second data streams in step 402, and a mapping process of mapping the z third data streams at the granularity of n bits to obtain the x fifth data streams is opposite to the mapping process in step 402.

Step 403 and step 404 may be performed by a same module of a same device, or may be performed by different modules of a same device. For example, when a chip of the transmit end device includes only a PHY chip, the PHY chip may perform step 403 and step 404 to obtain the s fourth data streams. When the transmit end device includes a PHY chip and a CDR chip, the PHY chip may perform step 403. Then, the PHY chip sends the z third data streams obtained in step 403 to the CDR chip, and the CDR chip performs step 404 to obtain the s fourth data streams.

Step 405: The transmit end device outputs the s fourth data streams over an output lane.

Step 406: The receive end device receives the s fourth data streams over an input lane.

Step 407: The receive end device performs demultiplexing processing on the s fourth data streams at the granularity of bits to obtain the x fifth data streams, and maps the x fifth data streams at the granularity of n bits to obtain the z third data streams.

Because the transmit end device performs step 404, correspondingly, the receive end device needs to convert the s fourth data streams into the z third data streams, that is, perform an inverse process of step 404. For an implementation process of the inverse process, refer to step 404. Details are not described again in this embodiment of this application.

Step 408: The receive end device maps the z third data streams at the granularity of n bits to obtain the x second data streams, where the z third data streams are obtained through mapping at the granularity of n bits.

Step 409: The receive end device performs multiplexing processing on the x second data streams at the granularity of bits to obtain the y first data streams.

For implementations of step 401, step 402, step 403, step 405, step 406, step 408, and step 409, sequentially refer to the implementations of step 201, step 202, step 203, step 205, step 206, step 208, and step 209 in the second optional implementation. Details are not described again in this embodiment of this application.

In the data transmission method provided in the fourth optional implementation, the transmit end device maps the x second data streams at the granularity of n (n≥2) bits to obtain the z third data streams, maps the z third data streams at the granularity of bits to obtain the s fourth data streams, and then outputs the s fourth data streams. Therefore, the data format and the quantity of lanes that are supported by the receive end device (for example, a receive end device following an existing standard) may be further matched, to implement compatibility with the receive end device.

It should be noted that the foregoing four optional implementations may be combined and adjusted based on an actual situation. For example, after steps 101 to 103 are performed, the transmit end device may choose, based on the determined data format and/or quantity of lanes that are supported by the receive end device, to perform step 104, 204, 304, or 404 and a corresponding subsequent process. In this way, the transmit end device may support a plurality of transmit modes, and each mode may correspond to one of the foregoing optional implementations. After determining the data format and/or the quantity of lanes that are supported by the receive end device, the transmit end device may adjust to a corresponding mode, to match the data format and/or the quantity of lanes that are supported by the receive end device, thereby improving flexibility of data transmission.

Figure 13:
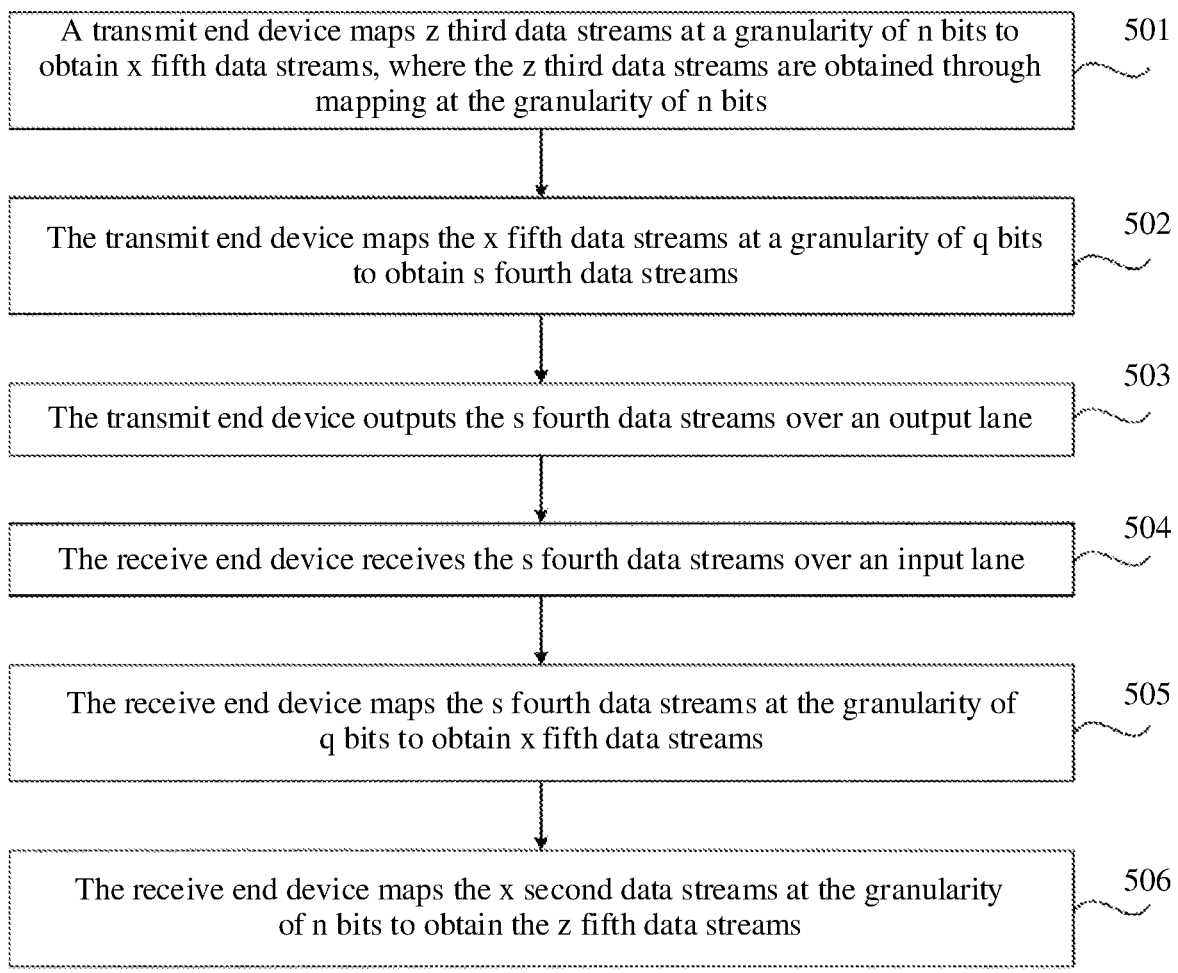
FIG. 13 is a flowchart of a data transmission method according to an embodiment of this application.

It should be noted that, in the foregoing four optional implementations, a new transmission lane (the transmission lane may be an entity lane or a virtual lane) is generated because to-be-transmitted data is output after mapping processing is performed on the to-be-transmitted data at the granularity of n bits. As a result, output lanes, a data format, and the like of the to-be-transmitted data may be different from the data format received by the receive end device and/or the quantity of input lanes. Therefore, in a data stream transmission process, to ensure that the data of the transmit end device can be effectively sent to the receive end device, corresponding improvements are also made to some other transmission devices. For example, the another transmission device may be a relay device of the foregoing transmit end device, which is a receive end device relative to the foregoing transmit end device and is a transmit device relative to the foregoing receive end device. Subsequent fifth and sixth optional implementations are described by assuming that the another transmission device is a transmit end device. In this case, embodiments of this application further provide the following two data transmission methods:

In a fifth optional implementation, it is assumed that to-be-received data supported by a receive end device is s fourth data streams processed at a granularity of q bits, where s is a positive integer, and q≥2. In other words, a data format of the receive end device is a format obtained through division at the granularity of q bits, and a quantity of input lanes is s. Referring to FIG. 13, FIG. 13 is a flowchart of a data transmission method according to an embodiment of this application. As shown in FIG. 13, the method includes the following steps.

Step 501: A transmit end device maps z third data streams at a granularity of n bits to obtain x fifth data streams, where the z third data streams are obtained through mapping at the granularity of n bits.

z, n, and x are all positive integers, and n≥2. The z third data streams may be generated by the transmit end device, or may be received data sent by another device. This is not limited in this embodiment of this application.

Step 502: The transmit end device maps the x fifth data streams at the granularity of q bits to obtain s fourth data streams.

Step 503: The transmit end device outputs the s fourth data streams over an output lane.

For implementations of step 501 and step 502, refer to the implementation of step 204 in the second optional implementation. For an implementation of step 503, refer to the implementation of step 205 in the second optional implementation. Details are not described again in this embodiment of this application.

Step 504: The receive end device receives the s fourth data streams over an input lane.

Step 505: The receive end device maps the s fourth data streams at the granularity of q bits to obtain x fifth data streams.

Step 506: The receive end device maps the x fifth data streams at the granularity of n bits to obtain the z third data streams.

s, q, x, n, and z are all positive integers, q≥2, and n≥2.

For implementations of step 501 and step 502, refer to the implementation of step 204 in the second optional implementation. For implementations of step 503 and step 504, refer to the implementations of step 205 and step 206 in the second optional implementation. For implementations of step 505 and step 506, refer to step 207 in the second optional implementation. Details are not described again in this embodiment of this application.

In the data transmission method provided in the fifth optional implementation, the transmit end device maps the z third data streams at the granularity of n bits to obtain the x fifth data streams. Therefore, the transmit end device can support data processing at the granularity of n bits. In addition, the transmit end device may map the x fifth data streams at the granularity of q bits to obtain the s fourth data streams, and then output the s fourth data streams, so that the data format and the quantity of lanes that are supported by the receive end device may be matched, to implement compatibility with the receive end device. It should be noted that, when n=q=10, a unit symbol for data transmission performed by the transmit end device and the receive end device is equivalent to one FEC symbol.

Figure 14:
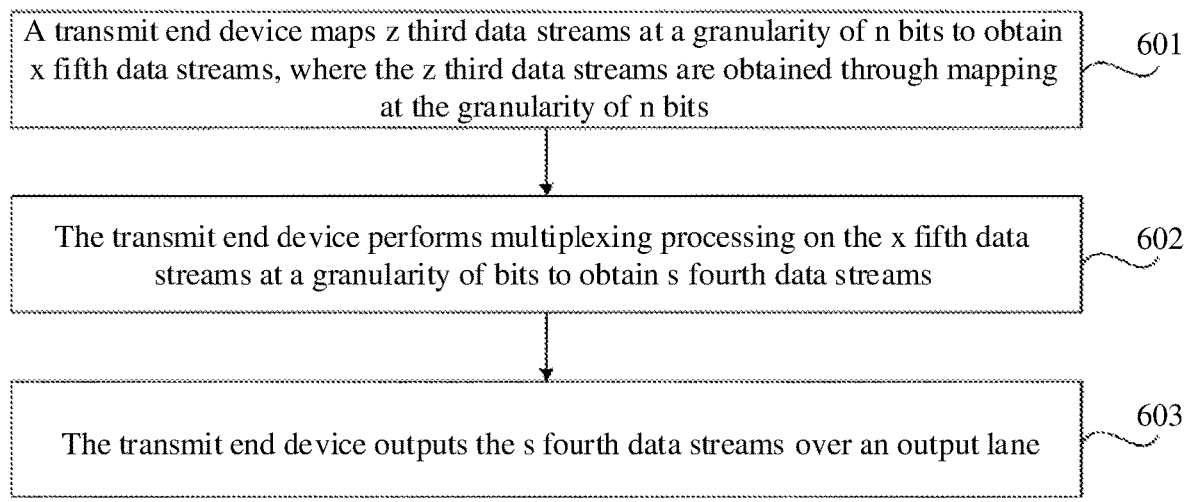
FIG. 14 is a flowchart of a data transmission method according to an embodiment of this application.

In a sixth optional implementation, it is assumed that to-be-received data supported by a receive end device is s fourth data streams processed at a granularity of bits, where s is a positive integer. In other words, a data format of the receive end device is a format obtained through division at the granularity of bits, and a quantity of input lanes is s. Referring to FIG. 14, FIG. 14 is a flowchart of a data transmission method according to an embodiment of this application. As shown in FIG. 14, the method includes the following steps.

Step 601: A transmit end device maps z third data streams at a granularity of n bits to obtain x fifth data streams, where the z third data streams are obtained through mapping at the granularity of n bits.

z and x and n are all positive integers, and n≥2. The z third data streams may be generated by the transmit end device, or may be received data sent by another device. This is not limited in this embodiment of this application. The z third data streams are obtained through mapping at the granularity of n bits, so that when burst error data exists in a previous data stream of the z third data streams, the z third data streams are prevented from further spreading the burst error data.

Step 602: The transmit end device performs multiplexing processing on the x fifth data streams at the granularity of bits to obtain s fourth data streams.

Step 603: The transmit end device outputs the s fourth data streams over an output lane.

For implementations of step 601 and step 602, refer to the implementation of step 404 in the fourth optional implementation. For an implementation of step 603, refer to the implementation of step 405 in the fourth optional implementation. Details are not described again in this embodiment of this application.

It should be noted that, for an action performed by the receive end device, refer to an action performed by a conventional receive end device.

In the data transmission method provided in the sixth optional implementation, the transmit end device maps the z third data streams at the granularity of n bits to obtain the x fifth data streams. Therefore, the transmit end device can support data processing at the granularity of n bits. In addition, the transmit end device may map the x fifth data streams at the granularity of bits to obtain the s fourth data streams, and then output the s fourth data streams, so that the data format and the quantity of lanes that are supported by the receive end device may be matched, to implement compatibility with the receive end device.

The x fifth data streams in step 501 and step 601 at least have a same data attribute as the foregoing x second data streams. For example, both the x fifth data streams and the x second data streams are data transmitted at a PMA layer, and are transmitted over a PMA lane or an FEC lane. Further, the x fifth data streams at least have same data content as the foregoing x second data streams. In this case, the x fifth data streams may be the x second data streams in step 202.

It should be noted that, in the foregoing six optional implementations, n and/or q may be a quantity of bits included in one FEC symbol, and values of n and q may be determined based on a current coding scheme of FEC encoding performed on data by the transmit end device or the receive end device. For example, it is assumed that the coding scheme of FEC encoding performed on the data by the transmit end device is RS(544, 514). In this case, n=10. In this way, in the foregoing optional implementations, when n=10, the foregoing data transmission methods may be compatible with an application scenario of IEEE 802.3ck.

It should be noted that, in the foregoing plurality of optional implementations, other processing may be further performed on each of the data streams in a transmission process.

For example, because the transmit end device may be located in different application scenarios, a to-be-transmitted data stream of the transmit end device may pass through a complex transmission environment, resulting in burst error data in the to-be-transmitted data stream. Therefore, the transmit end device may perform error correction processing on the to-be-transmitted data stream in a transmission process of the to-be-transmitted data stream, to reduce the burst error data. For example, the error correction processing may be FEC codeword error correction processing, which is also referred to as RS error correction (Reed-Solomon error correction) or FEC recovery.

It should be noted that when the to-be-transmitted data stream is a data stream generated by the transmit end device, the to-be-transmitted data stream is transmitted between layers in the transmit end device (for example, transmitted between different layers of modules; if the transmit end device includes a PHY chip, a CDR chip, and an optical module, the transmitted data stream is transmitted between the PHY chip, the CDR chip, and the optical module), and burst error data may be generated. Therefore, the transmit end device needs to perform error correction processing on the to-be-transmitted data stream. For example, when the transmit end device includes a PHY chip and an optical module (a CDR chip is integrated to the optical module), to-be-transmitted data in the PHY chip needs to be transmitted to the optical module through an AUI interface, and is output by the optical module. However, in a process of transmitting the to-be-transmitted data to the optical module through the AUI interface, a relatively large quantity of burst errors may occur. Therefore, when receiving the to-be-transmitted data transmitted by the PHY chip, the optical module needs to perform FEC codeword error correction processing on the to-be-transmitted data, to correct burst error data that exists in the to-be-transmitted data and that is introduced from the AUI interface, thereby ensuring accuracy of the to-be-transmitted data. It should be noted that the error correction processing is usually performed by the CDR chip in the optical module. In this case, in an application scenario with a CDR chip (a CDR scenario for short), the data transmission method is used to support FEC codeword error correction processing (that is, support an FEC algorithm), to implement FEC relaying in an Ethernet transmission process in the CDR scenario.

However, in actual application, when a chip of the transmit end device includes only the PHY chip, burst error data is usually not generated when the to-be-transmitted data stream is transmitted between layers of one module of the transmit end device. Therefore, a probability of generating the burst error data is relatively small. In this case, the transmit end device may not perform error correction processing. Therefore, the error correction processing is an optional step.

When the to-be-transmitted data stream is a data stream that needs to be relayed by various modules in the transmit end device (to be specific, the to-be-transmitted data stream is a data stream transmitted across modules) or the transmit end device is a relay device (to be specific, the to-be-transmitted data stream is a data stream transmitted across devices), a relatively large quantity of burst errors may be generated when the data stream is transmitted across modules or across devices. Therefore, the transmit end device needs to perform error correction processing on the received data stream, to ensure accuracy of the transmitted data. For example, when the transmit end device receives, by using the optical module, a to-be-transmitted data stream sent by a PHY chip of another device, the to-be-transmitted data stream passes through a PMD layer when being output by the PHY chip; and at the PMD layer, burst error data is prone to be introduced into the data stream. Therefore, error correction processing needs to be performed on the received to-be-transmitted data stream, to correct the burst error data caused by the PMD layer. For example, when the transmit end device sends a to-be-transmitted data stream to another device by using the optical module, the to-be-transmitted data stream passes through an AUI interface when being output by the PHY chip; and at the AUI interface, burst error data is prone to be introduced into the data stream. Therefore, the optical module needs to perform error correction processing on the to-be-transmitted data stream received from the PHY chip, to correct the burst error data introduced from the AUI interface. In this way, an FEC codeword error correction function is added to the PHY chip and the CDR chip; and in the FEC codeword error correction processing, the burst error data can be recorded when being corrected. Therefore, when the PHY chip transmits the to-be-transmitted data to the optical module (that is, chip-to-module (C2M)), or the PHY chip transmits the to-be-transmitted data to a PHY chip (that is, chip-to-chip (C2C)), the burst error data can be monitored and located through the FEC codeword error correction processing.

In this embodiment of this application, it is assumed that after the x second data streams are obtained, FEC codeword error correction processing is performed on the x second data streams. That is, in this embodiment of this application, FEC codeword error correction processing may be performed before step 103, step 203, step 303, and step 403. Each of the x second data streams may include some or all data of one FEC codeword. It should be noted that, after the x fifth data streams are obtained (that is, after step 501 or step 601), FEC codeword error correction processing may also be performed on the x fifth data streams. For the error correction process, refer to the error correction process of the x second data streams. When the transmit end device performs FEC codeword error correction processing on the x second data streams, FEC codeword error correction processing is performed on data belonging to a same codeword at a time. Therefore, when the x second data streams include one FEC codeword and when the x second data streams include a plurality of FEC codewords, processes in which the transmit end device performs FEC codeword error correction processing on the x second data streams are different. In this embodiment of this application, the following three cases are used as examples for description:

In a first case, the x second data streams include data of only one FEC codeword.

In this case, the transmit end device may directly perform FEC codeword error correction processing on the data of the x second data streams to obtain x error-corrected second data streams. The FEC codeword error correction processing process includes: The transmit end device performs error correction processing on data of each codeword in the x second data streams by FEC codewords, to obtain the x error-corrected second data streams. For example, in 100GE, one second data stream includes data of one codeword, and error correction processing may be performed on the second data streams by FEC codewords.

In a second case, each of the x second data streams includes data of a plurality of FEC codewords.

When each of the x second data streams includes data of a plurality of FEC codewords, the x second data streams are generally obtained by performing one type of the foregoing data processing on the codewords. Therefore, when FEC codeword error correction processing is performed on the x second data streams, inverse processing of the foregoing type of data processing needs to be performed on the x second data streams that include a plurality of FEC codewords, to separate the data of the second data streams that belongs to different codewords.

The foregoing type of data processing may be mapping processing performed at a granularity of FEC symbols. For example, the mapping processing may be codeword interleaving processing. For example, it is assumed that data content of one codeword is S11, S12, and S13, and data content of another codeword is S21, S22, and S23. S11, S12, S13, S21, S22, and S23 each represent data content of at least one FEC symbol. In this case, data of one second data stream obtained by performing codeword interleaving processing on the data of two codewords includes S11, S21, S12, S22, S13, and S23. In this case, a process of performing error correction processing on the FEC codeword generally includes the following steps.

Step A1: Perform demapping processing on x second data streams at a granularity of FEC symbols to obtain data expressed in FEC codewords.

The demapping processing is inverse processing of the mapping processing. For example, when the mapping processing is codeword interleaving processing, the demapping processing is codeword deinterleaving processing.

Still using the first example as an example, codeword deinterleaving processing is performed on the data of the second data streams, and obtained data expressed in FEC codewords is S11, S12, S13, S21, S22, and S23, where S11, S12, and S13 form one codeword, and S21, S22, and S23 form one codeword.

Step A2: Perform FEC codeword error correction processing on the data expressed in FEC codewords, to obtain error-corrected data.

The transmit end device performs FEC codeword error correction processing on the data expressed in FEC codewords, to obtain error-corrected data of a plurality of FEC codewords. The FEC codeword error correction processing is the same as the FEC codeword error correction processing in the first case. Details are not described again in this embodiment of this application.

Step A3: Perform mapping processing on the error-corrected data at the granularity of FEC symbols to obtain x error-corrected second data streams.

After the mapping processing is performed on the error-corrected data at the granularity of FEC symbols, a format of the obtained x error-corrected second data streams is the same as a format in step A1, thereby ensuring that the data format of the x second data streams does not change before and after the FEC codeword error correction processing is performed on the x second data streams. Still using the first example, codeword interleaving processing is performed on the error-corrected data S11, S12, S13, S21, S22, and S23, and an obtained second data stream is S11, S21, S12, S22, S13, and S23.

It should be noted that in the examples in steps A1 to A3, that each FEC codeword used for performing codeword interleaving processing on the x second data streams is divided into three parts of data is merely an example used for description. During actual implementation, each FEC codeword may alternatively be divided into a plurality of pieces of data. For example, in an RS(544, 514) scenario, each FEC codeword may be divided into 544 parts of data, and each part of data is one FEC symbol.

In actual application of this embodiment of this application, the transmit end device may alternatively perform another process based on different application scenarios. For example, the transmit end device may perform only steps A1 and A3 when each of the x second data streams includes a plurality of FEC codewords. In an optional example, in step A3, mapping processing is performed on the error-corrected data at the granularity of FEC symbols, and interleaving processing is not performed. In this way, when correctness of data transmission is ensured, a data processing process can be reduced, and a codeword interleaving process can be removed, so that a data processing speed is increased, and processing overheads are reduced.

For another example, the transmit end device may alternatively not perform FEC codeword error correction processing. In this way, a data processing process can be reduced in a specific case, so that a data processing speed is increased, and processing overheads are reduced.

In a third case, the x second data streams include data of a plurality of codewords, and each of the second data streams includes data of only one FEC codeword.

When the x second data streams include data of a plurality of FEC codewords, the x second data streams may include data of different codewords, and each of the second data streams includes data of only one FEC codeword. Still using the first example in the second case as an example, data of one second data stream includes S11, S12, and S13. In this case, the transmit end device only needs to perform step A2 to complete FEC codeword error correction processing on the x second data streams.

Correspondingly, because a data stream received by the receive end device is usually from the transmit end device, a relatively large quantity of errors may be generated when the data stream is transmitted across devices or across modules. Therefore, the receive end device may also perform error correction processing on the received data stream, to ensure accuracy of subsequent data. In this case, before step 107, step 209, step 309, and step 409, the receive end device may perform FEC codeword error correction processing on the x second data streams, and a principle of the FEC codeword error correction processing is the same as the foregoing principle. FEC codeword error correction processing is performed on data belonging to a same codeword at a time. Therefore, when the x second data streams include one FEC codeword and when the x second data streams include a plurality of FEC codewords, processes of performing FEC codeword error correction processing by the receive end device on the x second data streams are different. Principles for processing the x fifth data streams are the same, and details are not described again in this embodiment of this application.

In this case, a process in which the receive end device performs FEC codeword error correction processing on the x second data streams includes: When the x second data streams include data of only one FEC codeword, the receive end device may directly perform FEC codeword error correction processing on the x second data streams to obtain x error-corrected second data streams. When each of the x second data streams includes data of a plurality of FEC codewords, the receive end device may first perform demapping processing on the x second data streams at a granularity of FEC symbols to obtain data expressed in FEC codewords, then perform FEC codeword error correction processing on the data expressed in FEC codewords, to obtain an error-corrected data stream, and then perform mapping processing on the error-corrected data at the granularity of FEC symbols to obtain x error-corrected second data streams. When the x second data streams include data of a plurality of FEC codewords, and each of the second data streams includes data of only one FEC codeword, the receive end device may also directly perform FEC codeword error correction processing on the x second data streams to obtain x error-corrected second data streams. In this way, the receive end device performs FEC codeword error correction processing on the x second data streams, thereby ensuring data accuracy in subsequent processing.

When the x second data streams include one FEC codeword and when the x second data streams include a plurality of FEC codewords, processes in which the receive end device performs FEC codeword error correction processing are the same as the processes in which the transmit end device performs FEC codeword error correction processing on the x second data streams. For an implementation of FEC codeword correction processing performed by the receive end device, refer to the implementation of FEC codeword correction processing performed by the transmit end device. Details are not described again in this embodiment of this application.

Further, the x second data streams obtained in steps such as step 102, step 202, step 302, and step 402 may have a data arrangement problem, for example, a case in which data storage misalignment, data stream disorder, and data stream skew exist. Therefore, after step 102, step 202, step 302, and step 402, the transmit end device may perform preprocessing on the x second data streams, to ensure data validity in a subsequent processing process. The preprocessing may be at least one of the following processing manners: alignment (also referred to as alignment locking, alignment lock), deskew, and lane reordering (lane reorder).

For example, in a process of obtaining the x second data streams through demultiplexing in step 102, step 202, step 302, and step 402, a data storage misalignment case may occur in data in the x second data streams. A process error may be caused when the process loads (also referred to as reading) and processes unaligned data. Therefore, the transmit end device performs data alignment locking on the x second data streams, to ensure that the data can be smoothly loaded and transmitted. During actual implementation, the x second data streams may be aligned at the granularity of FEC symbols. It should be noted that a length of one FEC symbol is a fixed value. For example, in an application scenario of the IEEE 802.3ck standard, a length of the FEC symbol is 10 bits.

It should be noted that the y first data streams are obtained through bit MUX processing, and in a bit MUX processing process, data stream disorder and skew may be introduced. The x second data streams obtained by mapping the y first data streams may also have data stream disorder and skew. Therefore, the transmit end device may also perform data deskew and lane reordering on the x second data streams, to obtain correct data of the x second data streams. For example, the alignment, the deskew, and the lane reordering may be performed on data at the granularity of n bits.

Correspondingly, a data stream received by the receive end device may pass through a complex transmission environment, resulting in errors such as misaligned data stream transmission, data stream disorder, and data skew in the data stream. Therefore, after step 105, step 206, step 306, and step 406, the receive end device may perform preprocessing on the received data stream, to ensure data validity in a subsequent processing process. An implementation process of the preprocessing is the same as the implementation process of the preprocessing performed by the transmit end device on the x second data streams. Details are not described again in this embodiment of this application. After step 105, data received by the receive end device is the y first data streams. In this case, the receive end device performs preprocessing on the y first data streams. After step 206, step 306, and step 406, data received by the receive end device is the s fourth data streams. In this case, the receive end device performs preprocessing on the s fourth data streams.

It should be noted that, in another data transmission process, a data arrangement problem of a data stream may also exist. The transmit end device and the receive end device may still perform the foregoing preprocessing process on an obtained data stream. For the preprocessing process, refer to the foregoing preprocessing process of the x second data streams. For example, in step 106, because data in the z third data streams is transmitted to the receive end device across devices, a case of data storage misalignment, data stream disorder, and data stream skew may exist in the data in the z third data streams. Therefore, before step 106 is performed, alignment processing, deskew processing, and/or lane reordering processing may be first performed on the z third data streams, to obtain correct z third data streams, thereby ensuring data validity in subsequent processing.

Further, in a data transmission process, the transmit end device may choose, based on an actual requirement, whether to perform re-encoding processing on the data of the x second data streams, to meet more requirements. Therefore, before step 103, step 203, step 303, and step 403, the transmit end device may re-encode the data of the x second data streams. The transmit end device may re-encode the data of the x second data streams in a plurality of manners, and the following two manners are used as examples for description in this embodiment of this application.

In a first optional manner, the transmit end device performs inner FEC encoding (inner FEC encode) on the x second data streams to obtain x encoded second data streams.

As described in step 101, step 201, step 301, and step 401, first FEC encoding generally has been performed on the x second data streams, and FEC encoding actually has been performed twice on the x encoded second data streams obtained after the transmit end device performs inner FEC encoding on the x second data streams. The first FEC encoding may be referred to as outer FEC encoding relative to the inner FEC encoding. The two times of encoding may be referred to as concatenated encoding, and the x second data streams obtained after the encoding may be referred to as concatenated encoded data. The inner FEC encoding enables the encoded data to carry check bits of a specific length, and the concatenated encoding is re-encoding performed at a granularity of codewords.

For example, as described above, the first FEC encoding is RS(544, 514). In this case, concatenated code generated after the transmit end device performs inner FEC encoding on the x second data streams may be referred to as FEC code concatenated with RS(544, 514).

Because the transmit end device performs concatenated encoding on the x second data streams, an Ethernet interface of the transmit end device supports extension of a concatenated FEC encoding algorithm (also referred to as concatenated encoding) that is based on outer encoding RS(544, 514) in a data transmission process. Therefore, the data transmission method can be adapted to more application scenarios, thereby improving universality of the data transmission method. Further, because the x second data streams are encoded for a plurality of times, a data protection level is increased, and reliability of data transmission is further ensured.

An FEC scheme of the inner FEC encoding may be one of the following FEC schemes: a Reed-Solomon (RS) code, a Bose-Chaudhuri-Hocquenghem (BCH) code, a Hamming code, a low-density parity-check (LDPC) code, a polar code, or a convolutional code.

In a second optional manner, the transmit end device performs second FEC encoding on the x second data streams to obtain x encoded second data streams. A coding scheme of the second FEC encoding is different from a coding scheme of the first FEC encoding mentioned in step 101. A codeword of the second FEC encoding may be one of the following codewords: an RS code, a BCH code, a Hamming code, an LDPC code, a polar code, or a convolutional code.

Optionally, the second FEC encoding may be enhanced FEC encoding ( ), and the enhanced FEC encoding refers to a coding scheme in which a data protection level is higher than a data protection level of the first FEC encoding. In this way, an Ethernet interface of the transmit end device can support extension of enhanced FEC encoding in a data transmission process, and the transmit end device performs second FEC encoding on the x second data streams, so that a data protection level can be increased, and reliability of data transmission can be further ensured.

A process in which the transmit end device performs second FEC encoding on the x second data streams to obtain the x encoded second data streams may include the following steps.

Step B1: Remove a check bit of each of the x second data streams.

Step B2: Perform second FEC encoding on the x second data streams from which check bits are removed, to obtain the x encoded second data streams.

The transmit end device performs second FEC encoding on the x second data streams from which the check bits are removed. In other words, the transmit end device performs second FEC encoding on pure data (or data in which no check bit exists) in the x second data streams.

In this way, different types of FEC encoding are performed on the x second data streams, so that the data transmission method can be adapted to more application scenarios, thereby improving universality of the data transmission method. In addition, data protection types are further increased, and reliability of data transmission is further ensured.

It should be noted that, when the transmit end device re-encodes the x second data streams before step 103, step 203, step 303, and step 403, correspondingly, the receive end device needs to perform decoding processing on the re-encoded data when receiving the re-encoded data. Therefore, before step 107, step 209, step 309, and step 409, the receive end device may perform decoding processing for the re-encoding. Because there is a plurality of manners in which the transmit end device re-encodes the data, correspondingly, the receive end device performs, based on a manner in which the transmit end device re-encodes the data, corresponding decoding processing for the re-encoding on the x second data streams received by the receive end device. The decoding processing for the re-encoding may include the following steps.

In a first optional manner, when the transmit end device performs inner FEC encoding on the data, correspondingly, the receive end device performs inner FEC decoding (inner FEC decode) on the data. A process of the inner FEC decoding may include the followings.

Step C1: The receive end device performs inner FEC decoding on the x second data streams to obtain x decoded second data streams.

A scheme of the inner FEC decoding corresponds to a scheme in which the transmit end device performs inner FEC encoding on the data. Therefore, an implementation process of the inner FEC decoding may be an inverse process of the implementation process in which the transmit end device performs inner FEC encoding on the data.

Step C2: The receive end device removes check bits included in the x decoded second data streams, to obtain x second data streams from which the check bits are removed. The check bits are added when the transmit end device performs inner FEC encoding on the x second data streams.

The receive end device removes the check bits included in the x decoded second data streams, to obtain the x second data streams from which the check bits are removed, so that the x second data streams are restored to a state before the transmit end device encodes the x second data streams. A process of inner FEC decoding is also a process of performing FEC codeword error correction processing on the x second data streams. Therefore, the receive end device simultaneously performs FEC codeword error correction processing on the x second data streams, thereby ensuring data accuracy in subsequent processing.

It should be noted that an FEC scheme of the inner FEC decoding is the same as the FEC scheme of the inner FEC encoding performed by the transmit end device on the data. For example, the FEC scheme of the inner FEC encoding may also be one of the following FEC schemes: an RS code, a BCH code, a Hamming code, an LDPC code, a polar code, or a convolutional code.

In a second optional manner, when the transmit end device performs second FEC encoding on the data, correspondingly, the receive end device performs second FEC decoding (FEC decode) on the data.

Optionally, to increase a data protection level, the second FEC encoding performed by the transmit end device on the data is usually enhanced FEC encoding. Therefore, correspondingly, the second FEC decoding performed by the receive end device on the data is usually enhanced FEC decoding.

Corresponding to the process of the second FEC encoding, a process of the second FEC decoding may include the following steps.

Step D1: The receive end device performs second FEC decoding on the x second data streams to obtain x decoded second data streams.

A scheme of the second FEC decoding corresponds to a scheme in which the transmit end device performs second FEC encoding on the data. Therefore, an implementation process of the second FEC decoding may be an inverse process of the implementation process in which the receive end device performs second FEC encoding on the data.

Step D2: The receive end device performs first FEC encoding on the x decoded second data streams to obtain x encoded second data streams. A coding scheme corresponding to the second FEC decoding is different from a coding scheme of the first FEC encoding.

The receive end device performs the first FEC encoding on the x decoded second data streams to obtain the x encoded second data streams, to ensure that the x encoded second data streams are the same as the data that is before the transmit end device performs the second FEC encoding on the x second data streams. In addition, a process of second FEC decoding is also a process of performing FEC codeword error correction processing on the x second data streams. Therefore, the receive end device simultaneously performs FEC codeword error correction processing on the x second data streams, thereby ensuring data accuracy in subsequent processing. Further, when the second FEC encoding is enhanced FEC encoding, after the receive end device performs enhanced FEC decoding on the x second data streams, because a correction capability of enhanced FEC decoding is relatively high, it may be usually considered that the x second data streams on which enhanced FEC decoding has been performed do not have error data (for example, burst error data generated during transmission at a PMD layer). The receive end device may not perform the FEC codeword error correction processing, thereby reducing data processing steps and reducing processing overheads.

It should be noted that an FEC scheme of the second FEC decoding is the same as the FEC scheme of the second FEC encoding performed by the transmit end device on the data. For example, the FEC scheme of the second FEC encoding may also be one of the following FEC schemes: an RS code, a BCH code, a Hamming code, an LDPC code, a polar code, or a convolutional code.

It should be further noted that the transmit end device generally performs re-encoding on the data of the x second data streams before step 103, step 203, step 303, and step 403 and after the transmit end device performs FEC codeword error correction processing on the x second data streams. In this way, accuracy of the re-encoded data can be effectively ensured. Correspondingly, the receive end device generally performs decoding processing for the re-encoding on the data of the x second data streams before the receive end device performs FEC codeword error correction processing on the x second data streams. Therefore, the receive end device usually performs FEC codeword error correction processing on x second data streams that are obtained after the decoding processing for the re-encoding.

Further, in actual application, an output lane of the transmit end device may be damaged. Once the damaged output lane is used to send data, transmitted data may be lost. Therefore, to ensure effective data transmission, the transmit end device may determine the quantity z of third data streams before step 103 or determine the quantity s of fourth data streams before step 204, step 304, step 404, step 502, and step 602, and output the data streams over output lanes that one-to-one correspond to the data streams. In this way, it can be ensured that a quantity of output data streams is equal to a quantity of output lanes that actually performs output, so that the actually output data streams one-to-one correspond to the output lanes.

In an example, the quantity of output data streams is less than or equal to a quantity of available output lanes. For example, it is assumed that a current quantity of output lanes of the transmit end device is 10, and two output lanes are damaged. In this case, the transmit end device may determine that a quantity of currently available output lanes is 8, and further determine that the quantity z of third data streams is less than or equal to 8 or determine that the quantity s of fourth data streams is less than or equal to 8. In this way, a manner of flexibly determining the quantity of output lanes ensures integrity of output data, and improves efficiency of data transmission.

In another example, the quantity of data streams is equal to a preset quantity of output lanes. To be specific, a quantity of output lanes used by the transmit end device to output data streams is preset before a sending action, and the quantity is a fixed value. In this case, the transmit end device may directly determine the preset quantity of output lanes as the quantity of third data streams or the quantity of fourth data streams. In this way, coding difficulty in actual implementation of a data transmission method can be reduced, a data processing process can be simplified, and processing overheads can be reduced.

Further, in step 103, step 203, step 303, and step 403, there may be a plurality of implementations for a mapping process in which the transmit end device maps the x second data streams at the granularity of n bits to obtain the z third data streams. Correspondingly, in step 106, step 208, step 308, and step 408, there is also a plurality of implementations for a mapping process in which the receive end device maps the z third data streams at the granularity of n bits to obtain the x second data streams. The following several cases are described in this embodiment of this application:

In a first case, when the quantity z of third data streams is equal to 1, and the x second data streams include data of only one FEC codeword, a mapping process of the transmit end device includes the following steps.

Step E1: The transmit end device performs round robin on all of the x second data streams.

Round robin refers to sequential access (also referred to as inquiry). That the transmit end device performs round robin on all of the x second data streams means that the transmit end device periodically initiates access to sequentially access each of the second data streams, and the access process is periodically performed. In this embodiment of this application, one second data stream is accessed each time, and data of n consecutive bits in the second data stream is obtained.

Step E2: The transmit end device sequentially maps data of n consecutive bits obtained from each of the second data streams through round robin, to obtain one third data stream.

In this embodiment of this application, a process in which the transmit end device performs round robin on the x second data streams at a time is referred to as a round robin process or a round robin cycle. That is, x pieces of n-bit data can be obtained in one round robin cycle. In the first case, in one round robin cycle, there may be a plurality of round robin orders in which the transmit end device performs round robin on the x second data streams. The round robin order is an order in which the transmit end device performs round robin on the x second data streams. The round robin order may be a preset order, or may be an order determined by the transmit end device based on an actual situation or a specified rule. For example, the round robin order may be any one of the following:

- an ascending order of sequence numbers of the second data streams; or a descending order of sequence numbers of the second data streams; or an order of a second data stream with an even sequence number and then a second data stream with an odd sequence number; or an order of f1 second data streams with even sequence numbers, f2 second data streams with odd sequence numbers, f3 second data streams with even sequence numbers, and then f4 second data streams with odd sequence numbers, where f1+f2+f3+f4=x, generally, f1=f3, and f2=f4, for example, f1, f2, f3, and f4 are all equal; or an order of g1 second data streams with even sequence numbers, g2 second data streams with odd sequence numbers, g3 second data streams with odd sequence numbers, and then g4 second data streams with even sequence numbers, where g1+g2+g3+g4=x, generally, g1=g4, and g2=g3, for example, g1, g2, g3, and g4 are all equal; or an order of a second data stream with an odd sequence number and then a second data stream with an even sequence number, where odd and even sequence numbers are interleaved one by one, for example, if sequence numbers of four second data streams are 0, 1, 2, and 3, a round robin order is an order of the second data streams with sequence numbers 1, 0, 3, and 2; or another specified order. This is not limited in this application.

It should be noted that, in this embodiment of this application, a sequence number of a data stream may be an independent identifier configured for the data stream, or may be represented by using a transmission lane number of the data stream, or may be represented by using an AM carried in the data stream. In addition, round robin orders used for every two adjacent round robin cycles are the same (that is, round robin orders used for any two times of round robin performed on the x second data streams are the same). That is, the same round robin order is used.

Correspondingly, a mapping process of the receive end device includes: The receive end device sequentially maps data of n consecutive bits in one third data stream to obtain the x second data streams. In other words, a granularity of each time of mapping is n bits.

In this embodiment of this application, a process in which the receive end device maps x different second data streams at a time is referred to as a mapping process or a mapping cycle. That is, x pieces of n-bit data can be obtained from the z third data streams in one mapping cycle. In the first case, an order in which the receive end device performs data mapping is usually the same as the foregoing round robin order. The mapping order is an order in which the receive end device maps the x pieces of obtained n-bit data to the x second data streams. The mapping order may be any one of the following:

- an ascending order of sequence numbers of the second data streams; or a descending order of sequence numbers of the second data streams; or an order of a second data stream with an even sequence number and then a second data stream with an odd sequence number; or an order of f1 second data streams with even sequence numbers, f2 second data streams with odd sequence numbers, f3 second data streams with even sequence numbers, and then f4 second data streams with odd sequence numbers, where f1+f2+f3+f4=x, generally, f1-f3, and f2=f4, for example, f1, f2, f3, and f4 are all equal; or an order of g1 second data streams with even sequence numbers, g2 second data streams with odd sequence numbers, g3 second data streams with odd sequence numbers, and then g4 second data streams with even sequence numbers, where g1+g2+g3+g4=x, generally, g1=g4, and g2-g3, for example, g1, g2, g3, and g4 are all equal; or an order of a second data stream with an odd sequence number and then a second data stream with an even sequence number, where odd and even sequence numbers are interleaved one by one, for example, if sequence numbers of four second data streams are 0, 1, 2, and 3, a mapping order is an order of the second data streams with sequence numbers 1, 0, 3, and 2; or another specified order. This is not limited in this application.

It should be noted that, during actual implementation of this embodiment of this application, the third data stream may have a data arrangement problem. Before the receive end device sequentially maps one third data stream at the granularity of n bits to obtain the x second data streams, the receive end device may need to perform preprocessing on the third data stream, to ensure data validity in a subsequent processing process. The preprocessing may be at least one of the following processing manners: alignment, deskew, and lane reordering processing. A third data stream obtained through preprocessing may be different from the previous third data stream in terms of data arrangement, and a mapping order in which the receive end device performs data mapping is also no longer the same as the foregoing round robin order. This is not limited in this embodiment of this application, provided that the receive end device obtains second data streams of a required format and a required quantity after mapping.

Figure 15:
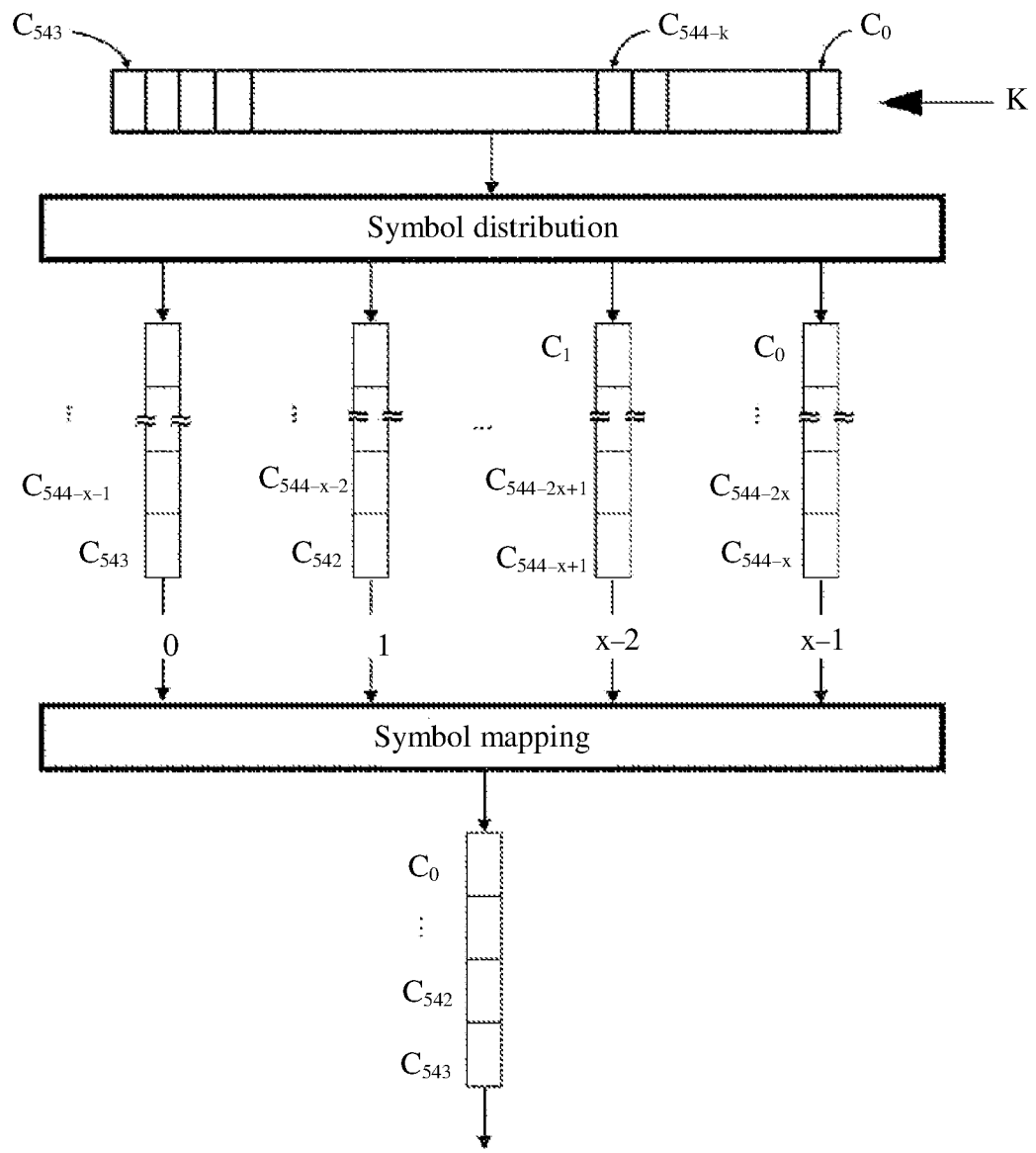
FIG. 15 to FIG. 20 are schematic diagrams of several mapping processes according to an embodiment of this application.

For example, as shown in FIG. 15, it is assumed that n=10, and mapping processes of the transmit end device and the receive end device are described by using an example in which x second data streams include data of only one FEC codeword K (to be specific, data of only one FEC codeword is distributed to the x second data streams at a granularity of 10 bits (an FEC symbol), and this process is referred to as symbol distribution (symbol distribution)). It is assumed that the one FEC codeword includes data of 544 FEC symbols, identifiers of the data of the 544 FEC symbols are $C_0$ to $C_{543}$, and sequence numbers of the x second data streams are 0 to x−1. In this case, one second data stream includes data of 544/x FEC symbols. For example, the $(x-1)^{th}$ second data stream includes FEC symbols $C_{544-X}$ to $C_0$, and the $(x-2)^{th}$ second data stream includes FEC symbols $C_{544-X+1}$ to $C_1$. It should be noted that the FEC codeword K drawn in FIG. 15 is merely for help a reader understand that the data included in the x second data streams is from the data of one FEC codeword K. During actual implementation, the x second data streams in FIG. 15 are not obtained by directly performing symbol distribution on the FEC codeword K.

In this case, a mapping (that is, symbol mapping) process of the transmit end device includes:

The transmit end device performs round robin on the $1^{st}$ second data stream (that is, a second data stream with a sequence number 0) to the $x^{th}$ second data stream (that is, a second data stream with a sequence number x−1), and sequentially maps $C_{543}$ (the first piece of data of 10 consecutive bits) of the $1^{st}$ second data stream to a third data stream, maps $C_{542}$ (the first piece of data of 10 consecutive bits) of the $2^{nd}$ second data stream to the third data stream, . . . , maps $C_{544-X+1}$ (the first piece of data of 10 consecutive bits) of the $(x-1)^{th}$ second data stream to the third data stream, maps $C_{544-X}$ (the first piece of data of 10 consecutive bits) of the $x^{th}$ second data stream to the third data stream, ..., until all data of all the second data streams are mapped to one third data stream (that is, $C_0$ (the last piece of data of 10 consecutive bits) of the $x^{th}$ second data stream is mapped to the third data stream), to obtain one complete third data stream. In this case, the round robin order is an ascending order of sequence numbers of the second data streams.

Correspondingly, a mapping (that is, symbol mapping) process of the receive end device includes:

The receive end device sequentially maps $C_{543}$ (the first piece of data of 10 consecutive bits) of the third data stream to the $1^{st}$ second data stream, maps $C_{542}$ (the second piece of data of 10 consecutive bits) to the $2^{nd}$ second data stream, ..., and maps $C_0$ (the last piece of data of 10 consecutive bits) to the $x^{th}$ second data stream, to obtain all of the x second data streams. In this case, the mapping order is an ascending order of sequence numbers of the second data streams.

In actual application, in a scenario in which a speed of an Ethernet interface is 25GE, for example, a 25GAUI-1 interface, x=1 in the foregoing mapping process; in a scenario in which a speed of an Ethernet interface is 50GE, for example, a 50GAUI-1 interface, x=2 in the foregoing mapping process; and in a scenario in which a speed of an Ethernet interface is 100GE, for example, a 100GAUI-1 interface, x=4 in the foregoing mapping process.

For example, it is assumed that the transmit end device and the receive end device have 100GAUI-1 interfaces. In this application scenario, a mapping process of the 100GAUI-1 interface of the transmit end device includes: The transmit end device performs round robin on the $1^{st}$ second data stream to the $4^{th}$ second data stream, and then sequentially maps $C_{543}$ of the $1^{st}$ second data stream to a third data stream, maps $C_{542}$ of the $2^{nd}$ second data stream to the third data stream, maps $C_{541}$ of the $3^{rd}$ second data stream to the third data stream, maps $C_{540}$ of the $4^{th}$ second data stream to the third data stream, ..., and maps $C_0$ of the $4^{th}$ second data stream to the third data stream, to obtain one complete third data stream. For the receive end device, correspondingly, the receive end device sequentially maps $C_{543}$ of the third data stream to the $1^{st}$ second data stream, ..., maps $C_1$ of the third data stream to the $3^{rd}$ second data stream, and maps $C_0$ of the third data stream to the $4^{th}$ second data stream, to obtain four complete second data streams.

In this way, because the x second data streams are mapped to obtain only one third data stream, when the data stream is continuously transmitted over a lane of the AUI-1 interface, the receive end device does not need to perform alignment processing on the one third data stream. In addition, because a relative relationship between the x second data streams is fixed (for example, each of the second data streams includes data of a fixed quantity of FEC symbols), the receive end device can determine a boundary of each of the x second data streams by performing single delimitation on received data, that is, performing data stream boundary determining only once.

Further, an FEC codeword includes data and a check bit. For the same FEC codeword, there is a unique relationship (the relationship may be referred to as a check relationship) between the data and the check bit, and the check relationship may be used to determine whether the data belongs to the same codeword. In this case, only one third data stream is obtained through mapping, and the one third data stream includes data of only one FEC codeword. Therefore, when the data is continuously transmitted over the lane of the AUI-1 interface, the receive end device may perform self-delimiting on a check relationship of the data at a granularity of data volumes of one FEC codeword, to determine whether the data belongs to one FEC codeword, and may further determine the first FEC symbol of the one FEC codeword, to determine whether the data is the one third data stream and further determine a boundary of the lane of the one third data stream. In this way, a boundary of each of the x second data streams can be determined.

Further, because the x second data streams are mapped to obtain only one third data stream, a mapping relationship between the x second data streams and the one third data stream is an x-to-1 mapping relationship, and only one alignment marker needs to be added to the third data stream. In this case, the process of step 1033 may be replaced by: adding one alignment marker to the one third data stream. During actual implementation, one of alignment markers of the x second data streams may be selected as the alignment marker of the third data stream. For example, an alignment marker of the $1^{st}$ second data stream is used as the alignment marker of the third data stream. In this way, the original alignment marker of the $1^{st}$ second data stream may not be deleted, thereby implementing reuse (or reusing) of the alignment marker of the second data streams and the third data stream. This reduces a processing procedure, reduces data processing of alignment marker mapping, avoids implementation load of additional alignment marker mapping relationship processing, and reduces processing overheads.

In a second case, when the quantity z of third data streams is equal to 1, and the x second data streams include data of two FEC codewords, a mapping process of the transmit end device includes the following steps.

Step F1: The transmit end device performs round robin on all of the x second data streams.

Step F2: The transmit end device sequentially maps data of n consecutive bits obtained from each of the second data streams through round robin, to obtain one third data stream.

For steps F1 and F2, refer to the processes of steps E1 and E2. The same as the first case, in the second case, in one round robin cycle, there may be a plurality of round robin orders in which the transmit end device performs round robin on the x second data streams. The round robin order is an order in which the transmit end device performs round robin on the x second data streams. For the round robin order, refer to the round robin order in the first case. Different from the first case, in the second case, round robin orders used for every two adjacent round robin cycles are different. That is, different round robin orders are used.

For example, the round robin orders used for every two adjacent round robin cycles include: In one round robin cycle, a round robin order is an ascending order of sequence numbers of the second data streams; and in another round robin cycle, a round robin order is an order of a second data stream with an odd sequence number and then a second data stream with an even sequence number, where odd and even sequence numbers are interleaved one by one.

For example, x=8, and it is assumed that sequence numbers of the eight second data streams are 0 to 7. The round robin orders used for every two adjacent round robin cycles include: In one round robin cycle, a round robin order is an ascending order of 0 to 7; and in another round robin cycle, a round robin order is 1, 0, 3, 2, 5, 4, 7, and 6, that is, an order of a second data stream with an odd sequence number and then a second data stream with an even sequence number, where odd and even sequence numbers are interleaved one by one.

Correspondingly, a mapping process of the receive end device includes:

The receive end device sequentially maps data of n consecutive bits in one third data stream to obtain the x second data streams.

For the mapping process of the receive end device, refer to the mapping process of the receive end device in the first case. In addition, the same as the first case, in the second case, a mapping order in which the receive end device performs mapping is usually consistent with the round robin order of the transmit end device. The consistency means that an overall mapping order in which the receive end device performs mapping is usually the same as an overall round robin order of the transmit end device. In the second case, when the transmit end device performs round robin, the round robin orders used for every two adjacent round robin cycles are different. Therefore, correspondingly, when the receive end device performs mapping, mapping orders for every two adjacent groups of data are different, and each group of data includes x pieces of n-bit data.

For example, the mapping orders used for every two adjacent groups of data include: For one group of data, a mapping order is an ascending order of sequence numbers of the second data streams; and for another group of data, a mapping order is an order of a second data stream with an odd sequence number and then a second data stream with an even sequence number, where odd and even sequence numbers are interleaved one by one.

For example, x=8, and it is assumed that sequence numbers of the eight second data streams are 0 to 7. The mapping orders used for every two adjacent groups of data include: For one group of data, a mapping order is an ascending order of 0 to 7; and for another group of data, a mapping order is 1, 0, 3, 2, 5, 4, 7, and 6, that is, an order of a second data stream with an odd sequence number and then a second data stream with an even sequence number, where odd and even sequence numbers are interleaved one by one.

Figure 16:
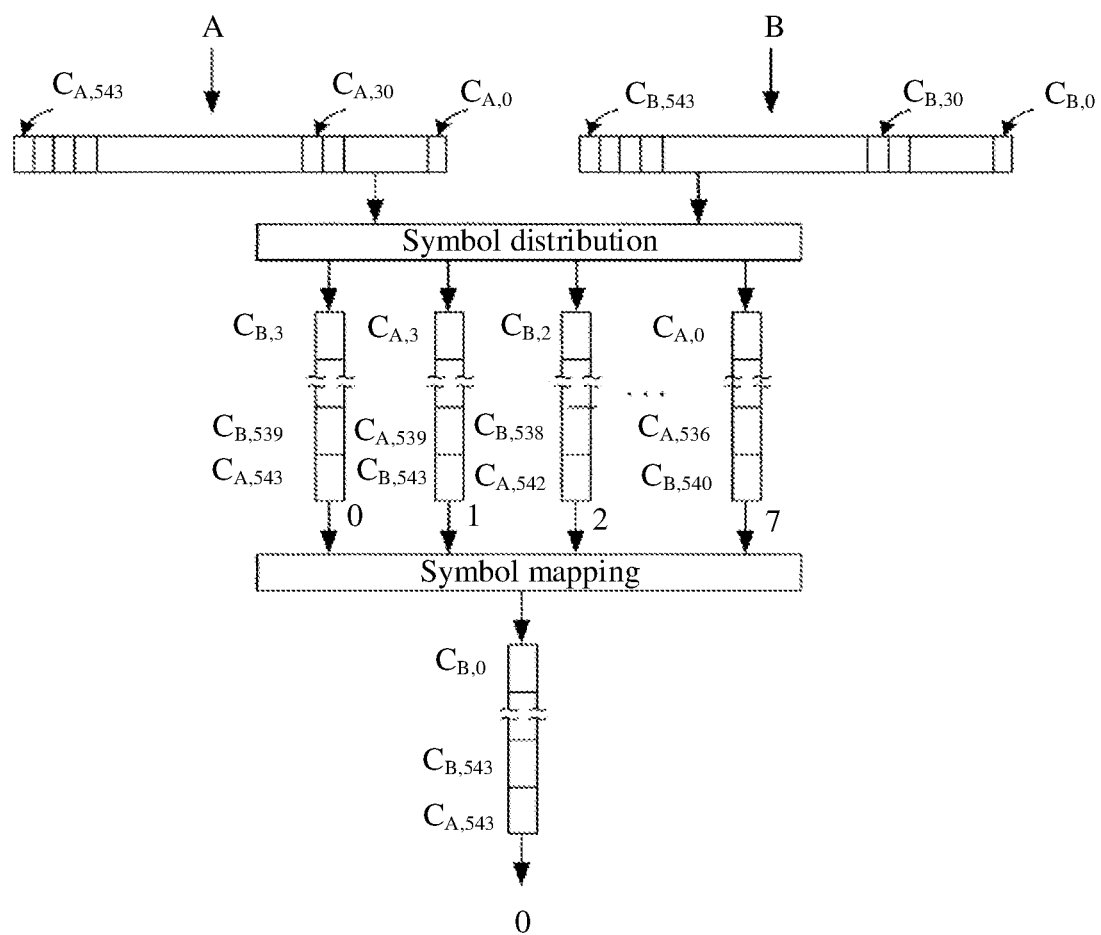

For example, as shown in FIG. 16, it is assumed that n=10 and x=8, and mapping processes of the transmit end device and the receive end device are described by using an example in which x second data streams include data of two FEC codewords A and B (to be specific, data of two FEC codewords is distributed to the x second data streams at a granularity of 10 bits (an FEC symbol), for example, codeword interleaving processing is performed on the data of two FEC codewords at a granularity of FEC symbols to obtain the x second data streams). It is assumed that each FEC codeword includes data of 544 FEC symbols, identifiers of data of 544 FEC symbols of one FEC codeword A are $C_{A,0}$ to $C_{A,543}$, identifiers of data of 544 FEC symbols of the other FEC codeword B are $C_{B,0}$ to $C_{B,543}$, and sequence numbers of the eight second data streams are 0 to 7. In this case, one second data stream includes data of 544×2/8 FEC symbols. For example, the $1^{st}$ second data stream includes FEC symbols $C_{A,543}$, $C_{B,539}$, . . . , and $C_{B,3}$, the $2^{nd}$ second data stream includes FEC symbols $C_{B,543}$, $C_{A,539}$, . . . , and $C_{A,3}$, the $3^{rd}$ second data stream includes FEC symbols $C_{A,542}$, $C_{B,538}$, . . . , and $C_{B,2}$, and the $8^{th}$ second data stream includes FEC symbols $C_{B,540}$, $C_{A,536}$, . . . , and $C_{A,0}$.

In this case, a mapping process of the transmit end device includes:

In the first round robin cycle, the transmit end device performs round robin on the $1^{st}$ second data stream to the $8^{th}$ second data stream, and sequentially maps $C_{A,543}$ of the $1^{st}$ second data stream to a third data stream, maps $C_{B,543}$ of the $2^{nd}$ second data stream to a third data stream, maps $C_{A,542}$ of the $3^{rd}$ second data stream to a third data stream, . . . , and maps $C_{B,540}$ of the $8^{th}$ second data stream to a third data stream. Then, in the second round robin cycle, the transmit end device performs round robin on the $2^{nd}$ second data stream, the $1^{st}$ second data stream, the $4^{th}$ second data stream, the $3^{rd}$ second data stream, the $6^{th}$ second data stream, the $5^{th}$ second data stream, the $8^{th}$ second data stream, and the $7^{th}$ second data stream, and sequentially maps $C_{A,539}$ of the $2^{nd}$ second data stream to a third data stream, maps $C_{B,539}$ of the $1^{st}$ second data stream to a third data stream, maps $C_{A,538}$ of the $4^{th}$ second data stream to a third data stream, maps $C_{B,538}$ of the $3^{rd}$ second data stream to a third data stream, . . . , maps $C_{A,536}$ of the $8^{th}$ second data stream to a third data stream, and maps $C_{B,536}$ of the $7^{th}$ second data stream to a third data stream; . . . ; in the last round robin cycle, the transmit end device performs round robin on the $2^{nd}$ second data stream, the $1^{st}$ second data stream, the $4^{th}$ second data stream, the $3^{rd}$ second data stream, the $6^{th}$ second data stream, the $5^{th}$ second data stream, the $8^{th}$ second data stream, and the $7^{th}$ second stream, . . . , maps CAO of the $8^{th}$ second data stream to a third data stream, and maps $C_{B,0}$ of the $7^{th}$ second data stream to a third data stream, to obtain one complete third data stream. In this case, a round robin order of the first round robin cycle is an ascending order of sequence numbers of the second data streams, and a round robin order of the second round robin cycle is 1, 0, 3, 2, 5, 4, 7, and 6, that is, an order of a second data stream with an odd sequence number and then a second data stream with an even sequence number, where odd and even sequence numbers are interleaved one by one. Mapping processes in odd-numbered round robin cycles are the same (refer to the mapping process in the first round robin cycle), and mapping processes in even-numbered round robin cycles are the same (refer to the mapping process in the second round robin cycle).

Correspondingly, a mapping process of the receive end device includes:

In the first mapping cycle, data mapped by the receive end device is the first group of data (that is, $C_{A,543}$ to $C_{B,540}$), and the receive end device sequentially maps $C_{A,543}$ (the first piece of data of 10 consecutive bits) of the third data stream to the $1^{st}$ second data stream, maps $C_{B,543}$ (the second piece of data of 10 consecutive bits) of the third data stream to the $2^{nd}$ second data stream, maps $C_{A,542}$ (the third piece of data of 10 consecutive bits) of the third data stream to the $3^{rd}$ second data stream, maps $C_{B,542}$ (the fourth piece of data of 10 consecutive bits) of the third data stream to the $4^{th}$ second data stream, maps $C_{A,541}$ (the fifth piece of data of 10 consecutive bits) of the third data stream to the $5^{th}$ second data stream, maps $C_{B,541}$ (the sixth piece of data of 10 consecutive bits) of the third data stream to the $6^{th}$ second data stream, maps $C_{A,540}$ (the seventh piece of data of 10 consecutive bits) of the third data stream to the $7^{th}$ second data stream, and maps $C_{B,540}$ (the eighth piece of data of 10 consecutive bits) of the third data stream to the $8^{th}$ second data stream.

Then, in the second mapping cycle, data mapped by the receive end device is the second group of data (that is, $C_{A,539}$ to $C_{B,536}$), and the receive end device maps $C_{A,539}$ (the ninth piece of data of 10 consecutive bits) to the $2^{nd}$ second data stream, maps $C_{B,539}$ (the tenth piece of data of 10 consecutive bits) to the $1^{st}$ second data stream, maps $C_{A,538}$ (the eleventh piece of data of 10 consecutive bits) to the $4^{th}$ second data stream, maps $C_{B,538}$ (the twelfth piece of data of 10 consecutive bits) to the $3^{rd}$ second data stream, maps $C_{A,537}$ (the thirteenth piece of data of 10 consecutive bits) to the $6^{th}$ second data stream, maps $C_{B,537}$ (the fourteenth piece of data of 10 consecutive bits) to the $5^{th}$ second data stream, maps $C_{A,536}$ (the fifteenth piece of data of 10 consecutive bits) to the $8^{th}$ second data stream, maps $C_{B,536}$ (the sixteenth piece of data of 10 consecutive bits) to the $7^{th}$ second data stream, . . . , maps $C_{B,1}$ (the $542^{nd}$ piece of data of 10 consecutive bits) to the $5^{th}$ second data stream, maps $C_{A,0}$ (the $543^{rd}$ piece of data of 10 consecutive bits) to the $8^{th}$ second data stream, and maps $C_{B,0}$ (the $544^{th}$ piece of data of 10 consecutive bits) to the $7^{th}$ second data stream, to obtain eight complete second data streams. In this case, a mapping order of the first mapping cycle is an ascending order of sequence numbers of the second data streams, and a mapping order of the second mapping cycle is 1, 0, 3, 2, 5, 4, 7, and 6, that is, an order of a second data stream with an odd sequence number and then a second data stream with an even sequence number, where odd and even sequence numbers are interleaved one by one. Mapping processes in odd-numbered mapping cycles are the same (refer to the mapping process in the first mapping cycle), and mapping processes in even-numbered mapping cycles are the same (refer to the mapping process in the second mapping cycle).

In this way, because the x second data streams are mapped to obtain only one third data stream, when the data is continuously transmitted over a lane, the receive end device does not need to perform alignment processing on the one third data stream. In addition, because a relative relationship between the x second data streams is fixed, the receive end device can determine a boundary of each of the x second data streams by performing single delimitation on received data, that is, performing data stream boundary determining only once.

Further, because the x second data streams are mapped to obtain only one third data stream, an alignment marker of the x second data streams may be reused as an alignment marker of the one third data stream with no need to determine the mapping relationship in step 1033. In other words, the same alignment marker may be directly added to the one third data stream. This reduces data processing of alignment marker mapping, avoids implementation load of additional alignment marker mapping relationship processing, and reduces processing overheads.

In a third case, the quantity z of third data streams is greater than or equal to 2 (that is, z=2 or z>2), and the x second data streams include data of a plurality of FEC codewords. The plurality of FEC codewords may be two FEC codewords or at least three FEC codewords. In this case, there is a plurality of implementations for mapping of the transmit end device and the receive end device, and the following two implementations are used as examples for description in this embodiment of this application.

In a first implementation, a mapping process of the transmit end device includes the following steps.

Step G1: The transmit end device sequentially performs round robin on all of the x second data streams, and maps data obtained through round robin to a third data stream until all data of the x second data streams is mapped to obtain the z third data streams, where data of n consecutive bits in each of the second data streams is obtained through each time of round robin.

For each second data stream, data obtained through any two adjacent times of round robin is mapped to different third data streams.

For step G1, refer to the processes of steps E1 and E2. The same as the first case, in the third case, in one round robin cycle, there may be a plurality of round robin orders in which the transmit end device performs round robin on the x second data streams. For the round robin order, refer to the round robin order in the first case. The round robin order is an order in which the transmit end device performs round robin on the x second data streams. Different from the first case, in the third case, in an optional example, mapping orders used for every two adjacent round robin cycles are different, and the mapping order is an order of mapping data obtained through round robin to the z third data streams. That is, even if a same round robin order is used for every two adjacent round robin cycles, but the mapping orders are different, the third data streams finally obtained through mapping are also different. In another optional example, mapping orders used for every two adjacent round robin cycles are the same. The mapping order may include any one of the following:

an ascending order of sequence numbers of the third data streams; or a descending order of sequence numbers of the third data streams; or an order of a third data stream with an even sequence number and then a third data stream with an odd sequence number; or an order of u1 third data streams with even sequence numbers, u2 third data streams with odd sequence numbers, u3 third data streams with even sequence numbers, and then u4 third data streams with odd sequence numbers, where u1+u2+u3+u4=z, generally, u1=u3, and u2=u4, for example, u1, u2, u3, and u4 are all equal; or an order of h1 third data streams with even sequence numbers, h2 third data streams with odd sequence numbers, h3 third data streams with odd sequence numbers, and then h4 third data streams with even sequence numbers, where h1+h2+h3+h4=z, generally, h1=h4, and h2=h3, for example, h1, h2, h3, and h4 are all equal; or an order of a third data stream with an odd sequence number and then a third data stream with an even sequence number, where odd and even sequence numbers are interleaved one by one, for example, if sequence numbers of four third data streams are 0, 1, 2, and 3, a mapping order is an order of the third data streams with sequence numbers 1, 0, 3, and 2; or another specified order.

Correspondingly, a mapping process of the receive end device includes the following steps.

Step H1: The receive end device sequentially performs round robin on all of the z third data streams, and maps data obtained through round robin to a second data stream until all data of the z third data streams is mapped to obtain the x second data streams, data obtained through each time of round robin is data of n consecutive bits in each of the third data streams.

Corresponding to the transmit end device in the third case, for the receive end device, round robin orders used for every two adjacent mapping cycles are the same or different, and mapping orders used for every two adjacent mapping cycles are the same or different.

In each mapping cycle, the round robin order meets any one of the following:

an ascending order of sequence numbers of the third data streams; or a descending order of sequence numbers of the third data streams; or an order of a third data stream with an even sequence number and then a third data stream with an odd sequence number; or an order of u1 third data streams with even sequence numbers, u2 third data streams with odd sequence numbers, u3 third data streams with even sequence numbers, and then u4 third data streams with odd sequence numbers, where u1+u2+u3+u4=z; or an order of h1 third data streams with even sequence numbers, h2 third data streams with odd sequence numbers, h3 third data streams with odd sequence numbers, and then h4 third data streams with even sequence numbers, where h1+h2+h3+h4=z; or an order of a third data stream with an odd sequence number and then a third data stream with an even sequence number, where odd and even sequence numbers are interleaved one by one; or another specified order. This is not limited in this application.

The mapping order meets any one of the following:

an ascending order of sequence numbers of the second data streams; or a descending order of sequence numbers of the second data streams; or an order of a second data stream with an even sequence number and then a second data stream with an odd sequence number; or an order of f1 second data streams with even sequence numbers, f2 second data streams with odd sequence numbers, f3 second data streams with even sequence numbers, and then f4 second data streams with odd sequence numbers, where f1+f2+f3+f4=x; or an order of g1 second data streams with even sequence numbers, g2 second data streams with odd sequence numbers, g3 second data streams with odd sequence numbers, and then g4 second data streams with even sequence numbers, where g1+g2+g3+g4=x; or an order of a second data stream with an odd sequence number and then a second data stream with an even sequence number, where odd and even sequence numbers are interleaved one by one; or another specified order. This is not limited in this application.

As described above, in the third case, in one mapping cycle, an order in which the receive end device performs data mapping, that is, the mapping order is usually the same as a round robin order of the transmit end device in one round robin cycle, and an order in which the receive end device performs data round robin is usually the same as a mapping order of the transmit end device in one round robin cycle. In other words, a mapping order of one mapping cycle of the receive end device is correspondingly the same as a round robin order of one round robin cycle of the transmit end device, and a round robin order of one mapping cycle of the receive end device is correspondingly the same as a mapping order of one round robin cycle of the transmit end device.

In the third case, the transmit end device and the receive end device have a plurality of round robin orders and a plurality of mapping orders. Therefore, the transmit end device and the receive end device may have a plurality of mapping processes. This embodiment of this application is described by using the following plurality of mapping processes as examples.

In a first manner, when z=2 and x=8, a mapping process of the transmit end device includes:

The transmit end device sequentially performs round robin on all of the eight second data streams, and maps data obtained through round robin to a third data stream until all data of the eight second data streams is mapped to obtain the two third data streams, where data of n consecutive bits in each of the second data streams is obtained through each time of round robin.

Round robin orders used for every two adjacent round robin cycles are the same. For example, in each round robin cycle, the round robin order is an order of a second data stream with an even sequence number and then a second data stream with an odd sequence number. In other words, round robin is first performed on a second data stream with an even sequence number, and then performed on a second data stream with an odd sequence number. In addition, mapping orders used for every two adjacent round robin cycles are different. For example, for every two adjacent round robin cycles, a mapping order used for one round robin cycle is that mapping to a third data stream with an even sequence number is first performed, and then mapping to a third data stream with an odd sequence number is performed; and a mapping order used for another round robin cycle is that mapping to a third data stream with an odd sequence number is first performed, and then mapping to a third data stream with an even sequence number is performed. The orders may be considered as mapping order reversal of two mapping cycles. For example, for each second data stream, data obtained through any two adjacent times of round robin is mapped to different third data streams.

Correspondingly, a mapping process of the receive end device includes:

The receive end device sequentially performs round robin on both of the two third data streams, and maps data obtained through round robin to a second data stream until all data of the two third data streams is mapped to obtain the eight second data streams, where data of n consecutive bits in each of the third data streams is obtained through each time of round robin.

Round robin orders used for every two adjacent mapping cycles are different. For example, for every two adjacent mapping cycles, a round robin order used for one mapping cycle is an order of a third data stream with an odd sequence number and then a third data stream with an even sequence number, where odd and even sequence numbers are interleaved one by one; and a round robin order used for another mapping cycle is an order of a third data stream with an even sequence number and then a third data stream with an odd sequence number, where even and odd sequence numbers are interleaved one by one. This is equivalent to round robin order reversal of two mapping cycles. Mapping orders used for every two adjacent mapping cycles are the same. For example, in each mapping cycle, the mapping order is an order of a second data stream with an even sequence number and then a second data stream with an odd sequence number. In other words, mapping to a second data stream with an even sequence number is first performed, and then mapping to a second data stream with an odd sequence number is performed.

For example, for each third data stream, data obtained through any eight adjacent times of round robin (that is, data in one mapping cycle) is mapped to eight different second data streams, and a mapping order is that mapping to a second data stream with an odd sequence number is first performed, and then mapping to a second data stream with an even sequence number is performed.

Figure 17:
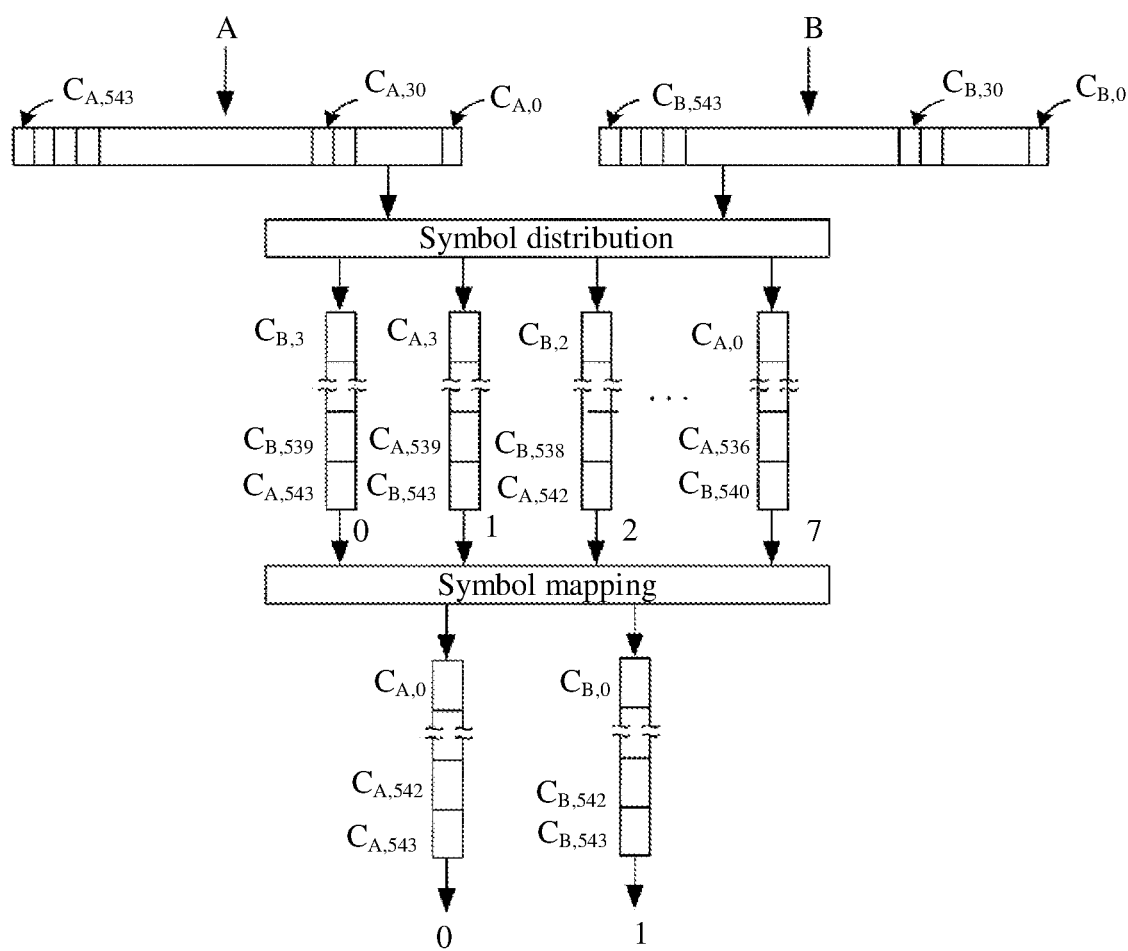

For example, as shown in FIG. 17, it is assumed that n=10, x=8, and z=2, and mapping processes of the transmit end device and the receive end device are described by using an example in which x second data streams include data of two FEC codewords A and B (to be specific, data of two FEC codewords is distributed to the x second data streams at a granularity of 10 bits (an FEC symbol), for example, codeword interleaving processing is performed on the data of two FEC codewords at a granularity of FEC symbols to obtain the x second data streams). Each FEC codeword includes data of 544 FEC symbols, identifiers of data of 544 FEC symbols of one FEC codeword A are $C_{A,0}$ to $C_{A,543}$, identifiers of data of 544 FEC symbols of the other FEC codeword B are $C_{B,0}$ to $C_{B,543}$, and sequence numbers of the eight second data streams are 0 to 7. In this case, one second data stream includes data of 544×2/8 FEC symbols. For example, the $1^{st}$ second data stream includes FEC symbols $C_{A,543}$, $C_{B,539}$, . . . , and $C_{B,3}$, the $2^{nd}$ second data stream includes FEC symbols $C_{B,543}$, $C_{A,539}$, ..., and $C_{A,3}$, the $3^{rd}$ second data stream includes FEC symbols $C_{A,542}$, $C_{B,538}$, ..., and $C_{B,2}$, and the $8^{th}$ second data stream includes FEC symbols $C_{B,540}$, $C_{A,536}$, ..., and $C_{A,0}$.

In this case, a mapping process of the transmit end device includes:

In the first round robin cycle, the transmit end device first performs round robin on second data streams with sequence numbers 0, 2, 4, and 6, and sequentially maps $C_{A,543}$, $C_{A,542}$, $C_{A,541}$, and $C_{A,540}$ obtained through round robin to the $1^{st}$ third data stream (which is the $1^{st}$ third data stream with a sequence number 0); and then performs round robin on second data streams with sequence numbers 1, 3, 5, and 7, and sequentially maps $C_{B,543}$, $C_{B,542}$, $C_{B,541}$, and $C_{B,540}$ obtained through round robin to the $2^{nd}$ third data stream (which is the $2^{nd}$ third data stream with a sequence number 1). Then, in the second round robin cycle, the transmit end device first performs round robin on the second data streams with sequence numbers 0, 2, 4, and 6, and sequentially maps $C_{B,539}$, $C_{B,538}$, $C_{B,537}$, and $C_{B,536}$ obtained through round robin to the $2^{nd}$ third data stream; and then performs round robin on the second data streams with sequence numbers 1, 3, 5, and 7, and sequentially maps $C_{A,539}$, $C_{A,538}$, $C_{A,537}$, and $C_{A,536}$ obtained through round robin to the $1^{st}$ third data stream; . . . ; in the last round robin cycle, the transmit end device first performs round robin on the second data streams with sequence numbers 0, 2, 4, and 6, and sequentially maps $C_{B,3}$, $C_{B,2}$, $C_{B,1}$, and $C_{B,0}$ obtained through round robin to the $2^{nd}$ third data stream; and then performs round robin on the second data streams with sequence numbers 1, 3, 5, and 7, and sequentially maps $C_{A,3}$, $C_{A,2}$, $C_{A,1}$, and $C_{A,0}$ obtained through round robin to the $1^{st}$ third data stream, to obtain two complete third data streams.

Correspondingly, a mapping process of the receive end device includes:

The receive end device sequentially performs round robin on both of the two third data streams. In the first mapping cycle, the receive end device maps $C_{A,543}$ of the $1^{st}$ third data stream to the $1^{st}$ second data stream, maps $C_{B,543}$ of the $2^{nd}$ third data stream to the $2^{nd}$ second data stream, maps $C_{A,542}$ of the $1^{st}$ third data stream to the $3^{rd}$ second data stream, maps $C_{B,542}$ of the $2^{nd}$ third data stream to the $4^{th}$ second data stream, maps $C_{A,541}$ of the $1^{st}$ third data stream to the $5^{th}$ second data stream, maps $C_{B,541}$ of the $2^{nd}$ third data stream to the $6^{th}$ second data stream, maps $C_{A,540}$ of the $1^{st}$ third data stream to the $7^{th}$ second data stream, and maps $C_{B,540}$ of the $2^{nd}$ third data stream to the $8^{th}$ second data stream; . . . ; in the last mapping cycle, the receive end device maps $C_{A,3}$ of the $1^{st}$ third data stream to the $2^{nd}$ second data stream, maps $C_{B,3}$ of the $2^{nd}$ third data stream to the $1^{st}$ second data stream, maps $C_{A,2}$ of the $1^{st}$ third data stream to the $4^{th}$ second data stream, maps $C_{B,2}$ of the $2^{nd}$ third data stream to the $3^{rd}$ second data stream, maps $C_{A,1}$ of the $1^{st}$ third data stream to the $6^{th}$ second data stream, maps $C_{B,1}$ of the $2^{nd}$ third data stream to the $5^{th}$ second data stream, maps CAO of the $1^{st}$ third data stream to the $8^{th}$ second data stream, and maps $C_{B,0}$ of the $2^{nd}$ third data stream to the $7^{th}$ second data stream, to obtain eight complete second data streams.

In this way, each of the two third data streams obtained through mapping includes data of only one FEC codeword. Therefore, when the data is continuously transmitted over an output lane, the receive end device may perform self-delimiting by verifying a check relationship of data whose granularity is a data volume of one FEC codeword, to determine whether the data belongs to one FEC codeword, and further determine a boundary of an output lane corresponding to one FEC codeword.

In a second manner, when z=2 and x=8, a mapping process of the transmit end device includes:

The transmit end device sequentially performs round robin on all of the eight second data streams, and maps data obtained through round robin to a third data stream until all data of the eight second data streams is mapped to obtain two third data streams. Round robin orders used for every two adjacent round robin cycles are the same. For example, it is assumed that the eight second data streams sequentially have sequence numbers 0 to 7; and when round robin is performed on the x second data streams, an order of sequence numbers of the second data streams on which round robin is performed is sequentially 0, 1, 3, 2, 4, 5, 7, and 6. In addition, mapping orders used for every two adjacent round robin cycles are different. For example, for every two adjacent round robin cycles, a mapping order used for one round robin cycle is an order of a third data stream with an odd sequence number and then a third data stream with an even sequence number, where odd and even sequence numbers are interleaved one by one; and a mapping order used for another round robin cycle is an order of a third data stream with an even sequence number and then a third data stream with an odd sequence number, where even and odd sequence numbers are interleaved one by one. This is equivalent to mapping order reversal of two round robin cycles. In this case, for each second data stream, data obtained through any two adjacent times of round robin is mapped to different third data streams.

Correspondingly, a mapping process of the receive end device includes:

The receive end device sequentially performs round robin on both of the two third data streams, and maps data obtained through round robin to a second data stream until all data of the two third data streams is mapped to obtain the eight second data streams, where data of n consecutive bits in each of the third data streams is obtained through each time of round robin, and round robin orders used for every two adjacent mapping cycles are different. For example, for every two adjacent mapping cycles, a round robin order used for one mapping cycle is an order of a third data stream with an odd sequence number and then a third data stream with an even sequence number, where odd and even sequence numbers are interleaved one by one; and a round robin order used for another mapping cycle is an order of a third data stream with an even sequence number and then a third data stream with an odd sequence number, where even and odd sequence numbers are interleaved one by one. This is equivalent to round robin order reversal of two mapping cycles. Mapping orders used for every two adjacent mapping cycles are the same. For example, in each mapping cycle, sequence numbers of the second data streams to which the data is mapped are sequentially 0, 1, 3, 2, 4, 5, 7, and 6.

Figure 18:
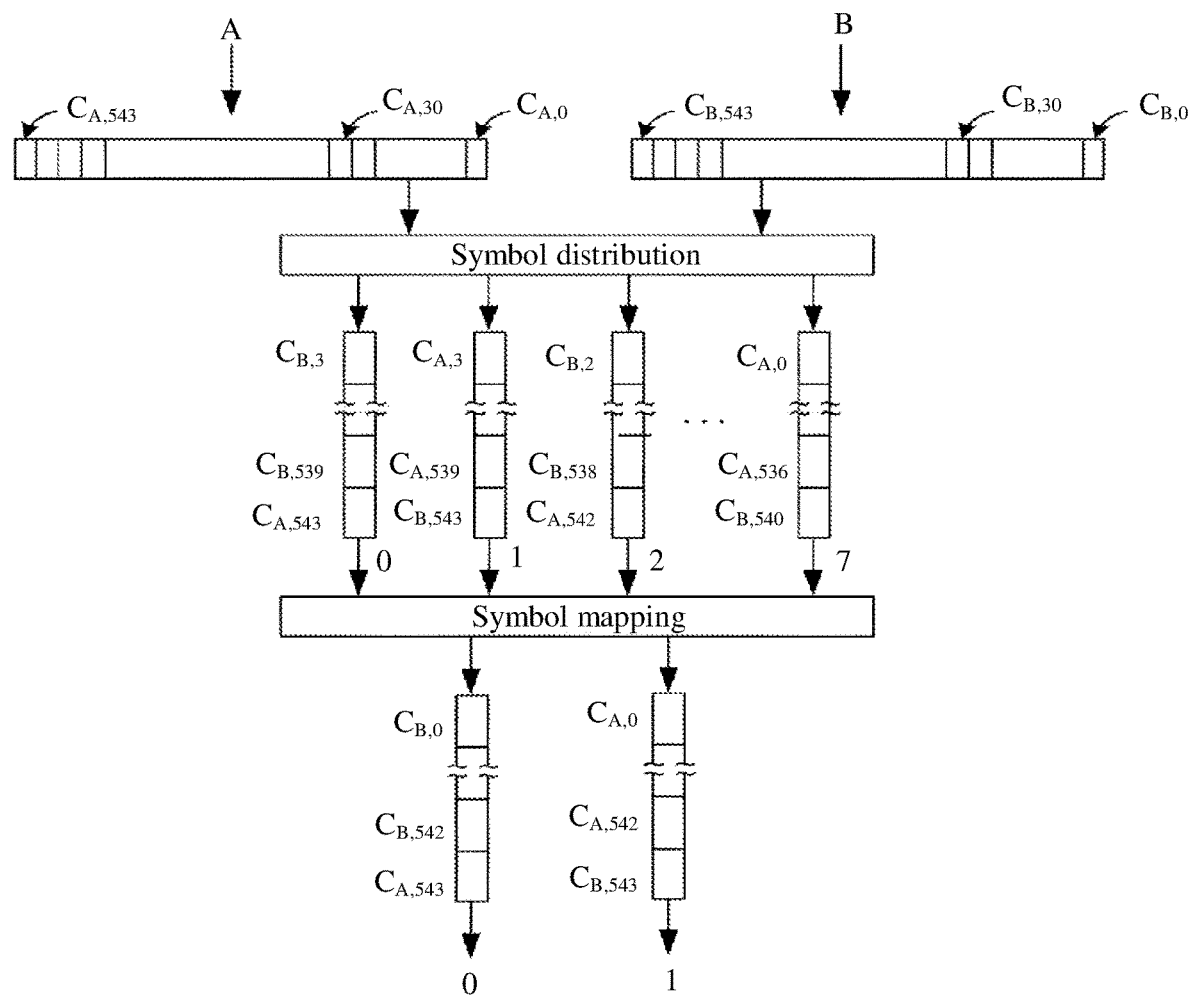

For example, the data of the eight second data streams in the example shown in FIG. 17 is still used as an example. Referring to FIG. 18, a mapping process of the transmit end device includes:

In the first round robin cycle, the transmit end device performs round robin on the second data streams with sequence numbers 0, 1, 3, 2, 4, 5, 7, and 6, and maps $C_{A,543}$, $C_{B,543}$, $C_{B,542}$, $C_{A,542}$, $C_{A,541}$, $C_{B,541}$, $C_{B,540}$, and $C_{A,540}$ that are obtained through round robin to the $1^{st}$ third data stream and the $2^{nd}$ third data stream alternately; in the second round robin cycle, the transmit end device performs round robin on the second data streams with sequence numbers 0, 1, 3, 2, 4, 5, 7, and 6, and maps $C_{B,539}$, $C_{A,539}$, $C_{A,538}$, $C_{B,538}$, $C_{B,537}$, $C_{A,537}$, $C_{A,536}$, and $C_{B,536}$ that are obtained through round robin to the $2^{nd}$ third data stream and the $1^{st}$ third data stream alternately; . . . ; in the last round robin cycle, the transmit end device performs round robin on the second data streams with sequence numbers 0, 1, 3, 2, 4, 5, 7, and 6, and maps $C_{B,3}$, $C_{A,3}$, $C_{A,2}$, $C_{B,2}$, $C_{B,1}$, $C_{A,1}$, CA0, and $C_{B,0}$ that are obtained through round robin to the $2^{nd}$ third data stream and the $1^{st}$ third data stream alternately, to obtain two complete third data streams. Mapping processes in odd-numbered round robin cycles are the same (refer to the mapping process in the first round robin cycle), and mapping processes in even-numbered round robin cycles are the same (refer to the mapping process in the second round robin cycle).

Correspondingly, a mapping process of the receive end device includes:

The receive end device sequentially performs round robin on both of the two third data streams. In the first mapping cycle, the receive end device maps $C_{A,543}$ of the $1^{st}$ third data stream to the $1^{st}$ second data stream, maps $C_{B,543}$ of the $2^{nd}$ third data stream to the $2^{nd}$ second data stream, maps $C_{B,542}$ of the $1^{st}$ third data stream to the $4^{th}$ second data stream, maps $C_{A,542}$ of the $2^{nd}$ third data stream to the $3^{rd}$ second data stream, maps $C_{A,541}$ of the $1^{st}$ third data stream to the $5^{th}$ second data stream, maps $C_{B,541}$ of the $2^{nd}$ third data stream to the $6^{th}$ second data stream, maps $C_{B,540}$ of the $1^{st}$ third data stream to the $8^{th}$ second data stream, and maps $C_{A,540}$ of the $2^{nd}$ third data stream to the $7^{th}$ second data stream; . . . ; in the last mapping cycle, the receive end device maps $C_{A,3}$ of the $1^{st}$ third data stream to the $2^{nd}$ second data stream, maps $C_{B,3}$ of the $2^{nd}$ third data stream to the $1^{st}$ second data stream, maps $C_{B,2}$ of the $1^{st}$ third data stream to the $3^{rd}$ second data stream, maps $C_{A,2}$ of the $2^{nd}$ third data stream to the $4^{th}$ second data stream, maps $C_{A,1}$ of the $1^{st}$ third data stream to the $6^{th}$ second data stream, maps $C_{B,1}$ of the $2^{nd}$ third data stream to the $5^{th}$ second data stream, maps $C_{B,0}$ of the $1^{st}$ third data stream to the $7^{th}$ second data stream, and maps CA0 of the $2^{nd}$ third data stream to the $8^{th}$ second data stream, to obtain eight complete second data streams. Mapping processes in odd-numbered mapping cycles are the same (refer to the mapping process in the first mapping cycle), and mapping processes in even-numbered mapping cycles are the same (refer to the mapping process in the second mapping cycle).

In a third manner, when z=4 and x=16, a mapping process of the transmit end device includes:

The transmit end device sequentially performs round robin on all of the 16 second data streams, and maps data obtained through round robin to a third data stream until all data of the 16 second data streams is mapped to obtain the four third data streams, where data of n consecutive bits in each of the second data streams is obtained through each time of round robin, and round robin orders used for every two adjacent round robin cycles are the same. For example, in each round robin cycle, the round robin order is an order of second data streams with two consecutive even sequence numbers and then second data streams with two consecutive odd sequence numbers. In other words, round robin is first performed on second data streams with two consecutive even sequence numbers, and then performed on second data streams with two consecutive odd sequence numbers. To be specific, in each round robin cycle, the round robin order is 0, 2, 1, 3, 4, 6, 5, 7, 8, 10, 9, 11, 12, 14, 13, and 15. In addition, mapping orders used for every two adjacent round robin cycles are different. For example, for every two adjacent round robin cycles, a mapping order used for one round robin cycle is an ascending order of sequence numbers of the third data streams, and a mapping order used for another round robin cycle is an order of the third data streams with sequence numbers 2, 3, 0, and 1. This is equivalent to mapping order reversal of two round robin cycles. For example, for each second data stream, data obtained through any two adjacent times of round robin is mapped to different third data streams. When round robin is performed on every 16 second data streams, round robin is first performed on second data streams with even sequence numbers, and then performed on second data streams with odd sequence numbers.

Correspondingly, a mapping process of the receive end device includes:

The receive end device sequentially performs round robin on all of the four third data streams, and maps data obtained through round robin to a second data stream until all the four third data streams are mapped to obtain the 16 second data streams, where data of n consecutive bits in each of the third data streams is obtained through each time of round robin, and round robin orders used for every two adjacent mapping cycles are different. For example, for every two adjacent mapping cycles, a round robin order used for one mapping cycle is an ascending order of sequence numbers of the third data streams, and a round robin order used for another mapping cycle is an order of the third data streams with sequence numbers 2, 3, 0, and 1. This is equivalent to round robin order reversal of two mapping cycles. Mapping orders used for every two adjacent mapping cycles are the same. For example, in each mapping cycle, the mapping order is an order of second data streams with two consecutive even sequence numbers and then second data streams with two consecutive odd sequence numbers. In other words, mapping to second data streams with two consecutive even sequence numbers is first performed, and then mapping to second data streams with two consecutive odd sequence numbers is performed. To be specific, in each mapping cycle, the mapping order is 0, 2, 1, 3, 4, 6, 5, 7, 8, 10, 9, 11, 12, 14, 13, and 15.

For example, for each third data stream, data obtained through any 16 adjacent times of round robin is mapped to 16 different second data streams. The 16 second data streams sequentially have sequence numbers 0 to 15. An order of sequence numbers of the second data streams to which the data is mapped is that mapping to a second data stream with an even sequence number is first performed, and then mapping to a second data stream with an odd sequence number is performed.

Figure 19:
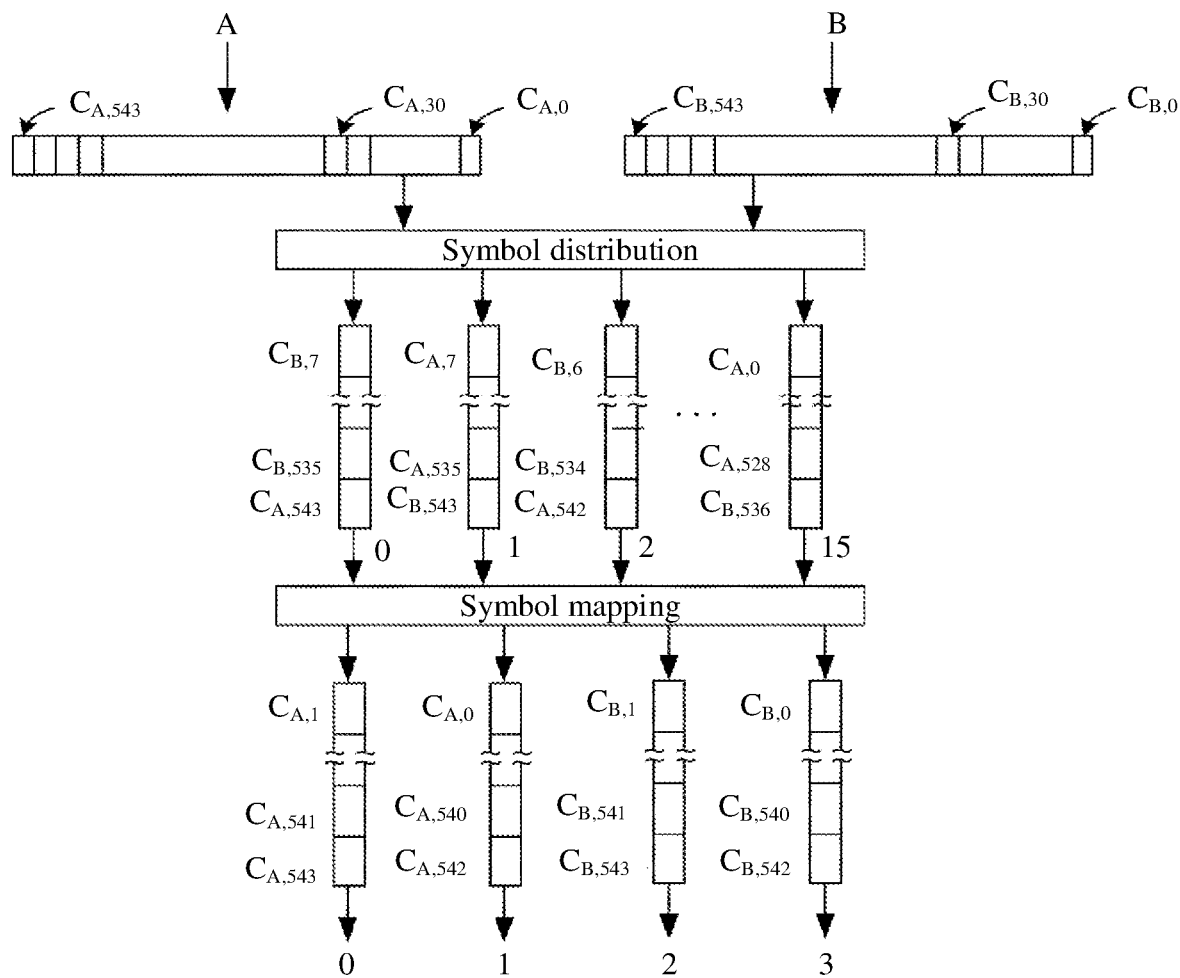

For example, as shown in FIG. 19, it is assumed that n=10, x=16, and z=4, and mapping processes of the transmit end device and the receive end device are described by using an example in which x second data streams include data of two FEC codewords A and B (to be specific, data of two FEC codewords is distributed to the 16 second data streams at a granularity of 10 bits (an FEC symbol), for example, codeword interleaving processing is performed on the data of two FEC codewords at a granularity of FEC symbols to obtain the 16 second data streams). Each FEC codeword includes data of 544 FEC symbols, identifiers of data of 544 FEC symbols of one FEC codeword A are $C_{A,0}$ to $C_{A,543}$, identifiers of data of 544 FEC symbols of the other FEC codeword B are $C_{B,0}$ to $C_{B,543}$, and sequence numbers of the 16 second data streams are 0 to 15. In this case, one second data stream includes data of 544×2/16 FEC symbols. For example, the $1^{st}$ second data stream includes FEC symbols $C_{A,543}$, $C_{B,539}$, . . . , and $C_{B,7}$, the $2^{nd}$ second data stream includes FEC symbols $C_{B,543}$, $C_{A,539}$, . . . , and $C_{A,7}$, the $3^{rd}$ second data stream includes FEC symbols $C_{A,542}$, $C_{B,538}, \ldots,$ and $C_{B,6}$, and the 16$^{th}$ second data stream includes FEC symbols $C_{B,536}, C_{A,528}, \ldots,$ and $C_{A,0}$.

In this case, a mapping process of the transmit end device includes:

In the first round robin cycle, the transmit end device first performs round robin on second data streams with sequence numbers 0, 2, 4, 6, 8, 10, 12, and 14, and sequentially maps $C_{A,543}, C_{A,542}, C_{A,541}, C_{A,540}, C_{A,539}, C_{A,538}, C_{A,537},$ and $C_{A,536}$ that are obtained through round robin to the 1$^{st}$ third data stream and the 2$^{nd}$ third data stream alternately; and then performs round robin on second data streams with sequence numbers 1, 3, 5, 7, 9, 11, 13, and 15, and sequentially maps $C_{B,543}, C_{B,542}, C_{B,541}, C_{B,540}, C_{B,539}, C_{B,538}, C_{B,537},$ and $C_{B,536}$ that are obtained through round robin to the 3$^{rd}$ third data stream (which is a third data stream with a sequence number 2) and the 4$^{th}$ third data stream (which is a third data stream with a sequence number 3) alternately;

Then, in the second round robin cycle, the transmit end device first performs round robin on the second data streams with sequence numbers 0, 2, 4, 6, 8, 10, 12, and 14, and sequentially maps $C_{B,535}, C_{B,534}, C_{B,533}, C_{B,532}, C_{B,531}, C_{B,530}, C_{B,529},$ and $C_{B,528}$ that are obtained through round robin to the 3$^{rd}$ third data stream and the 4$^{th}$ third data stream alternately; and then performs round robin on second data streams with sequence numbers 1, 3, 5, 7, 9, 11, 13, and 15, and sequentially maps $C_{A,535}, C_{A,534}, C_{A,533}, C_{A,532}, C_{A,531}, C_{A,530}, C_{A,529},$ and $C_{A,528}$ that are obtained through round robin to the 1$^{st}$ third data stream and the 2$^{nd}$ third data stream alternately; . . . , until four complete third data streams are obtained. Mapping processes in odd-numbered round robin cycles are the same as the mapping process in the first round robin cycle, and mapping processes in even-numbered round robin cycles are the same as the mapping process in the second round robin cycle.

Correspondingly, a mapping process of the receive end device includes:

The receive end device sequentially performs round robin on all of the four third data streams, and maps $C_{A,543}$ of the 1$^{st}$ third data stream to the 1$^{st}$ second data stream, maps $C_{A,542}$ of the 2$^{nd}$ third data stream to the 3$^{rd}$ second data stream, maps $C_{B,543}$ of the 3$^{rd}$ third data stream to the 2$^{nd}$ second data stream, and maps $C_{B,542}$ of the 4$^{th}$ third data stream to the 4$^{th}$ second data stream; and then maps $C_{A,541}$ of the 1$^{st}$ third data stream to the 5$^{th}$ second data stream, maps $C_{A,540}$ of the 2$^{nd}$ third data stream to the 7$^{th}$ second data stream, maps $C_{B,541}$ of the 3$^{rd}$ third data stream to the 6$^{th}$ second data stream, and maps $C_{B,540}$ of the 4$^{th}$ third data stream to the 8$^{th}$ second data stream; . . . , until 16 complete second data streams are obtained.

In a fourth manner, when z=4 and x=16, a mapping process of the transmit end device may include:

The transmit end device sequentially performs round robin on all of the 16 second data streams, and maps data obtained through round robin to a third data stream until all data of the 16 second data streams is mapped to obtain the four third data streams, where data of n consecutive bits in each of the second data streams is obtained through each time of round robin, and round robin orders used for every two adjacent round robin cycles are the same. For example, in each round robin cycle, the round robin order is an ascending order of sequence numbers of the second data streams. In addition, mapping orders used for every two adjacent round robin cycles are different. For example, for every two adjacent round robin cycles, a mapping order used for one round robin cycle is an alternate order of an ascending order of sequence numbers of the third data streams or an order of sequence numbers 1, 0, 3, and 2 of the third data streams, and a mapping order used for another round robin cycle is an alternate order of an order of sequence numbers 1, 0, 3, and 2 of the third data streams or an ascending order of sequence numbers of the third data streams. For example, for each second data stream, data obtained through any two adjacent times of round robin is mapped to different third data streams. When round robin is performed on every 16 second data streams, round robin is performed on the second data streams in ascending order of sequence numbers of the second data streams.

Correspondingly, a mapping process of the receive end device may include:

The receive end device sequentially performs round robin on all of the four third data streams, and maps data obtained through round robin to a second data stream until all the four third data streams are mapped to obtain the 16 second data streams, where data of n consecutive bits in each of the third data streams is obtained through each time of round robin, and round robin orders used for every two adjacent mapping cycles are different. For example, for every two adjacent mapping cycles, a round robin order used for one mapping cycle is an alternate order of an ascending order of sequence numbers of the third data streams or an order of sequence numbers 1, 0, 3, and 2 of the third data streams, and a round robin order used for another mapping cycle is an alternate order of an order of sequence numbers 1, 0, 3, and 2 of the third data streams or an ascending order of sequence numbers of the third data streams. Mapping orders used for every two adjacent mapping cycles are the same. For example, the mapping order is an ascending order of sequence numbers of the second data streams.

For example, for each third data stream, data obtained through any 16 adjacent times of round robin is mapped to 16 different second data streams. Mapping to the second data streams is performed in ascending order of sequence numbers of the second data streams.

Figure 20:
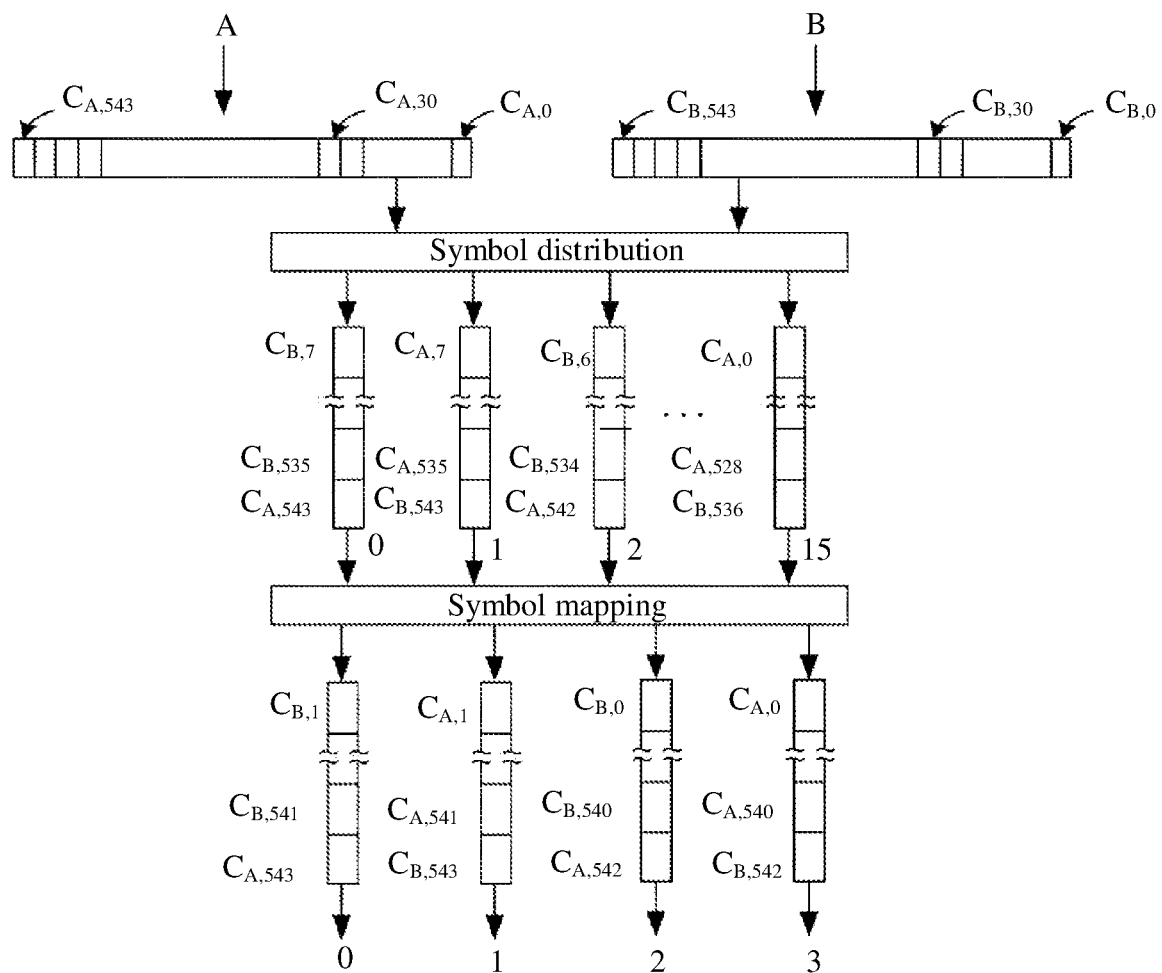

For example, as shown in FIG. 20, the data of the 16 second data streams in the example shown in FIG. 19 is still used as an example. A mapping process of the transmit end device may include:

In the first round robin cycle, the transmit end device sequentially performs round robin on the 16 second data streams, and sequentially maps $C_{A,543}, C_{B,543}, C_{A,542}, C_{B,542}, C_{A,541}, C_{B,541}, C_{A,540}, C_{B,540}, C_{A,539}, C_{B,539}, C_{A,538}, C_{B,538}, C_{A,537}, C_{B,537}, C_{A,536},$ and $C_{B,536}$ that are obtained through round robin to the 1$^{st}$ third data stream, the 2$^{nd}$ third data stream, the 3$^{rd}$ third data stream, the 4$^{th}$ third data stream, the 2$^{nd}$ third data stream, the 1$^{st}$ third data stream, the 4$^{th}$ third data stream, and the 3$^{rd}$ third data stream. Then, in the second round robin cycle, the transmit end device sequentially performs round robin on the 16 second data streams, and sequentially maps $C_{B,535}, C_{A,535}, C_{B,534}, C_{A,534}, C_{B,533}, C_{A,533}, C_{B,532}, C_{A,532}, C_{B,531}, C_{A,531}, C_{B,530}, C_{A,530}, C_{B,529}, C_{A,529}, C_{B,528},$ and $C_{A,528}$ that are obtained through round robin to the 2$^{nd}$ third data stream, the 1$^{st}$ third data stream, the 4$^{th}$ third data stream, the 3$^{rd}$ third data stream, the 1$^{st}$ third data stream, the 2$^{nd}$ third data stream, the 3$^{rd}$ third data stream, and the 4$^{th}$ third data stream. Mapping processes in odd-numbered round robin cycles are the same (refer to the mapping process in the first round robin cycle), and mapping processes in even-numbered round robin cycles are the same (refer to the mapping process in the second round robin cycle).

Correspondingly, a mapping process of the receive end device includes:

The receive end device sequentially performs round robin on all of the four third data streams. In the first mapping cycle, the receive end device sequentially performs round robin on the $1^{st}$ third data stream, the $2^{nd}$ third data stream, the $3^{rd}$ third data stream, the $4^{th}$ third data stream, the $2^{nd}$ third data stream, the $1^{st}$ third data stream, the $4^{th}$ third data stream, the $3^{rd}$ third data stream, the $1^{st}$ third data stream, the $2^{nd}$ third data stream, the $3^{rd}$ third data stream, the $4^{th}$ third data stream, the $2^{nd}$ third data stream, the $1^{st}$ third data stream, the $4^{th}$ third data stream, and the $3^{rd}$ third data stream, and sequentially maps data of the third data streams that is obtained through round robin to the 16 second data streams; then, in the second mapping cycle, the receive end device sequentially performs round robin on the $2^{nd}$ third data stream, the $1^{st}$ third data stream, the $4^{th}$ third data stream, the $3^{rd}$ third data stream, the $1^{st}$ third data stream, the $2^{nd}$ third data stream, the $3^{rd}$ third data stream, the $4^{th}$ third data stream, the $2^{nd}$ third data stream, the $1^{st}$ third data stream, the $4^{th}$ third data stream, the $3^{rd}$ third data stream, the $1^{st}$ third data stream, the $2^{nd}$ third data stream, the $3^{rd}$ third data stream, and the $4^{th}$ third data stream, and sequentially maps data of the third data streams that is obtained through round robin to the 16 second data streams; . . . , until 16 complete second data streams are obtained. Mapping processes in odd-numbered mapping cycles are the same (refer to the mapping process in the first mapping cycle), and mapping processes in even-numbered mapping cycles are the same (refer to the mapping process in the second mapping cycle).

It should be noted that, when the x second data streams include data of a plurality of FEC codewords, in the mapping process of the transmit end device, two adjacent FEC symbols of each of the x second data streams generally belong to different FEC codewords. The mapping process of the transmit end device is merely an example description, and is not limited in this application, as long as it is ensured that each of the z third data streams obtained through mapping by the transmit end device includes data of only one FEC codeword or data of two FEC codewords, and the data of the two FEC codewords is arranged based on a specific rule (for example, two adjacent FEC symbols belong to different FEC codewords).

It should be noted that when n is a quantity of bits included in one FEC symbol, the foregoing mapping may also be referred to as symbol mapping (symbol mapping).

It should be noted that the foregoing several cases are described by using an example in which sequence numbers of a plurality of data streams are set starting from 0. In actual application, the sequence numbers may alternatively be set starting from 1. A person skilled in the art can readily figure out that, due to different manners of setting sequence numbers, odd-even orders of sequence numbers are correspondingly different. Any simple change that can be figured out based on embodiments of this application may fall within the protection scope of this application.

As described above, in the second optional implementation, the fourth optional implementation, the fifth optional implementation, or the sixth optional implementation, the x fifth data streams at least have a same data attribute as the foregoing x second data streams. For example, both the x fifth data streams and the x second data streams are data transmitted at a PMA layer, and are transmitted over a PMA lane. For another example, both the x fifth data streams and the x second data streams are data transmitted over an FEC lane at a PMA layer, and are transmitted over the FEC lane.

Further, the x fifth data streams at least have same data content as the foregoing x second data streams. In this case, the x fifth data streams are the x second data streams. For the x fifth data streams, refer to the mapping process of the x second data streams. Certainly, for another mapping process, still refer to the mapping process of the x second data streams. Details are not described again in this embodiment of this application.

It should be noted that, when performing any step, the transmit end device and the receive end device usually need to perform at least one of alignment processing, deskew processing, and lane reordering processing on to-be-processed data, to ensure data validity in a subsequent processing process. It should be particularly noted that, because mapping processing of data usually changes an arrangement order or the like of the data, data misalignment is prone to occur. Therefore, after mapping processing is performed on the data (for example, the mapping processing may be performed when the data is transmitted across layers or across lanes), alignment processing needs to be performed on the data, to avoid a process error caused by data misalignment in subsequent processing.

It should be further noted that an order of steps in a data transmission method provided in embodiments of this application may be properly adjusted, or steps may be correspondingly added or deleted as required. Any method that can be readily figured out by a person skilled in the art within the technical scope disclosed in this application may fall within the protection scope of this application.

It should be further noted that the FEC codeword A and the FEC codeword B that are drawn in FIG. 16 to FIG. 20 are merely intended to help a reader understand that the data included in the x pieces of second data is from the data of two FEC codewords. During actual implementation, the x second data streams in FIG. 16 to FIG. 20 are not obtained by directly performing symbol distribution on the FEC codeword A and the FEC codeword B.

In the data transmission method provided in this embodiment of this application, in a process of performing data transmission, the transmit end device and the receive end device may use n bits as a unit symbol for transmission. Compared with a conventional manner in which data transmission is performed by using one bit as a unit symbol, if transmitted data carries burst error data, there are fewer error symbols, and a quantity of error symbols in a transmission process is reduced. This reduces spread of the burst error data, and improves reliability of data transmission.

Further, the transmit end device maps the x second data streams at the granularity of n (n≥2) bits to the z third data streams, and then outputs the z third data streams, and the mapping granularity of the x second data streams is greater than a mapping granularity in a bit MUX architecture. Therefore, when the third data streams carry burst error data, if the receive end device performs FEC symbol error correction, the burst error data is converted into a relatively small quantity of FEC symbol errors, thereby reducing a quantity of FEC symbol errors in which an error occurs. This increases a success rate of FEC codeword error correction processing, improves error correction performance, and ensures a correctness percentage of subsequent data transmission.

Still using the example shown in FIG. 5 as an example, in an application scenario of IEEE 802.3, n=10, that is, a data transmission method provided in this application is used. In a data transmission method provided in this application, when a data stream received by a PMA layer carries burst error data whose length is six bits, a unit symbol of data transmitted over an output lane of a PMA layer of the transmit end device and transmitted at the PMA layer of the receive end device is one FEC symbol, after the data is mapped by the receive end device at a granularity of 10 bits, the 6-bit burst error data is mapped to data of two FEC symbols, causing two FEC symbol errors. In this way, compared with four FEC symbol data errors caused after the 6-bit burst error data is mapped at a granularity of bits, a quantity of pieces of error FEC symbol data is reduced. In addition, because the quantity of pieces of error FEC symbol data is reduced, when codeword error correction processing is performed, a probability of a failure in codeword error correction processing is reduced, a probability of correcting the burst error data is increased, and a correctness percentage of data transmission is increased.

Further, when n=10, the transmit end device may map the x second data streams to the z third data streams at a granularity of 10 bits (an FEC symbol), and then output the z third data streams. In this way, in addition to reducing a quantity of FEC symbols including burst error data, the data transmission method can be compatible with an application scenario of IEEE 802.3ck, and computational complexity is relatively low in the application scenario.

Further, because FEC codeword error correction processing is performed on the x second data streams, the correctness percentage of data transmission is increased. In addition, in the data transmission method, re-encoding processing is performed on the x second data streams. Therefore, a data protection level is increased, and reliability of data transmission is further ensured. In addition, because there are many coding schemes for re-encoding, the data transmission method can be adapted to more application scenarios of different coding schemes, thereby improving universality of the data transmission method.

Figure 21:
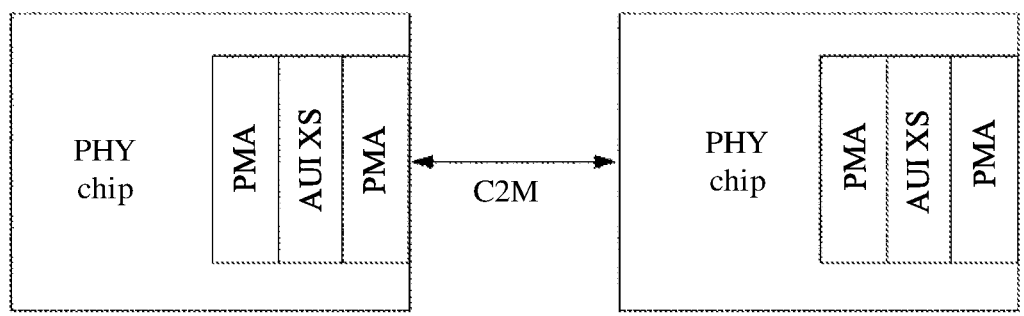
FIG. 21 to FIG. 23 are schematic diagrams of several application environments according to an embodiment of this application.
Figure 22:
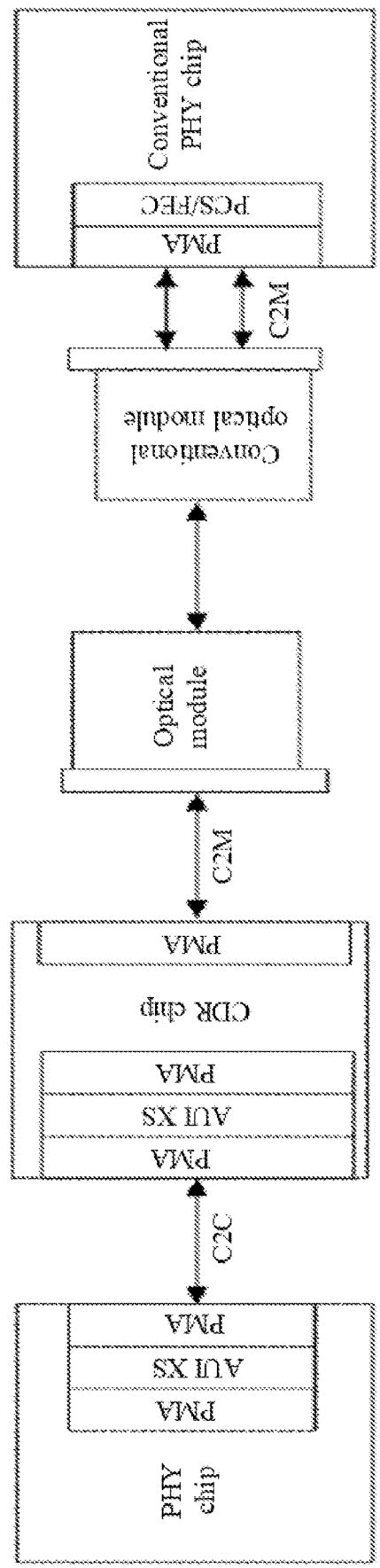
Figure 23:
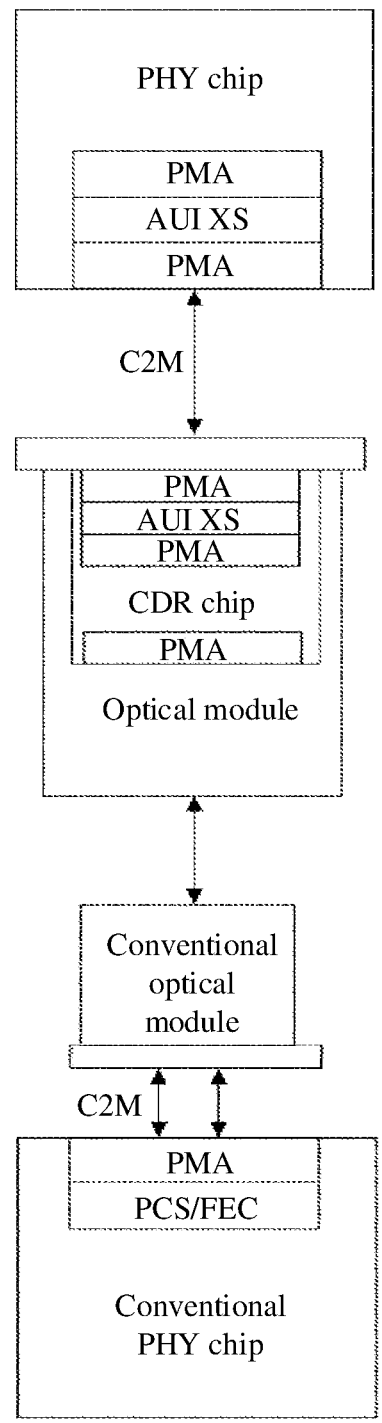

A data transmission method provided in embodiments of this application may be applied to a receive end device and a transmit end device in a plurality of scenarios. It is assumed that the foregoing data transmission method is applied to a newly added sublayer AUI XS. When chips of the transmit end device and the receive end device may include only a PHY chip, as shown in FIG. 21, the PHY chip includes a PMA layer and an AUI XS. Alternatively, as shown in FIG. 22, the transmit end device includes a PHY chip, a CDR chip, and an optical module, and performs a data transmission method provided in embodiments of this application. The receive end device includes a conventional optical module and a conventional PHY chip, and performs a conventional data transmission method. Alternatively, as shown in FIG. 23, the transmit end device includes a PHY chip and an optical module, and a CDR chip is integrated to the optical module. The receive end device includes a conventional optical module and a conventional PHY chip. In the transmit end devices shown in FIG. 22 and FIG. 23, the PHY chip includes a PMA layer and an AUI XS, and the CDR chip includes a PMA layer and an AUI XS. In the conventional optical module and the conventional PHY chip, received data is data obtained through mapping at a granularity of bits.

It should be noted that, in an application environment shown in FIG. 22 and FIG. 23, the receive end device may also be a device including a PHY chip, a CDR chip, and an optical module, or a device including a PHY chip and an optical module (a CDR chip is integrated to the optical module). The included PHY chip, CDR chip, and optical module perform a data transmission method provided in embodiments of this application.

It should be noted that, when the data transmission method is applied to the application scenarios shown in FIG. 22 and FIG. 23, a newly added sublayer AUI XS in the PHY chip may be referred to as data terminal equipment (DTE) AUI XS, and a newly added sublayer AUI XS in the CDR chip may be referred to as a physical layer (Physical, PHY) AUI XS.

For example, an embodiment of this application is described by using an application scenario of the data transmission method shown in FIG. 21 as an example. It is assumed that the transmit end device and the receive end device are a PHY chip U1 and a PHY chip U2 at different locations on a receiver that are connected to each other over Ethernet. The transmit end device and the receive end device have 100GAUI-1 interfaces in 100GE, and n=10 in the data transmission method. The data transmission method is applied to an AUI XS of the PHY chip U1 and an AUI XS of the PHY chip U2. In embodiments of this application, data transmission of the 100GAUI-1 interface is used as an example for description.

Figure 24:
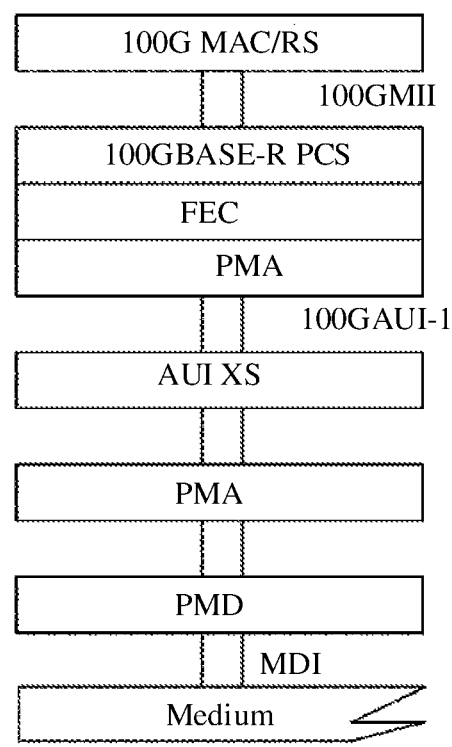
FIG. 24 is a schematic diagram of a hierarchical structure of an Ethernet interface according to an embodiment of this application.

As shown in FIG. 24, the transmit end device and the receive end device each include a MAC layer/an RS, a PCS, an FEC layer, a PMA layer, an AUI XS, a PMA layer, a PMD layer, and a medium that are sequentially arranged, a 100GMII interface between the RS layer and the PCS, a 100GAUI-1 interface between the PMA layer and the AUI XS, and an MDI interface between the PMD layer and the medium. A layer standard for the MAC layer and the RS in a case of a 100G electrical lane is 100G MAC/RS, and an encoding specification of the PCS layer is 100GBASE-R. For an encoding specification of the FEC layer, refer to IEEE 802.3 Clause 91 FEC (clause 91 FEC). In an application environment of the 100GAUI-1 interface, a bit MUX architecture of the transmit end device and the receive end device is a 4:1 architecture, and a data stream transmitted by the transmit end device and the receive end device includes only one FEC codeword.

Figure 25:
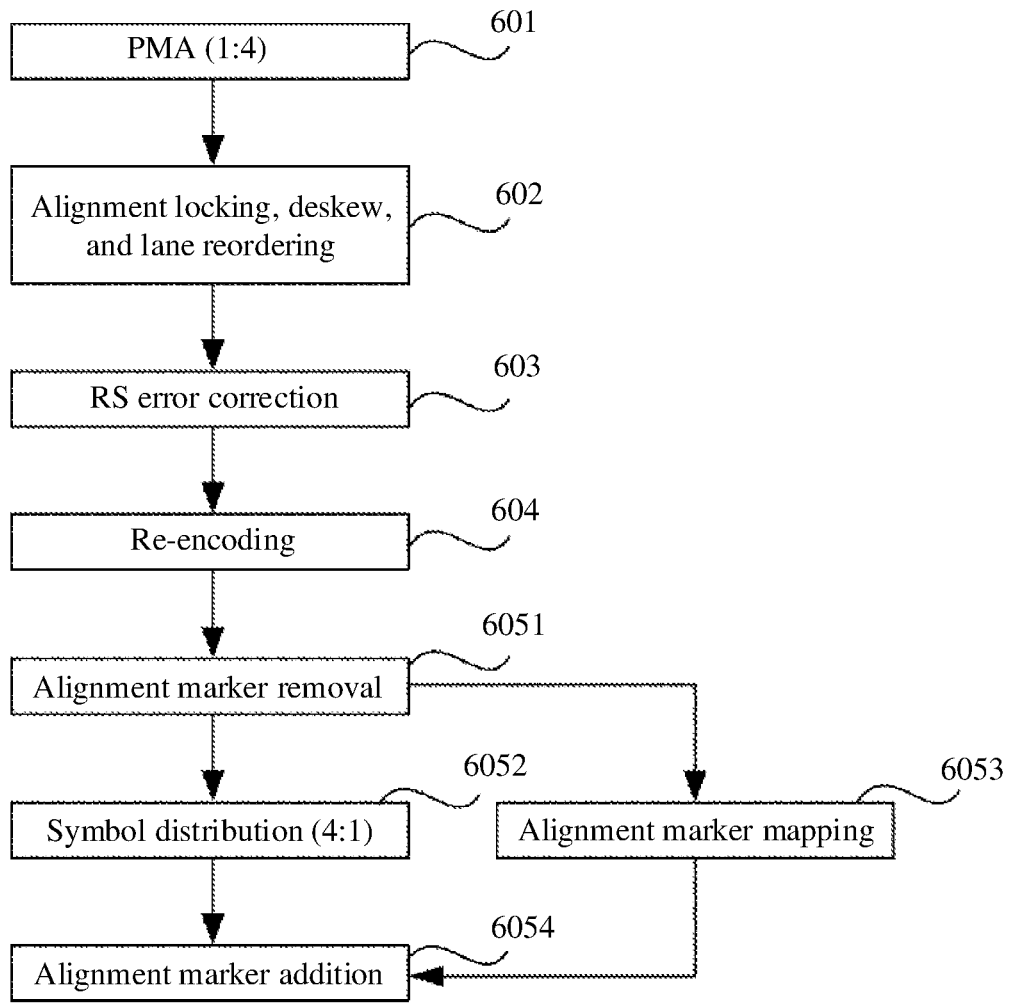
FIG. 25 is a flowchart of a data transmission method according to an embodiment of this application.

As shown in FIG. 25, the AUI XS of the PHY chip U1 first performs step 601 to obtain one first data stream that is obtained through bit MUX processing (the first data stream is also referred to as an interleaved data stream or a MUX data stream), and then perform demultiplexing processing on the first data stream to obtain four second data streams (the second data stream is also referred to as an FEC lane (FEC lanes) data stream). This step may be represented by PMA (1:4). Then, to ensure validity of the four second data streams in subsequent processing, the AUI XS of the PHY chip U1 may perform step 602 to perform alignment locking, deskew, and lane reordering processing on the four second data streams (this process may be referred to as an alignment locking, deskew, and lane reordering process). Because the four second data streams include only one FEC codeword, the AUI XS of the PHY chip U1 may perform step 603 to perform FEC codeword error correction processing on the four second data streams that are obtained after the alignment locking, deskew, and lane reordering processing, to obtain four error-corrected second data streams (this process may be referred to as an RS error correction (RS error correction) process). Then, the AUI XS of the PHY chip U1 may perform step 604 to re-encode the four error-corrected second data streams (this process may be referred to as re-encoding). The re-encoding process may include performing inner FEC encoding on the four second data streams to obtain four encoded second data streams, or may be performing enhanced FEC encoding on the x second data streams to obtain four encoded second data streams. Then, the AUI XS of the PHY chip U1 may perform step 605 to map the four re-encoded second data streams at a granularity of FEC symbols to obtain one third data stream (the third data stream may also be referred to as a symbol lane (symbol lanes) data stream). A process in which the AUI XS of the PHY chip U1 maps the four re-encoded second data streams at the granularity of FEC symbols to obtain one third data stream may include: The AUI XS of the PHY chip U1 first performs step 6051 to remove alignment markers of the four second data streams (this process may be referred to as alignment marker removal); then performs step 6052 to map, at the granularity of FEC symbols, the four second data streams from which the alignment markers are removed, to obtain one third data stream, where step 6052 is represented by symbol distribution (4:1); and then separately performs step 6053 (it should be noted that step 6053 may alternatively be performed synchronously with step 6052) and step 6054 to add an alignment marker to the one third data stream based on a mapping relationship between the four second data streams and the one third data stream (a process of step 6053 may be referred to as alignment marker mapping, and a process of step 6054 may be referred to as alignment marker addition). Finally, the one third data stream is output to the PMD layer over one PMD output lane. Finally, the transmit end device outputs the one third data stream to the PHY chip U2 over one PMD output lane of the PMD layer.

Figure 26:
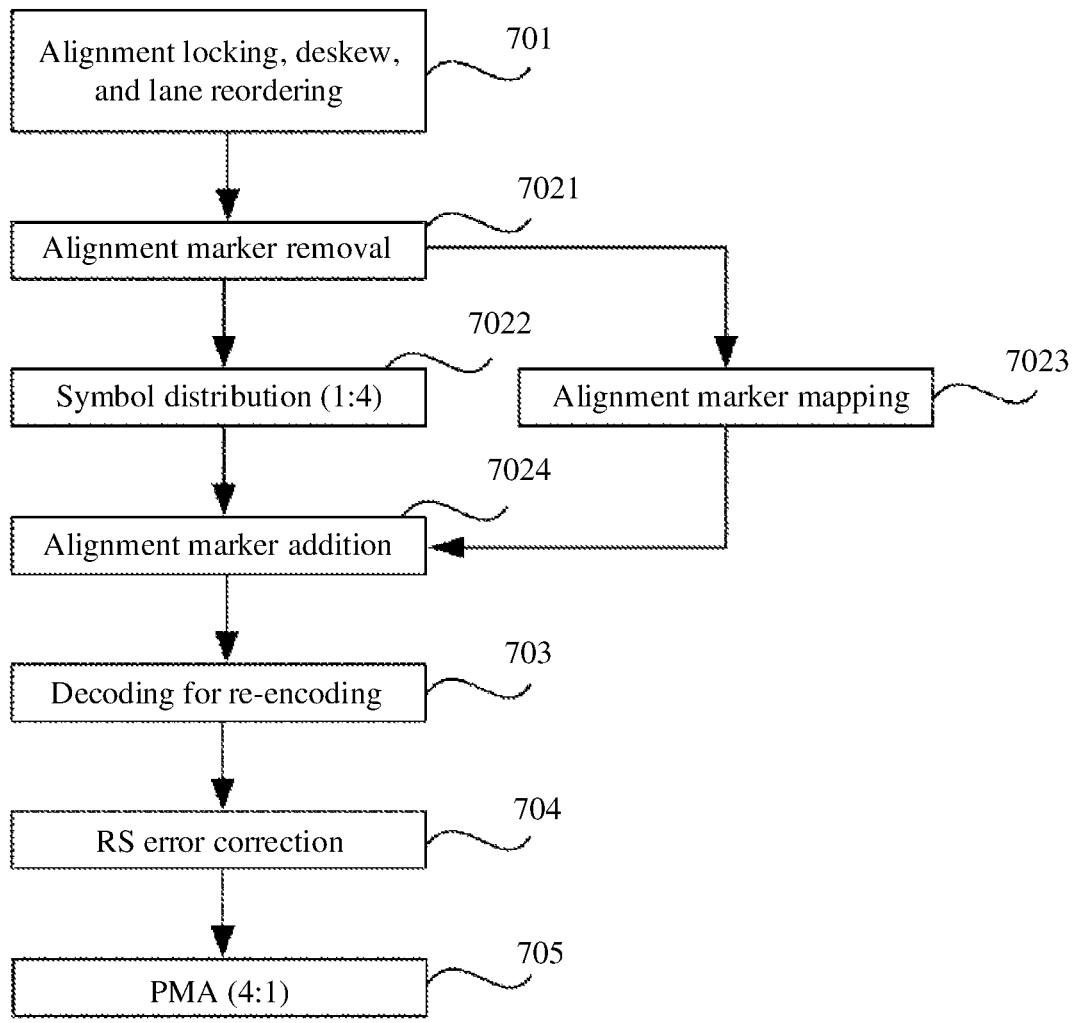
FIG. 26 is a flowchart of a data transmission method according to an embodiment of this application.

After the PHY chip U2 receives the one third data stream transmitted over the one PMD output lane, as shown in FIG. 26, to ensure validity of the four second data streams in subsequent processing, the AUI XS of the PHY chip U2 may perform step 701 to perform alignment locking, deskew, and lane reordering processing on the one third data stream (this process may be referred to as alignment locking, deskew, and lane reordering). Then, the AUI XS of the PHY chip U2 may perform step 702 to map, at the granularity of FEC symbols, the one third data stream obtained after the alignment locking, deskew, and lane reordering processing to obtain four second data streams. A process in which the AUI XS of the PHY chip U2 maps, at the granularity of FEC symbols, the one third data stream obtained after the alignment locking, deskew, and lane reordering processing to obtain the four second data streams may include: The AUI XS of the PHY chip U2 first performs step 7021 to remove the alignment marker of the one third data stream (this process may be referred to as alignment marker removal); then performs step 7022 to map, at the granularity of FEC symbols, the one third data stream from which the alignment marker is removed, to obtain four second data streams, where step 7022 may be represented by symbol distribution (1:4); and then separately performs step 7023 (it should be noted that step 7023 may alternatively be performed synchronously with step 7022) and step 7024 to add an alignment marker to each of the four second data streams based on a mapping relationship between the one third data stream and the four second data streams (a process of step 7023 may be referred to as alignment marker mapping, and a process of step 7024 may be referred to as alignment marker addition). Then, the AUI XS of the PHY chip U2 may perform step 703 to perform decoding processing for the re-encoding on the four second data streams (this process may be referred to as decoding for the re-encoding). Then, the AUI XS of the PHY chip U2 may perform step 704 to perform FEC codeword error correction processing on the four decoded second data streams (this process may be referred to as RS error correction). The FEC codeword error correction processing is mainly to correct burst error data caused when the data passes through the PMD layer, to obtain four error-corrected second data streams. Then, the AUI XS of the PHY chip U2 may perform step 705 to perform multiplexing processing on the four error-corrected second data streams at the granularity of bits to obtain the one first data stream. This process may be represented by a PMA (4:1). In this way, execution of the data transmission method provided in this embodiment of this application is completed.

It should be noted that, in the foregoing embodiment, the PHY chip U1 of the transmit end device does not necessarily need to re-encode the four error-corrected second data streams. Correspondingly, the PHY chip U2 of the receive end device does not necessarily need to perform decoding processing for the re-encoding on the four second data streams. Therefore, step 604 and step 703 in the foregoing embodiment are optional steps.

In the data transmission method provided in this embodiment of this application, the transmit end device maps the x second data streams at the granularity of n (n≥2) bits to the z third data streams, and then outputs the z third data streams, and the mapping granularity of the x second data streams is greater than a mapping granularity in a bit MUX architecture. Therefore, when the third data streams carry burst error data, if the receive end device performs FEC symbol error correction, the burst error data is converted into a relatively small quantity of FEC symbol errors, thereby reducing a quantity of FEC symbol errors in which an error occurs. This increases a success rate of FEC codeword error correction processing, improves error correction performance, and ensures a correctness percentage of subsequent data transmission.

Further, when the transmit end device and the receive end device each include only the PHY chip, in a data transmission process between the transmit end device and the receive end device, both the PHY chip of the transmit end device and the PHY chip of the receive end device perform FEC codeword error correction processing in the data transmission method, and corrected burst error data can be recorded in the FEC codeword error correction processing. Therefore, working personnel can use the recorded burst error data to determine information such as a location at which the burst error data (fault) is generated in the data transmission process, to evaluate performance of data transmission, so that C2C link performance is monitored, and fault locating is implemented.

Further, when n=10, the transmit end device may map the x second data streams to the z third data streams at a granularity of 10 bits (an FEC symbol), and then output the z third data streams. In this way, in addition to reducing a quantity of FEC symbols including burst error data, the data transmission method can be compatible with an application scenario of IEEE 802.3ck, and computational complexity is relatively low in the application scenario.

Further, because FEC codeword error correction processing is performed on the x second data streams, the correctness percentage of data transmission is increased. In addition, in the data transmission method, re-encoding processing is performed on the x second data streams. Therefore, a data protection level is increased, and data security is further ensured. In addition, because there are many coding schemes for re-encoding, the data transmission method can be adapted to more application scenarios of different coding schemes, thereby improving universality of the data transmission method.

Figure 27:
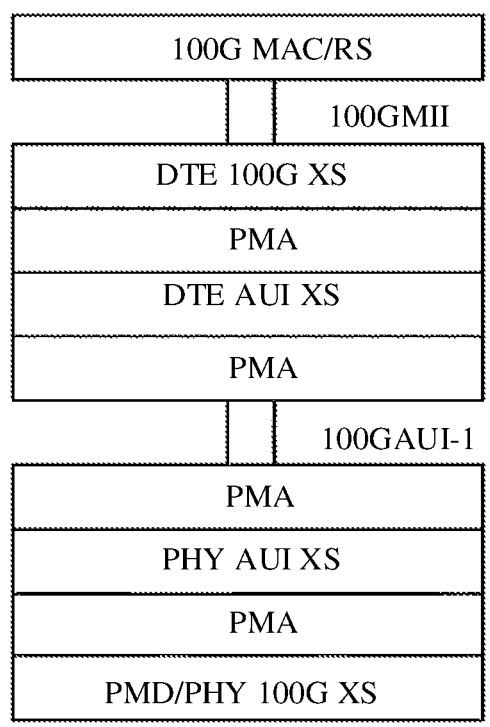
FIG. 27 is a schematic diagram of a hierarchical structure of an Ethernet interface according to an embodiment of this application.

For example, in this application, an application scenario of the data transmission method shown in FIG. 23 is used as an example. It is assumed that the transmit end device and the receive end device are devices that are on different servers and that are connected to each other over Ethernet, and are also devices that are connected to each other by using a medium. The transmit end device and the receive end device have 100GAUI-1 interfaces in 100GE, and include a PHY chip and an optical module (a CDR chip is integrated to the optical module) that are connected through the 100GAUI-1 interface. In this case, the data transmission method may be applied to DTE AUI XSs of PHY chips of the transmit end device and the receive end device, and may also be applied to PHY AUI XSs of optical modules of the transmit end device and the receive end device. When the data transmission method is applied to a 100GE environment, n=10. As shown in FIG. 27, the PHY chips of the transmit end device and the receive end device each include a MAC layer/an RS, a DTE 100G XS, a PMA layer, a DTE AUI XS, and a PMA layer that are sequentially arranged, a 100GMII interface between the RS layer and the DTE 100G XS, and a 100GAUI-1 interface between PMA layers. The optical modules of the transmit end device and the receive end device each include a PMA layer, a PHY AUI XS, a PMA layer, and a PMD/PHY 100G XS integrating a PMD function and a PHY 100G XS function that are sequentially arranged, and an MDI interface between the PMD/PHY 100G XS and the medium. A layer standard for the MAC layer/RS in a case of a 100G electrical lane is 100G MAC/RS. In an application environment of the 100GAUI-1 interface, a bit MUX architecture of the transmit end device and the receive end device is a 4:1 architecture, and a data stream transmitted by the transmit end device and the receive end device includes only one FEC codeword.

The PHY chip of the transmit end device first transmits a to-be-transmitted data stream to the optical module through the MAC layer/RS, the DTE 100G XS, the PMA layer, the DTE AUI XS, the PMA layer, and the 100GAUI-1 interface. A process in which the PHY chip processes the to-be-transmitted data stream is the same as a process in which the PHY chip processes the to-be-transmitted data stream in the architecture shown in FIG. 24. A process in which the DTE AUI XS of the PHY chip processes the to-be-transmitted data stream is the same as a process in the data transmission method shown in FIG. 25 and FIG. 26. For details, refer to the related embodiment shown in FIG. 24. Details are not described again in this application.

Figure 28:
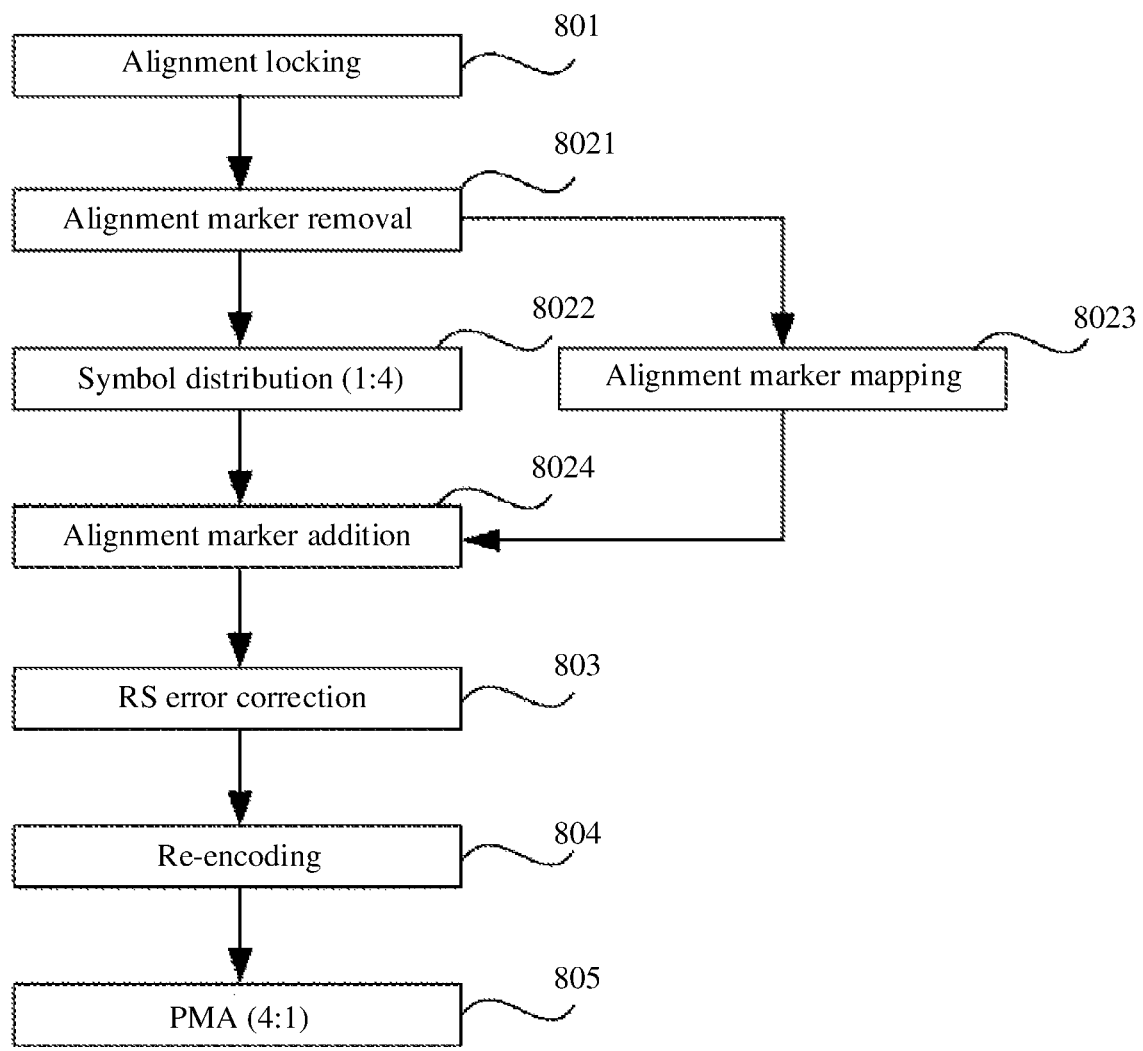
FIG. 28 is a flowchart of a data transmission method according to an embodiment of this application.

Because the 100GAUI-1 interface includes only one virtual lane, it is assumed that the optical module of the transmit end device is U3, and the optical module of the receive end device is U4. As shown in FIG. 28, the PHY AUI XS of the optical module U3 first performs step 801. Because only one third data stream is received, and no skew or lane disorder exists in the third data stream, the PHY AUI XS of the optical module U3 only needs to perform alignment locking processing on the one third data stream (this process may be referred to as alignment locking). Then, the PHY AUI XS of the optical module U3 performs step 802 to map the one third data stream at a granularity of FEC symbols to obtain four second data streams. This process may include: The PHY AUI XS of the optical module U3 of the PHY chip first performs step 8021 to remove an alignment marker of the one third data stream (this process may be referred to as alignment marker removal); then performs step 8022 to map, at the granularity of FEC symbols, the one third data stream from which the alignment marker is removed, to obtain four second data streams, where step 8022 may be represented by symbol distribution (1:4); and then separately performs step 8023 (it should be noted that step 8023 may alternatively be performed synchronously with step 8022) and step 8024 to add alignment markers to the four second data streams based on a mapping relationship between the one third data stream and the four second data streams (a process of step 8023 may be referred to as alignment marker mapping, and a process of step 8024 may be referred to as alignment marker addition). Then, the PHY AUI XS of the optical module U3 performs step 803 to perform FEC codeword error correction processing on the four second data streams to obtain four error-corrected second data streams (this process may be referred to as RS error correction). Then, the PHY AUI XS of the optical module U3 may perform step 804 to re-encode the four error-corrected second data streams (this process may be referred to as re-encoding). Finally, in a 100GAUI-1 scenario, the transmit end device has one output lane, and a data format corresponding to the output lane uses a granularity of bits. Therefore, the PHY AUI XS of the optical module U3 finally performs step 805 to map the four second data streams at the granularity of bits to one fourth data stream, where step 805 may be represented by PMA(4:1). In this way, execution of the data transmission method is completed.

Figure 29:
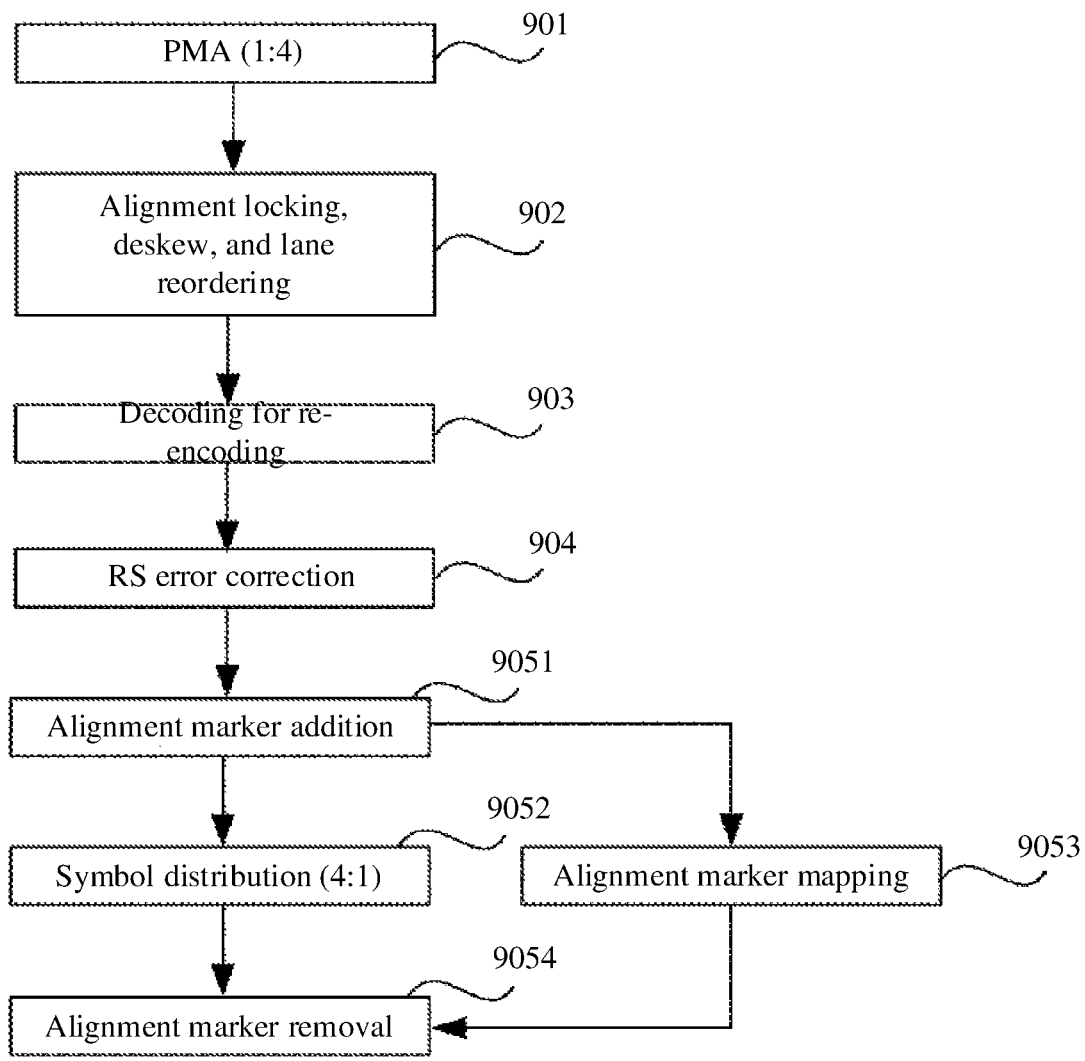
FIG. 29 is a flowchart of a data transmission method according to an embodiment of this application.

After the optical module U4 of the receive end device receives the one fourth data stream, as shown in FIG. 29, the PHY AUI XS of the optical module U4 first performs step 901 to demap the one fourth data stream to obtain four second data streams. Then, the PHY AUI XS of the optical module U4 performs step 902 to perform alignment locking, deskew, and lane reordering processing on the four second data streams (this process may be referred to as alignment locking, deskew, and lane reordering). Then, the PHY AUI XS of the optical module U4 performs step 903 to perform decoding processing for the re-encoding on the four second data streams (this process may be referred to as decoding for the re-encoding). Then, the PHY AUI XS of the optical module U4 performs step 904 to perform FEC codeword error correction processing on the four decoded second data streams to obtain four corrected second data streams (this process may be referred to as RS error correction). Then, the PHY AUI XS of the optical module U4 performs step 905 to map the four corrected second data streams at the granularity of FEC symbols to obtain one third data stream. This process may include: The PHY AUI XS of the optical module U4 first performs step 9051 to remove alignment markers of the four second data streams (this process may be referred to as alignment marker removal); then performs step 9052 to map, at the granularity of FEC symbols, the four second data streams from which the alignment markers are removed, to obtain one third data stream, where step 9052 may be represented by symbol distribution (4:1); and then separately performs step 9053 (it should be noted that step 9053 may alternatively be performed synchronously with step 9052) and step 9054 to add an alignment marker to the one third data stream based on a mapping relationship between the four second data streams and the one third data stream (a process of step 9053 may be referred to as alignment marker mapping, and a process of step 9054 may be referred to as alignment marker addition). Then, the one third data stream to which the alignment marker is added is output to the PHY chip of the receive end device, and the PHY chip performs further processing. For a processing process, refer to the related embodiment shown in FIG. 24. Details are not described again in this application. In this way, execution of the data transmission method is completed.

It should be noted that, in the foregoing embodiment, the optical module U3 of the transmit end device does not necessarily need to re-encode the four error-corrected second data streams. Correspondingly, the optical module U4 of the receive end device does not need to perform decoding processing for the re-encoding on the four second data streams. Therefore, step 804 and step 903 in the foregoing embodiment are optional steps.

In the data transmission method provided in this embodiment of this application, the transmit end device maps the x second data streams at the granularity of n (n≥2) bits to the z third data streams, and then outputs the z third data streams, and the mapping granularity of the x second data streams is greater than a mapping granularity in a bit MUX architecture. Therefore, when the third data streams carry burst error data, if the receive end device performs FEC symbol error correction, the burst error data is converted into a relatively small quantity of FEC symbol errors, thereby reducing a quantity of FEC symbol errors in which an error occurs. This increases a success rate of FEC codeword error correction processing, improves error correction performance, and ensures a correctness percentage of subsequent data transmission.

Further, when the transmit end device and the receive end device each include the PHY chip and the optical module, the PHY chip and the optical module of the transmit end device and the PHY chip and the optical module of the receive end device all perform FEC codeword error correction processing in the data transmission method, and corrected burst error data can be recorded in the FEC codeword error correction processing. Therefore, working personnel can use the recorded burst error data to determine information such as a location at which the burst error data (fault) is generated in a data transmission process, to evaluate performance of data transmission, so that C2M link performance is monitored, and fault locating is implemented.

Further, when n=10, the transmit end device may map the x second data streams to the z third data streams at a granularity of 10 bits (an FEC symbol), and then output the z third data streams. In this way, in addition to reducing a quantity of FEC symbols including burst error data, the data transmission method can be compatible with an application scenario of IEEE 802.3ck, and computational complexity is relatively low in the application scenario.

Further, because FEC codeword error correction processing is performed on the x second data streams, the correctness percentage of data transmission is increased. In addition, in the data transmission method, re-encoding processing is performed on the x second data streams. Therefore, a data protection level is increased, and reliability of data transmission is further ensured. In addition, because there are many coding schemes for re-encoding, the data transmission method can be adapted to more application scenarios of different coding schemes, thereby improving universality of the data transmission method.

It should be noted that the foregoing "/" represents an "or" relationship. Any of steps in the data transmission method provided in embodiments of this application may be properly adjusted, or steps may be correspondingly added or deleted as required. Any variation readily figured out by a person skilled in the art within the technical scope disclosed in this application may fall within the protection scope of this application. For example, step 107, step 209, step 309, or step 409 may not be performed during actual implementation. For another example, an FEC layer of a receive end may be integrated with a module that is of the foregoing receive end device and that performs FEC codeword error correction processing.

Apparatus embodiments of this application are described below, and may be used to perform the method embodiments of this application. For details not disclosed in the apparatus embodiments of this application, refer to the method embodiments of this application.

Figure 30:
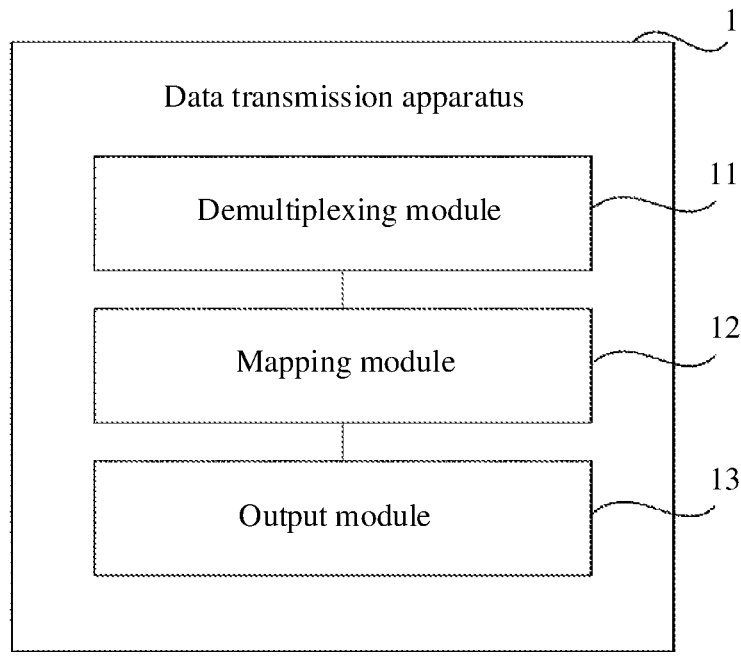
FIG. 30 to FIG. 33 are schematic structural diagrams of several data transmission apparatuses according to an embodiment of this application.

An embodiment of this application provides a data transmission apparatus 1. As shown in FIG. 30, the data transmission apparatus 1 is used for a transmit end device. The data transmission apparatus 1 includes:

a demultiplexing module 11, a mapping module 12, and an output module 13.

The demultiplexing module 11 is configured to perform demultiplexing processing on obtained y first data streams to obtain x second data streams, where the y first data streams are obtained through bit multiplexing processing, for example, perform step 111, step 112, step 121, step 122, step 131, step 132, step 141, and step 142 in the foregoing method embodiments.

The mapping module 12 is configured to map the x second data streams at a granularity of n bits to obtain z third data streams, for example, perform step 113, step 123, step 133, and step 143 in the foregoing method embodiments.

The output module 13 is configured to output the z third data streams over an output lane, for example, perform step 114 in the foregoing method embodiments, where y, x, n, and z are all positive integers, and n≥2.

The mapping module of the data transmission apparatus provided in this embodiment of this application maps the x second data streams at the granularity of n (n≥2) bits to the z third data streams, then the z third data streams are output, and the mapping granularity of the x second data streams is greater than a mapping granularity in a bit MUX architecture. Therefore, in a process of performing data transmission, the transmit end device and a receive end device may use n bits as a unit symbol for transmission. Compared with a conventional manner in which data transmission is performed by using one bit as a unit symbol, if transmitted data carries burst error data, there are fewer error symbols, and a quantity of error symbols in a transmission process is reduced. This reduces spread of the burst error data, and improves reliability of data transmission.

Optionally, the output module 13 is configured to: map the z third data streams at the granularity of n bits to obtain x fifth data streams, map the x fifth data streams at a granularity of q bits to obtain s fourth data streams, and output the s fourth data streams over the output lane, for example, perform step 204, step 205, step 501, step 502, and step 503 in the foregoing method embodiments.

Alternatively, the output module 13 is configured to map the z third data streams at the granularity of n bits to obtain s fourth data streams, and output the s fourth data streams over the output lane, for example, perform step 304 and step 305 in the foregoing method embodiments, where s and q are positive integers, and q≥2.

Optionally, the output module 13 is configured to: map the z third data streams at the granularity of n bits to obtain x fifth data streams;

perform multiplexing processing on the x fifth data streams at a granularity of bits to obtain s fourth data streams; and output the s fourth data streams over the output lane, for example, perform step 404, step 405, step 601, step 602, and step 603 in the foregoing method embodiments, where s is a positive integer.

Figure 31:
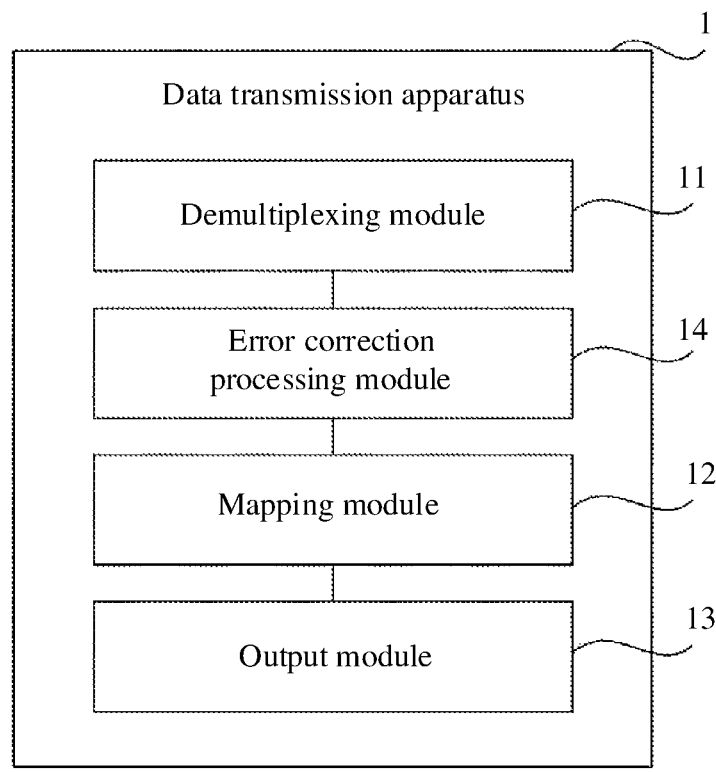

Optionally, the x second data streams include data of at least one forward error correction FEC codeword. As shown in FIG. 31, on the basis of FIG. 30, the data transmission apparatus 1 further includes:

an error correction processing module 14, configured to: before data of the x second data streams is mapped at the granularity of n bits to obtain the z third data streams, perform FEC codeword error correction processing on the x second data streams to obtain x error-corrected second data streams.

Figure 32:
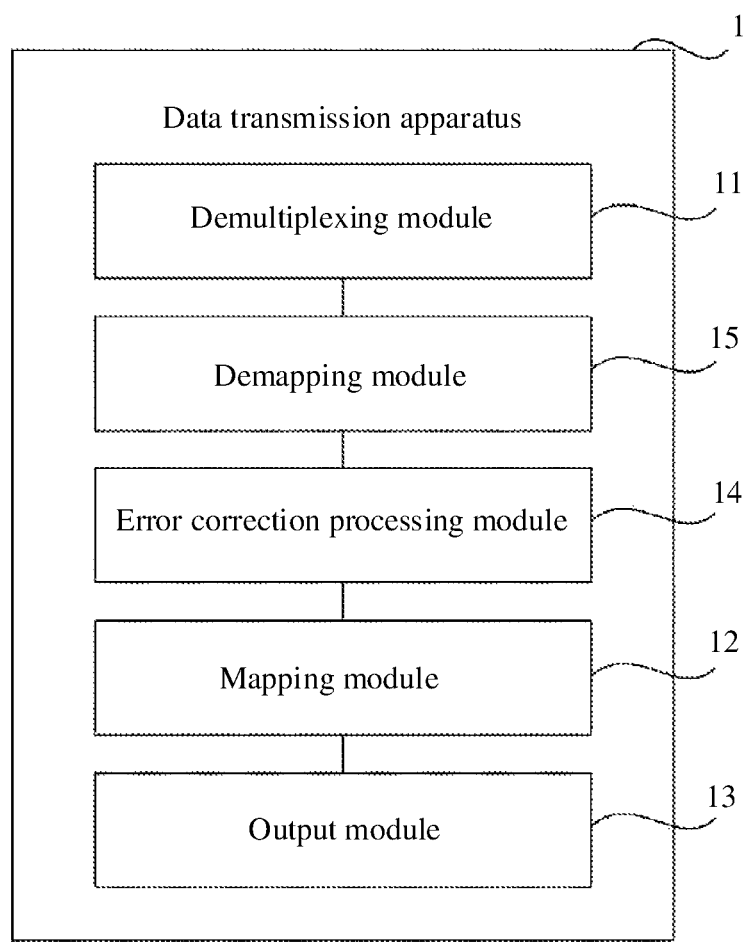

Optionally, when the x second data streams include data of a plurality of FEC codewords, as shown in FIG. 32, on the basis of FIG. 31, the data transmission apparatus 1 further includes:

a demapping module 15, configured to: before FEC codeword error correction processing is performed on the x second data streams to obtain the x error-corrected second data streams, perform demapping processing on the x second data streams at a granularity of FEC symbols to obtain data expressed in FEC codewords.

The error correction processing module 14 shown in FIG. 31 is further configured to perform FEC codeword error correction processing on the data expressed in FEC codewords, to obtain error-corrected data, and perform mapping processing on the error-corrected data at the granularity of FEC symbols to obtain the x error-corrected second data streams.

Optionally, z=1, and the mapping module 12 is configured to perform round robin on all of the x second data streams; and sequentially map data of n consecutive bits obtained from each of the second data streams through round robin, to obtain one third data stream.

Optionally, z≥2, x≥2, and the mapping module 12 is configured to: sequentially perform round robin on all of the x second data streams, and map data obtained through round robin to a third data stream until all data of the x second data streams is mapped to obtain the z third data streams, where data of n consecutive bits in each of the second data streams is obtained through each time of round robin.

For each second data stream, data obtained through any two adjacent times of round robin is mapped to different third data streams.

When round robin is performed on every x second data streams, a round robin order meets any one of the following:

Round robin is first performed on a second data stream with an even sequence number, and then performed on a second data stream with an odd sequence number.

Round robin is first performed on a second data stream with an odd sequence number, and then performed on a second data stream with an even sequence number.

Alternatively, round robin is performed on the second data streams in ascending or descending order of sequence numbers.

Optionally, n is a quantity of bits included in one FEC symbol.

Optionally, a quantity of output data streams is less than or equal to a quantity of available output lanes, or a quantity of output data streams is equal to a preset quantity of output lanes.

Figure 33:
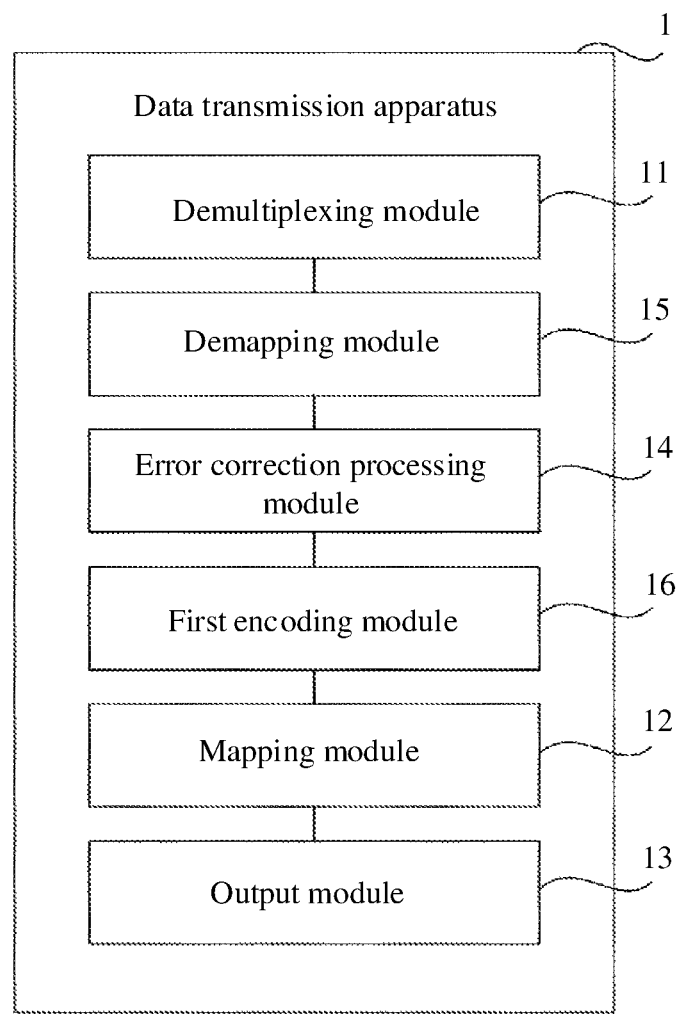

Optionally, as shown in FIG. 33, on the basis of FIG. 32, the data transmission apparatus 1 further includes:

a first encoding module 16, configured to: before the x second data streams are mapped at the granularity of n bits to obtain the z third data streams, perform inner FEC encoding on the x second data streams to obtain x encoded second data streams.

Alternatively, the first encoding module 16 is configured to: before the x second data streams are mapped at the granularity of n bits to obtain the z third data streams, when each of the second data streams carries a check bit, remove the check bit of each of the x second data streams, and perform second FEC encoding on the x second data streams from which the check bits are removed, to obtain x encoded second data streams. A coding scheme of the second FEC encoding is different from a coding scheme of first FEC encoding used before the check bits are removed.

Figure 34:
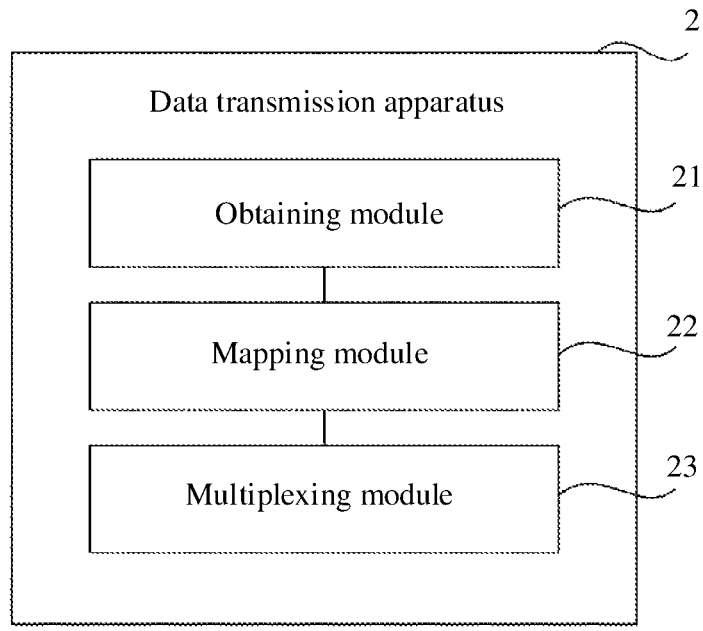
FIG. 34 to FIG. 37 are schematic structural diagrams of several data transmission apparatuses according to an embodiment of this application.

An embodiment of this application provides a data transmission apparatus 2. As shown in FIG. 34, the data transmission apparatus 2 is used for a receive end device. The data transmission apparatus 2 includes:

an obtaining module 21, a mapping module 22, and a multiplexing module 23.

The obtaining module 21 is configured to obtain z third data streams over an input lane, for example, perform step 105 in the foregoing method embodiments.

The mapping module 22 is configured to map the z third data streams at a granularity of n bits to obtain x second data streams, where the z third data streams are obtained through mapping at the granularity of n bits, for example, perform step 106, step 208, step 308, and step 408 in the foregoing method embodiments.

The multiplexing module 23 is configured to perform multiplexing processing on the x second data streams at a granularity of bits to obtain y first data streams, for example, perform step 107, step 209, step 309, and step 409 in the foregoing method embodiments, where z, n, x, and y are all positive integers, and n≥2.

The obtaining module of the data transmission apparatus provided in this embodiment of this application obtains the z third data streams over the input lane, and the mapping module maps the z third data streams at the granularity of n bits to obtain the x second data streams. The mapping granularity of the z third data streams is greater than a mapping granularity in a bit MUX architecture. Therefore, in a process of performing data transmission, a transmit end device and the receive end device may use n bits as a unit symbol for transmission. Compared with a conventional manner in which data transmission is performed by using one bit as a unit symbol, if transmitted data carries burst error data, there are fewer error symbols, and a quantity of error symbols in a transmission process is reduced. This reduces spread of the burst error data, and improves reliability of data transmission.

Optionally, the obtaining module 21 is configured to: receive s fourth data streams over the input lane, map the s fourth data streams at a granularity of q bits to obtain x fifth data streams, and map the x fifth data streams at the granularity of n bits to obtain the z third data streams, for example, perform step 207, step 505, and step 506 in the foregoing method embodiments.

Alternatively, the obtaining module 21 is configured to receive s fourth data streams over the input lane, and map the s fourth data streams at the granularity of n bits to obtain the z third data streams, for example, perform step 307 in the foregoing method embodiments, where s and q are positive integers, and q≥2.

Optionally, the obtaining module 21 is configured to receive s fourth data streams over the input lane;

perform demultiplexing processing on the s fourth data streams at the granularity of bits to obtain x fifth data streams; and map the x fifth data streams at the granularity of n bits to obtain the z third data streams, for example, perform step 407 in the foregoing method embodiments, where s is a positive integer.

Figure 35:
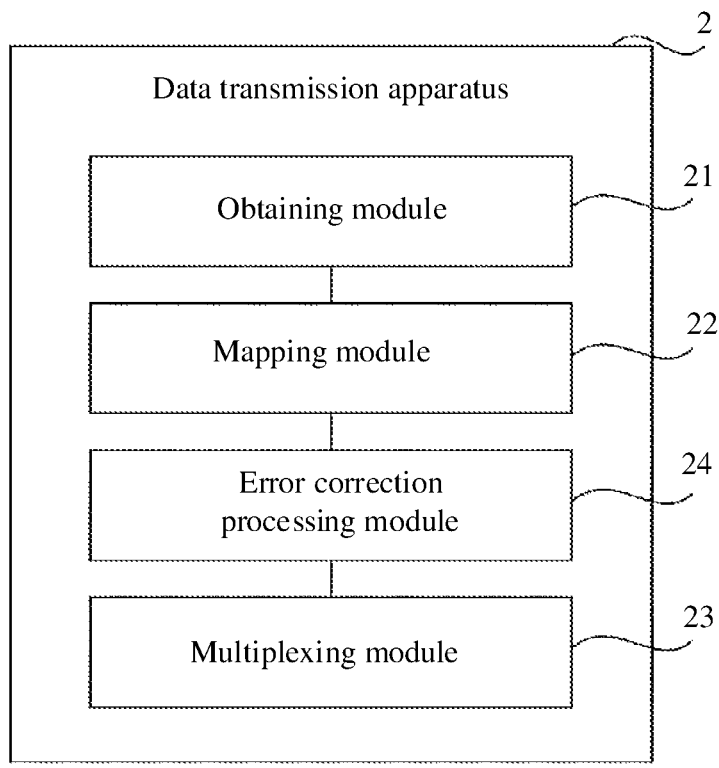

Optionally, the x second data streams include data of at least one forward error correction FEC codeword. As shown in FIG. 35, on the basis of FIG. 34, the data transmission apparatus 2 further includes:

an error correction processing module 24, configured to: before multiplexing processing is performed on the x second data streams at the granularity of bits to obtain the y first data streams, perform FEC codeword error correction processing on the x second data streams to obtain x error-corrected second data streams.

Figure 36:
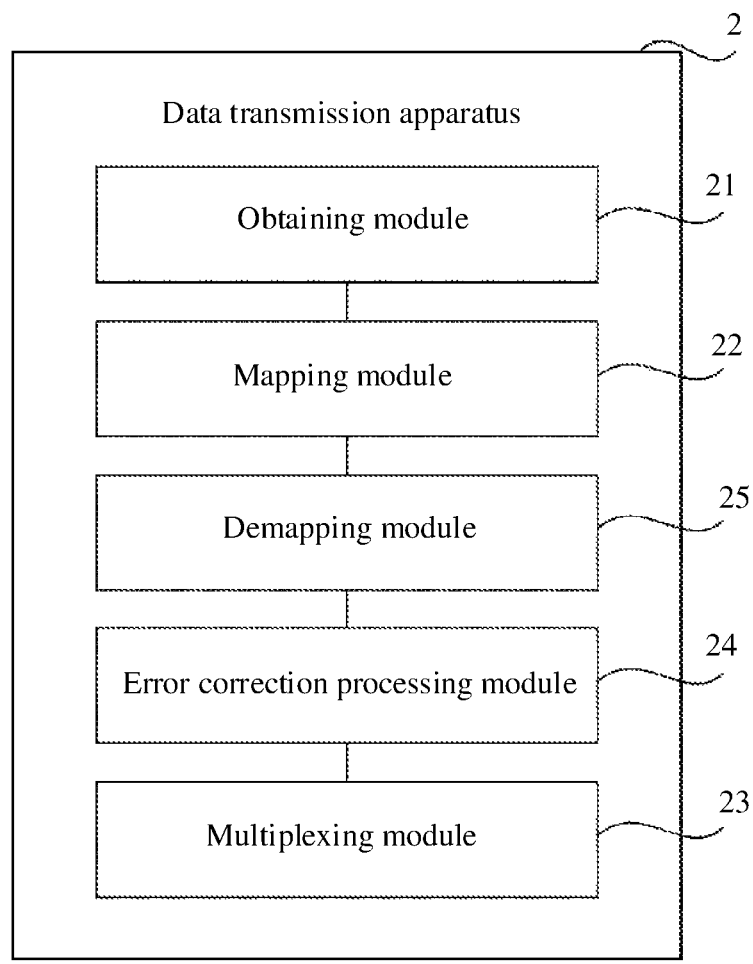

Optionally, when the z third data streams include data of a plurality of FEC codewords, as shown in FIG. 36, on the basis of FIG. 35, the data transmission apparatus 2 further includes:

a demapping module 25, configured to: before FEC codeword error correction processing is performed on the x second data streams to obtain the x error-corrected second data streams, perform demapping processing on the x second data streams at a granularity of FEC symbols to obtain data expressed in FEC codewords.

The error correction processing module 24 shown in FIG. 35 is further configured to perform FEC codeword error correction processing on the data expressed in FEC codewords, to obtain error-corrected data, and perform mapping processing on the error-corrected data at the granularity of FEC symbols to obtain the x error-corrected second data streams.

Optionally, z=1, and the mapping module 22 is configured to:

sequentially map data of n consecutive bits in one third data stream to obtain the x second data streams.

Optionally, z≥2, x≥2, and the mapping module 22 is configured to:

sequentially perform round robin on all of the z third data streams, and map data obtained through round robin to a second data stream until all data of the z third data streams is mapped to obtain the x second data streams, where data of n consecutive bits in each of the third data streams is obtained through each time of round robin.

For each second data stream, data obtained through any two adjacent times of mapping is from different third data streams.

Optionally, for each third data stream, when data obtained through any x adjacent times of round robin is mapped to x different second data streams, a mapping order meets any one of the following:

Mapping to a second data stream with an even sequence number is first performed, and then mapping to a second data stream with an odd sequence number is performed.

Mapping to a second data stream with an odd sequence number is first performed, and then mapping to a second data stream with an even sequence number is performed.

Alternatively, mapping is performed in ascending order of sequence numbers of the second data streams.

Optionally, n is a quantity of bits included in one FEC symbol.

Figure 37:
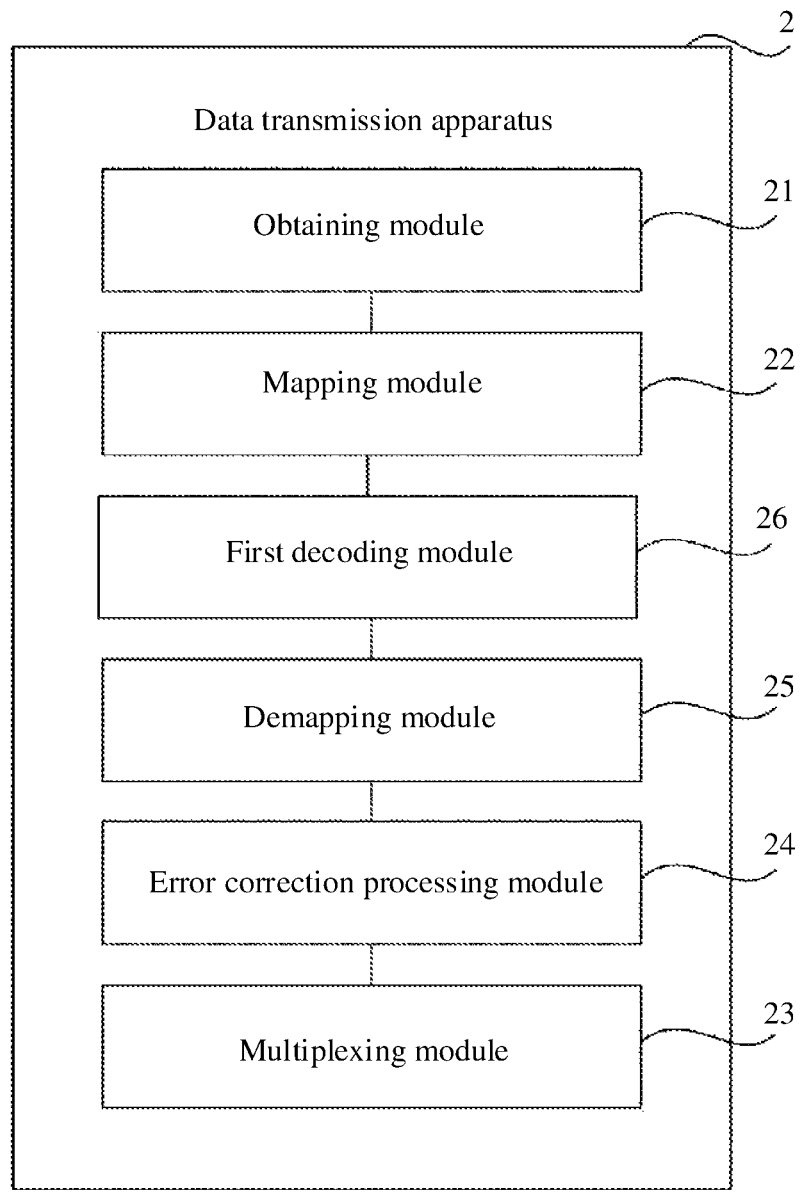

Optionally, as shown in FIG. 37, on the basis of FIG. 36, the data transmission apparatus 2 further includes:

a first decoding module 26, configured to: before multiplexing processing is performed on the x second data streams at the granularity of bits to obtain the y first data streams, perform inner FEC decoding on the x second data streams to obtain x decoded second data streams, and remove check bits included in the x decoded second data streams, to obtain x second data streams from which the check bits are removed, where the check bits are added when the transmit end device performs inner FEC encoding on the x second data streams.

Alternatively, the first decoding module 26 is configured to: before multiplexing processing is performed on the x second data streams at the granularity of bits to obtain the y first data streams, perform second FEC decoding on the x second data streams to obtain x decoded second data streams, and perform first FEC encoding on the x decoded second data streams to obtain x encoded second data streams. A coding scheme corresponding to the second FEC decoding is different from a coding scheme of the first FEC encoding.

An embodiment of this application provides a data transmission system, including a transmit end device 10 and a receive end device 20. The transmit end device 10 is configured to send data, and the receive end device 20 is configured to receive data. For example, the data transmission system may be the data transmission apparatus shown in FIG. 35. The data transmission system has a plurality of structures based on different components included in the transmit end device 10 and the receive end device 20. The following several structures are used as examples for description in this embodiment of this application.

Figure 38:
FIG. 38 to FIG. 42 are schematic structural diagrams of several data transmission systems according to an embodiment of this application.

In a first structure, as shown in FIG. 38, the transmit end device 10 and the receive end device 20 each include a PHY chip, and the PHY chips are connected through communication. For a communication connection mode, refer to the communication connection mode shown in the foregoing embodiments. Details are not described again in this embodiment of this application. The PHY chips of the transmit end device 10 and the receive end device 20 may be configured to separately perform processing on to-be-transmitted data at a granularity of n bits. For example, the PHY chip of the transmit end device 10 may perform step 101 to step 104, step 201 to step 205, step 301 to step 305, and step 401 to step 405 in the foregoing method embodiments. The PHY chip of the receive end device 20 may perform step 105 to step 107, step 206 to step 209, step 306 to step 309, and step 406 to step 409 in the foregoing method embodiments.

Figure 39:
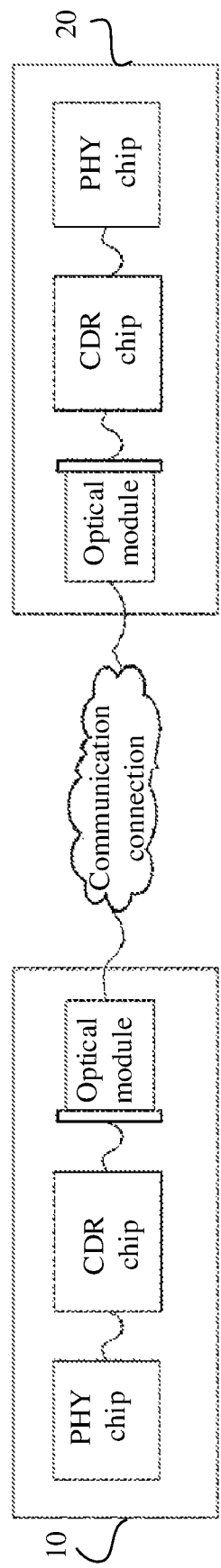

In a second structure, as shown in FIG. 39, the transmit end device 10 and the receive end device 20 each include a PHY chip, a CDR chip, and an optical module. The CDR chip of the transmit end device 10 is separately connected to the PHY chip and the optical module through an AUI interface. Connection relationships between the PHY chip, the CDR chip, and the optical module in the receive end device 20 are the same as connection relationships between the PHY chip, the CDR chip, and the optical module in the transmit end device 10. The PHY chip and the CDR chip in the transmit end device 10 may be configured to perform processing on to-be-transmitted data at a granularity of n bits to obtain processed to-be-transmitted data, and then transmit the processed to-be-transmitted data to the optical module. The optical module is configured to directly send the received processed to-be-transmitted data, or adapt the received processed to-be-transmitted data to another receive end device. The another receive end device is a device having a received data format and a quantity of input lanes that are different from a data format and a quantity of input lanes of the processed to-be-transmitted data. For example, the optical module may perform step 101 to step 104, step 201 to step 205, step 301 to step 305, step 401 to step 405, step 501 to step 503, and step 601 to step 603 in the foregoing method embodiments. The optical module in the receive end device 20 is configured to receive data. The PHY chip and the CDR chip may be configured to perform, on the received data, processing corresponding to the processing of the transmit end device, for example, perform step 105 to step 107, step 206 to step 209, step 306 to step 309, step 406 to step 409, and step 504 to step 506 in the foregoing method embodiments.

Figure 40:

In a third structure, as shown in FIG. 40, the transmit end device 10 and the receive end device 20 each include a PHY chip and an optical module. In both the transmit end device 10 and the receive end device 20, the PHY chip is connected to the optical module through an AUI interface. Functions of the PHY chips in the transmit end device 10 and the receive end device 20 are the same as the functions of the PHY chips in the foregoing second structure. A CDR chip is integrated to each of the optical modules in the transmit end device 10 and the receive end device 20. Therefore, the optical module has the functions of the CDR chip and the optical module in the foregoing second structure.

Figure 41:
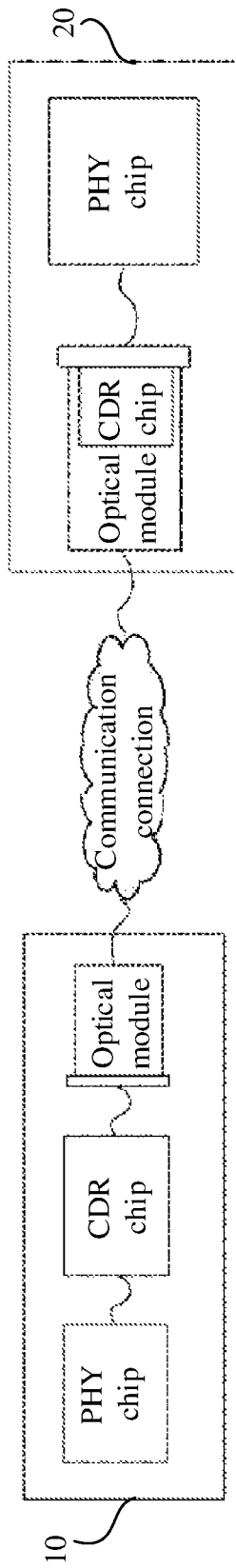

In a fourth structure, as shown in FIG. 41, the transmit end device 10 includes a PHY chip, a CDR chip, and an optical module, and the receive end device 20 includes a PHY chip and an optical module. The PHY chip, the CDR chip, and the optical module in the transmit end device 10 are connected in the same mode as the PHY chip, the CDR chip, and the optical module in the transmit end device 10 in the foregoing second structure, and have same corresponding functions. The PHY chip and the optical module in the receive end device 20 are connected in the same mode as the PHY chip and the optical module in the receive end device 20 in the foregoing third structure, and have same corresponding functions. Details are not described again in this embodiment of this application.

Figure 42:
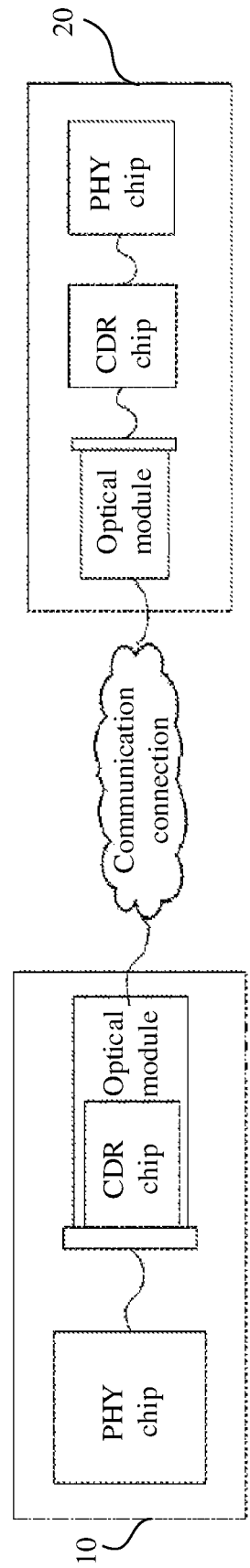

In a fifth structure, as shown in FIG. 42, the transmit end device 10 includes a PHY chip and an optical module; and the receive end device 20 includes a PHY chip, a CDR chip, and an optical module. The PHY chip and the optical module in the transmit end device 10 are connected in the same mode as the PHY chip and the optical module in the transmit end device 10 in the foregoing third structure, and have same corresponding functions. The PHY chip, the CDR chip, and the optical module in the receive end device 20 are connected in the same mode as the PHY chip, the CDR chip, and the optical module in the receive end device 20 in the foregoing second structure, and have same corresponding functions. Details are not described again in this embodiment of this application.

For entity structures of the transmit end device and the receive end device provided in this embodiment of this application, refer to corresponding structures in the systems shown in FIG. 38 to FIG. 42. Details are not described again in this embodiment of this application.

This application further provides a computer-readable storage medium. The computer-readable storage medium stores instructions; and when the instructions are run on a computer, the computer is enabled to perform the methods in the foregoing aspects.

This application provides a computer program product including instructions. When the instructions are run on a computer, the computer is enabled to perform the methods in the foregoing aspects.

The computer program product includes one or more computer instructions. When the computer program instructions are loaded and executed on the computer, all or some of the procedures or functions according to embodiments of this application are generated. The computer may be a general-purpose computer, a dedicated computer, a computer network, or another programmable apparatus. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable non-transitory medium accessible by a computer, or a data storage device, such as a server or a data center, integrating one or more usable non-transitory media. The usable non-transitory medium may be a magnetic medium (for example, a floppy disk, a hard disk, or a magnetic tape), an optical medium (for example, a DVD), a semiconductor medium (for example, a solid-state drive (SSD)), or the like.

The invention claimed is:

1. A data transmission method, comprising:
performing, by a physical medium attachment (PMA) layer of a physical layer (PHY) chip of a transmitting device, inner forward error correction (FEC) encoding on x second data streams to obtain x encoded second data streams, where x is a positive integer;
performing, by the PMA layer, first block-level multiplexing processing on the x encoded second data streams to obtain z third data stream(s), where z is a positive integer, x>z, and z≥1; and
outputting, by the PMA layer, the z third data stream(s) over z output lane(s).

2. The method according to claim 1, wherein an FEC scheme of the inner FEC encoding is one of the following FEC schemes: a Reed-Solomon (RS) code, a Bose-Chaudhuri-Hocquenghem (BCH) code, a Hamming code, a low-density parity-check (LDPC) code, a polar code, or a convolutional code.

3. The method according to claim 1, further comprising:
performing, by the PMA layer, bit-level demultiplexing processing on y first data streams to obtain y demultiplexed first data streams, wherein the y first data streams are based on bit-level multiplexing processing, where y is a positive integer, and x>y.

4. The method according to claim 3, further comprising:
performing, by the PMA layer, second block-level multiplexing processing on the y demultiplexed first data streams to obtain the x second data streams.

5. The method according to claim 4, wherein in each pair of adjacent second data streams of the x second data streams, symbols located at a same position in the second data streams of the respective pair comprise a symbol from first FEC encoded data and a symbol from second FEC encoded data, wherein first FEC encoding producing the first FEC encoded data is different from the inner FEC encoding, and second FEC encoding producing the second FEC encoded data is different from the inner FEC encoding.

6. The method according to claim 5, wherein each pair of adjacent symbols in each second data stream of the x second data streams includes a symbol from the first FEC encoded data and a symbol from the second FEC encoded data.

7. The method according to claim 1, further comprising:
receiving, by the PMA layer, the x second data streams, wherein the x second data streams are obtained by performing second block-level multiplexing processing on first FEC encoded data and second FEC encoded data, wherein first FEC encoding producing the first FEC encoded data is different from the inner FEC encoding, and second FEC encoding producing the second FEC encoded data is different from the inner FEC encoding.

8. The method according to claim 7, wherein each pair of adjacent symbols in each second data stream of the x second data streams includes a symbol from the first FEC encoded data and a symbol from the second FEC encoded data.

9. The method according to claim 1, wherein performing the first block-level multiplexing processing on the x encoded second data streams to obtain the z third data stream(s) comprises:
performing the first block-level multiplexing processing on the x encoded second data streams in a round-robin fashion to obtain the z third data stream(s).

10. The method according to claim 9, wherein z=1, and performing the first block-level multiplexing processing on the x encoded second data streams in the round-robin fashion comprises:
sequentially multiplexing data of n consecutive bits obtained from each of the x encoded second data streams according to a round robin sequence for the x encoded second data streams to obtain the third data stream, wherein n≥2.

11. The method according to claim 9, wherein z≥2, and performing the first block-level multiplexing processing on the x encoded second data streams in the round-robin fashion comprises:
sequentially multiplexing data of n consecutive bits obtained from each of the x encoded second data streams to respective third data streams according to a round robin sequence for the x encoded second data streams and the z third data streams until all data of the x encoded second data streams is mapped to obtain the z third data streams, wherein n≥2.

12. The method according to claim 1, wherein the transmitting device is an ethernet device.

13. A data transmission method, comprising:
obtaining, by a physical medium attachment (PMA) layer of a physical layer (PHY) chip of a receiving device, z third data stream(s) over z input lane(s), wherein the z third data stream(s) are based on first block-level multiplexing processing, where z is a positive integer, and z≥1;
performing, by the PMA layer, first block-level demultiplexing processing on the z third data stream(s) to obtain x encoded second data streams, where x is a positive integer, and x>z; and
performing, by the PMA layer, inner forward error correction (FEC) decoding on the x encoded second data streams to obtain x second data streams.

14. The method according to claim 13, wherein an FEC scheme of the inner FEC decoding is one of the following FEC schemes: a Reed-Solomon (RS) decode, a Bose-Chaudhuri-Hocquenghem (BCH) decode, a Hamming decode, a low-density parity-check (LDPC) decode, a polar decode, or a convolutional decode.

15. The method according to claim 13, further comprising:
performing, by the PMA layer, second block-level demultiplexing processing on the x second data streams to obtain y demultiplexed first data streams, where y is a positive integer, and x>y.

16. The method according to claim 15, further comprising:
performing, by the PMA layer, bit-level demultiplexing processing on the y demultiplexed first data streams to obtain y first data streams, wherein the y first data streams are based on bit-level multiplexing processing.

17. The method according to claim 16, wherein in each pair of adjacent second data streams of the x second data streams, symbols located at a same position in the second data streams of the respective pair comprise a symbol from first FEC encoded data and a symbol from second FEC encoded data.

18. The method according to claim 17, wherein each pair of adjacent symbols in each second data stream of the x second data streams includes a symbol from the first FEC encoded data and a symbol from the second FEC encoded data.

19. The method according to claim 13, further comprising:
outputting, by the PMA layer, the x second data streams, wherein the x second data streams are obtained by performing second block-level multiplexing processing on first FEC encoded data and second FEC encoded data.

20. The method according to claim 19, wherein each pair of adjacent symbols in each second data stream of the x second data streams includes a symbol from the first FEC encoded data and a symbol from the second FEC encoded data.

21. The method according to claim 13, wherein performing first block-level demultiplexing processing on the z third data stream(s) to obtain x encoded second data streams comprises:
performing the first block-level demultiplexing processing on the z third data stream(s) in a round-robin fashion to obtain the x encoded second data streams.

22. The method according to claim 21, wherein z=1, and performing the first block-level demultiplexing processing on the z third data stream(s) in the round-robin fashion to obtain the x encoded second data streams comprises:
sequentially demultiplexing data of n consecutive bits in the third data stream to obtain the x encoded second data streams, wherein n≥2.

23. The method according to claim 21, wherein z≥2, and performing the first block-level demultiplexing processing on the z third data stream(s) in the round-robin fashion to obtain the x encoded second data streams comprises:
sequentially demultiplexing data of n consecutive bits obtained from each of the z third data streams to respective encoded second data streams according to a round robin sequence for the z third data streams and until all data of the z third data streams is mapped to obtain the x encoded second data streams, wherein n≥2.

24. The method according to claim 13, wherein the receiving device is an ethernet device.

25. A transmitting device, comprising:
a physical medium attachment (PMA) layer of a physical layer (PHY) chip, configured to:
perform inner forward error correction (FEC) encoding on x second data streams to obtain x encoded second data streams, where x is a positive integer;
perform first block-level multiplexing processing on the x encoded second data streams to obtain z third data stream(s), where z is a positive integer, x>z, and z≥1; and
an interface, configured to output the z third data stream(s) over z output lane(s).

26. The transmitting device according to claim 25, wherein an FEC scheme of the inner FEC encoding is one of the following FEC schemes: a Reed-Solomon (RS) code, a Bose-Chaudhuri-Hocquenghem (BCH) code, a Hamming code, a low-density parity-check (LDPC) code, a polar code, or a convolutional code.

27. The transmitting device according to claim 25, wherein the PMA layer is further configured to:
perform bit-level demultiplexing processing on y first data streams to obtain y demultiplexed first data streams, wherein the y first data streams are based on bit-level multiplexing processing, where y is a positive integer, and x>y.

28. The transmitting device according to claim 27, wherein the PMA layer is further configured to:
perform second block-level multiplexing processing on the y demultiplexed first data streams to obtain the x second data streams.

29. The transmitting device according to claim 28, wherein in each pair of adjacent second data streams of the x second data streams, symbols located at a same position in the second data streams of the respective pair comprise a symbol from first FEC encoded data and a symbol from second FEC encoded data, wherein first FEC encoding producing the first FEC encoded data is different from the inner FEC encoding, and second FEC encoding producing the second FEC encoded data is different from the inner FEC encoding.

30. The transmitting device according to claim 29, wherein each pair of adjacent symbols in each second data stream of the x second data streams includes a symbol from the first FEC encoded data and a symbol from the second FEC encoded data.

31. The transmitting device according to claim 25, wherein the PMA layer is further configured to:
receive the x second data streams, wherein the x second data streams are obtained by performing second block-level multiplexing processing on first FEC encoded data and second FEC encoded data, wherein first FEC encoding producing the first FEC encoded data is different from the inner FEC encoding, and second FEC encoding producing the second FEC encoded data is different from the inner FEC encoding.

32. The transmitting device according to claim 31, wherein each pair of adjacent symbols in each second data stream of the x second data streams includes a symbol from the first FEC encoded data and a symbol from the second FEC encoded data.

33. The transmitting device according to claim 25, wherein the PMA layer is configured to:
perform the first block-level multiplexing processing on the x encoded second data streams in a round-robin fashion to obtain the z third data stream(s).

34. The transmitting device according to claim 33, wherein z=1, and the PMA layer is configured to:
sequentially multiplex data of n consecutive bits obtained from each of the x encoded second data streams according to a round robin sequence for the x encoded second data streams, to obtain the third data stream, wherein n≥2.

35. The transmitting device according to claim 33, wherein z≥2, and the PMA layer is configured to:
sequentially multiplex data of n consecutive bits obtained from each of the x encoded second data streams to respective third data streams according to a round robin sequence for the x encoded second data streams and the z third data streams until all data of the x encoded second data streams is mapped to obtain the z third data streams, wherein n≥2.

36. The transmitting device according to claim 25, wherein the transmitting device is an ethernet device.

37. A receiving device, comprising:
a first interface, configured to obtain z third data stream(s) over z input lane(s), wherein the z third data stream(s) are based on first block-level multiplexing processing, where z is a positive integer, and z≥1; and
a physical medium attachment (PMA) layer of a physical layer (PHY) chip, configured to:
perform first block-level demultiplexing processing on the z third data stream(s) to obtain x encoded second data streams, where x is a positive integer, and x>z; and
perform inner forward error correction (FEC) decoding on the x encoded second data streams to obtain x second data streams.

38. The receiving device according to claim 37, wherein an FEC scheme of the inner FEC decoding is one of the following FEC schemes: a Reed-Solomon (RS) decode, a Bose-Chaudhuri-Hocquenghem (BCH) decode, a Hamming decode, a low-density parity-check (LDPC) decode, a polar decode, or a convolutional decode.

39. The receiving device according to claim 37, wherein the PMA layer is further configured to:
perform second block-level demultiplexing processing on the x second data streams to obtain y demultiplexed first data streams, where y is a positive integer, and x>y.

40. The receiving device according to claim 39, wherein the PMA layer is further configured to:
perform bit-level demultiplexing processing on the y demultiplexed first data streams to obtain y first data streams, wherein the y first data streams are based on bit-level multiplexing processing.

41. The receiving device according to claim 40, wherein in each pair of adjacent second data streams of the x second data streams, symbols located at a same position in the second data streams of the respective pair comprise a symbol from first FEC encoded data and a symbol from second FEC encoded data.

42. The receiving device according to claim 41, wherein each pair of adjacent symbols in each second data stream of the x second data streams includes a symbol from the first FEC encoded data and a symbol from the second FEC encoded data.

43. The receiving device according to claim 37, wherein the receiving device further comprises:
a second interface, configured to output the x second data streams, wherein the x second data streams are obtained by performing second block-level multiplexing processing on first FEC encoded data and second FEC encoded data.

44. The receiving device according to claim 43, wherein each pair of adjacent symbols in each second data stream of the x second data streams includes a symbol from the first FEC encoded data and a symbol from the second FEC encoded data.

45. The receiving device according to claim 37, wherein the PMA layer is configured to:
perform the first block-level demultiplexing processing on the z third data stream(s) in a round-robin fashion to obtain the x encoded second data streams.

46. The receiving device according to claim 45, wherein z=1, and the PMA is configured to:
sequentially demultiplex data of n consecutive bits in the third data stream to obtain the x encoded second data streams, wherein n≥2.

47. The receiving device according to claim 45, wherein $z \geq 2$, and the PMA layer is configured to:

sequentially demultiplex data of n consecutive bits obtained from each of the z third data streams to respective encoded second data streams according to a round robin sequence for the z third data streams and until all data of the z third data streams is mapped to obtain the x encoded second data streams, wherein $n \geq 2$.

48. The receiving device according to claim 37, wherein the receiving device is an ethernet device.

* * * * *